US008828844B2

(12) United States Patent
Ohnuma et al.

(10) Patent No.: US 8,828,844 B2
(45) Date of Patent: Sep. 9, 2014

(54) MANUFACTURING METHOD OF SOI SUBSTRATE

(75) Inventors: Hideto Ohnuma, Atsugi (JP); Tetsuya Kakehata, Isehara (JP); Akihisa Shimomura, Isehara (JP); Shinya Sasagawa, Chigasaki (JP); Motomu Kurata, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 275 days.

(21) Appl. No.: 12/247,487

(22) Filed: Oct. 8, 2008

(65) Prior Publication Data
US 2009/0111248 A1 Apr. 30, 2009

(30) Foreign Application Priority Data

Oct. 10, 2007 (JP) .................................. 2007-265014
Nov. 1, 2007 (JP) .................................. 2007-285567

(51) Int. Cl.
| H01L 21/46 | (2006.01) |
| H01L 21/268 | (2006.01) |
| H01L 21/3065 | (2006.01) |
| H01L 21/84 | (2006.01) |
| H01L 21/02 | (2006.01) |
| H01L 21/302 | (2006.01) |
| H01L 21/762 | (2006.01) |

(52) U.S. Cl.
CPC ........ *H01L 21/76254* (2013.01); *H01L 21/268* (2013.01); *H01L 21/3065* (2013.01); *H01L 21/84* (2013.01); *H01L 21/02686* (2013.01); *H01L 21/02532* (2013.01); *H01L 21/302* (2013.01)
USPC .......................................... 438/458; 438/479

(58) Field of Classification Search
USPC ................................................ 438/458, 479
See application file for complete search history.

(56) References Cited

U.S. PATENT DOCUMENTS 5,374,564 A 12/1994 Bruel
6,110,845 A 8/2000 Seguchi et al.
(Continued)

FOREIGN PATENT DOCUMENTS

EP 1 039 513 9/2000
EP 1 045 448 10/2000
(Continued)

OTHER PUBLICATIONS

Chinese Office Action (Application No. 200810166535.0) Dated Jun. 9, 2011.
(Continued)

*Primary Examiner* — Zandra Smith
*Assistant Examiner* — Jamie C Niesz
(74) *Attorney, Agent, or Firm* — Eric J. Robinson; Robinson Intellectual Property Law Office, P.C.

(57) ABSTRACT

A damaged region is formed by generation of plasma by excitation of a source gas, and by addition of ion species contained in the plasma from one of surfaces of a single crystal semiconductor substrate; an insulating layer is formed over the other surface of the single crystal semiconductor substrate; a supporting substrate is firmly attached to the single crystal semiconductor substrate so as to face the single crystal semiconductor substrate with the insulating layer interposed therebetween; separation is performed at the damaged region into the supporting substrate to which a single crystal semiconductor layer is attached and part of the single crystal semiconductor substrate by heating of the single crystal semiconductor substrate; dry etching is performed on a surface of the single crystal semiconductor layer attached to the supporting substrate; the single crystal semiconductor layer is recrystallized by irradiation of the single crystal semiconductor layer with a laser beam to melt at least part of the single crystal semiconductor layer.

15 Claims, 35 Drawing Sheets

(56) References Cited

U.S. PATENT DOCUMENTS

| | | |
|---|---|---|
| 6,127,702 A | 10/2000 | Yamazaki et al. |
| 6,271,101 B1 | 8/2001 | Fukunaga |
| 6,274,463 B1 | 8/2001 | Chaiken |
| 6,300,027 B1 | 10/2001 | Chambers et al. |
| 6,335,231 B1 | 1/2002 | Yamazaki et al. |
| 6,372,609 B1 | 4/2002 | Aga et al. |
| 6,380,046 B1 | 4/2002 | Yamazaki |
| 6,388,652 B1 | 5/2002 | Yamazaki et al. |
| 6,468,923 B1 | 10/2002 | Yonehara et al. |
| 6,534,380 B1 | 3/2003 | Yamauchi et al. |
| 6,602,761 B2 | 8/2003 | Fukunaga |
| 6,686,623 B2 | 2/2004 | Yamazaki |
| 6,767,802 B1 | 7/2004 | Maa et al. |
| 6,778,164 B2 | 8/2004 | Yamazaki et al. |
| 6,803,264 B2 | 10/2004 | Yamazaki et al. |
| 6,855,584 B2 | 2/2005 | Yamazaki et al. |
| 6,875,633 B2 | 4/2005 | Fukunaga |
| 6,884,694 B2 | 4/2005 | Park et al. |
| 7,015,083 B2 | 3/2006 | Yamazaki et al. |
| 7,022,586 B2 | 4/2006 | Maleville et al. |
| 7,119,365 B2 | 10/2006 | Takafuji et al. |
| 7,148,124 B1 | 12/2006 | Usenko |
| 7,176,525 B2 | 2/2007 | Fukunaga |
| 7,199,024 B2 | 4/2007 | Yamazaki |
| 7,256,776 B2 | 8/2007 | Yamazaki et al. |
| 7,291,523 B2 | 11/2007 | Yamazaki et al. |
| 7,338,882 B2 | 3/2008 | Park et al. |
| 7,354,844 B2 | 4/2008 | Endo et al. |
| 7,364,984 B2 | 4/2008 | Endo et al. |
| 7,416,960 B2 | 8/2008 | Endo et al. |
| 7,491,342 B2 | 2/2009 | Kamiyama et al. |
| 7,755,113 B2 | 7/2010 | Yamazaki et al. |
| 7,846,817 B2 | 12/2010 | Yamazaki et al. |
| 7,867,873 B2 | 1/2011 | Murakami et al. |
| 8,034,694 B2 | 10/2011 | Ohnuma et al. |
| 8,263,476 B2 | 9/2012 | Ohnuma |
| 2003/0183876 A1 | 10/2003 | Takafuji et al. |
| 2004/0055999 A1 | 3/2004 | Chen et al. |
| 2004/0104424 A1 | 6/2004 | Yamazaki |
| 2005/0009252 A1 | 1/2005 | Yamazaki et al. |
| 2005/0255670 A1 | 11/2005 | Couillard et al. |
| 2006/0043072 A1 | 3/2006 | Chen et al. |
| 2007/0063281 A1 | 3/2007 | Takafuji et al. |
| 2007/0087488 A1 | 4/2007 | Moriwaka |
| 2007/0108510 A1 | 5/2007 | Fukunaga |
| 2007/0173000 A1 | 7/2007 | Yamazaki |
| 2007/0184632 A1 | 8/2007 | Yamazaki et al. |
| 2007/0281172 A1* | 12/2007 | Couillard et al. .............. 428/446 |
| 2007/0281399 A1* | 12/2007 | Cites et al. .................... 438/149 |
| 2007/0291022 A1 | 12/2007 | Yamazaki et al. |
| 2008/0063840 A1 | 3/2008 | Morita et al. |
| 2008/0138963 A1 | 6/2008 | Yamazaki et al. |
| 2008/0188060 A1* | 8/2008 | Neyret .......................... 438/458 |
| 2009/0023271 A1 | 1/2009 | Couillard et al. |
| 2009/0104750 A1 | 4/2009 | Yamazaki et al. |
| 2009/0137101 A1 | 5/2009 | Yamazaki et al. |

FOREIGN PATENT DOCUMENTS

| | | |
|---|---|---|
| EP | 1427001 A | 6/2004 |
| EP | 1427002 A | 6/2004 |
| EP | 1635396 A | 3/2006 |
| EP | 1 688 990 | 8/2006 |
| EP | 2091075 A | 8/2009 |
| JP | 08-255762 A | 10/1996 |
| JP | 11-097379 | 4/1999 |
| JP | 11-163363 | 6/1999 |
| JP | 2000-077287 A | 3/2000 |
| JP | 2000-124092 | 4/2000 |
| JP | 2000-294754 A | 10/2000 |
| JP | 2000-349266 | 12/2000 |
| JP | 2003-173968 | 6/2003 |
| JP | 2003-324188 | 11/2003 |
| JP | 2004-031715 A | 1/2004 |
| JP | 2004-080035 | 3/2004 |
| JP | 2004-087606 | 3/2004 |
| JP | 2004-310056 A | 11/2004 |
| JP | 2004-311526 A | 11/2004 |
| JP | 2005-203596 | 7/2005 |
| JP | 2005-252244 | 9/2005 |
| JP | 2005-340622 | 12/2005 |
| JP | 2006-216807 | 8/2006 |
| JP | 1 758 168 | 2/2007 |
| KR | 2007-0030822 A | 3/2007 |
| TW | 200410334 | 6/2004 |

OTHER PUBLICATIONS

Chinese Office Action (Application No. 200810166535.0), dated Nov. 25, 2011.

Lu.F et al., "Ion-Cutting of Si Onto Glass by Pulsed and Direct-Current Plasma Immersion Ion Implantation,", J. Vac. Sci. Technol. B (Journal of Vacuum Science & Technology B), 2003, vol. 21, No. 5, pp. 2109-2113.

Taiwanese Office Action (Application No. 97138995), dated Nov. 21, 2013.

European Search Report (Application No. 08017568.0), dated Apr. 10, 2014.

Korean Office Action (Application No. 2008-0099861), dated May 30, 2014.

* cited by examiner

Without processing

Dry etching + Laser beam irradiation

Dry etching

Dry etching + Laser beam irradiation + dry etching

Laser beam irradiation

Dry etching + Laser beam irradiation + wet etching

Without processing

Dry etching

Laser beam irradiation

Dry etching + Laser beam irradiation

Dry etching + Laser beam irradiation + dry etching

Dry etching + Laser beam irradiation + wet etching

| Acceleration voltage | Ration of hydrogen element (H) (X : Y) | Ratio of hydrogen ion species (X : Y/3) |
|---|---|---|
| 80 kV | 1 : 44.1 | 1 : 14.7 |
| 60 kV | 1 : 42.5 | 1 : 14.2 |
| 40 kV | 1 : 43.5 | 1 : 14.5 |

MANUFACTURING METHOD OF SOI SUBSTRATE

BACKGROUND OF THE INVENTION

1. Field of the Invention

The present invention relates to a manufacturing method of a silicon-on-insulator (SOI) substrate having a so-called SOI structure in which a single crystal semiconductor layer is provided on an insulating surface, and a manufacturing method of a semiconductor device having the SOI structure.

2. Description of the Related Art

Integrated circuits have been developed, in which a semiconductor substrate called a silicon-on-insulator (hereinafter also referred to as "SOI") having a thin single crystal semiconductor layer on an insulating surface is used instead of a silicon wafer manufactured in such a manner that an ingot of a single crystal semiconductor is thinly sliced. An integrated circuit using an SOI substrate has been attracting attention because parasitic capacitance between a drain of a transistor and the substrate is reduced and the performance of the semiconductor integrated circuit is improved.

As a manufacturing method of an SOI substrate, a hydrogen ion implantation separation method is known (for example, see Patent Document 1: Japanese Published Patent Application No. 2000-124092). The hydrogen ion implantation separation method is a method in which hydrogen ions are implanted into a silicon wafer to form a damaged region at a predetermined depth from a surface of the silicon wafer, the silicon wafer is separated at the damaged region, whereby a thin silicon layer is bonded to another silicon wafer. It is necessary that, in addition to heat treatment for separating a silicon layer, heat treatment under an oxidation atmosphere be performed to form an oxide film over the silicon layer, the oxide layer be removed, and heat treatment at 1000° C. to 1300° C. be performed to increase bonding strength.

Meanwhile, a semiconductor device in which an insulating substrate such as a substrate made of high heat resistance glass is provided with a silicon layer is disclosed (for example, see Patent Document 2: Japanese Published Patent Application No. H11-163363). In this semiconductor device, an entire surface of crystallized glass whose strain point is greater than or equal to 750° C. is protected by an insulating silicon film, and a silicon layer obtained by a hydrogen ion implantation separation method is bonded to the insulating silicon film.

SUMMARY OF THE INVENTION

In an ion irradiation step which is performed to form a damaged region, the silicon layer is damaged by being irradiated with ions. In heat treatment to increase the bonding strength between the silicon layer and a supporting substrate, damage to the silicon layer due to the ion irradiation step is repaired.

However, when a substrate whose allowable temperature limit is low, such as a glass substrate, is used for the supporting substrate, heat treatment at a temperature of greater than or equal to 1000° C. cannot be performed and the damage to the silicon layer due to the above-described ion irradiation step cannot be sufficiently repaired.

In addition, a conventional hydrogen ion implantation separation method needs a CMP (chemical mechanical polishing) process after a silicon layer is separated from a silicon wafer, in order to planarize a separation surface and reduce a thickness to a predetermined thickness. However, the CMP process requires long time, and it is difficult to form large jig having planarity. Thus, a conventional SOI substrate is not suitable for increase in area and includes a factor inhibiting productivity and reduction in manufacturing costs.

In view of the above-described problems, it is an object of the present invention to provide a manufacturing method of an SOI substrate provided with a single crystal semiconductor layer which is sufficient for practical use even in the case of using a substrate whose allowable temperature limit is low, such as a glass substrate. It is another object of the present invention to manufacture a highly reliable SOI device using such an SOI substrate.

One feature of the present invention is a manufacturing method including steps of: forming a damaged region in a single crystal semiconductor substrate by generation of plasma by excitation of a source gas, and addition of ion species contained in the plasma from one surface of the single crystal semiconductor substrate; forming an insulating layer over the one surface of the single crystal semiconductor substrate; bonding a supporting substrate to the single crystal semiconductor substrate so as to face the single crystal semiconductor substrate with the insulating layer interposed therebetween; performing separation at the damaged region into the supporting substrate to which a single crystal semiconductor layer is bonded and part of the single crystal semiconductor substrate by heating of the single crystal semiconductor substrate; performing dry etching on a surface of the single crystal semiconductor layer bonded to the supporting substrate; and solidifying at least the surface of the single crystal semiconductor layer after the single crystal semiconductor layer is irradiated with a laser beam to be melted.

Alternatively, either dry etching or wet etching, or a combination thereof may be performed after the single crystal semiconductor layer is irradiated with a laser beam.

In the present invention, a "single crystal" means, when attention is paid to certain crystal axes, a crystal in which the crystal axes are aligned in the same direction in any part of a sample and also in which a crystal boundary does not exist between crystals. Note that, in this specification, a crystal in which directions of the crystal axes are aligned as described above even when crystal defects or dangling bonds are included and in which a crystal boundary does not exist is also a single crystal. Moreover, "recrystallization of a single crystal semiconductor layer" means that a semiconductor layer having a single crystal structure has a single crystal structure again through a state which is different from the former single crystal structure (e.g., a liquid phase state). "Recrystallization of a single crystal semiconductor layer" can also mean that a single crystal semiconductor layer is recrystallized to form a single crystal semiconductor layer.

Separation is performed into a supporting substrate to which a single crystal semiconductor substrate is bonded and part of the single crystal semiconductor substrate at a damaged region of the single crystal semiconductor substrate, dry etching is performed on a single crystal semiconductor layer bonded to the supporting substrate to remove defects or damage of a surface thereof and reduce roughness of the surface thereof, and then the single crystal semiconductor layer is irradiated with a laser beam; thus, the single crystal semiconductor layer can be prevented from including the defects or damage at the time of being melted by the laser beam irradiation. Therefore, a single crystal semiconductor layer with reduced defects and high planarity can be obtained.

Moreover, an SOI substrate provided with a single crystal semiconductor layer which is sufficient for practical use can be manufactured even in the case of using a substrate whose allowable temperature limit is low, such as a glass substrate. Furthermore, with use of a single crystal semiconductor layer provided for such an SOI substrate, a semiconductor device including various semiconductor elements, memory elements, integrated circuits, or the like with high performance and high reliability can be manufactured with high yield.

DETAILED DESCRIPTION OF THE INVENTION

Figure 1A:
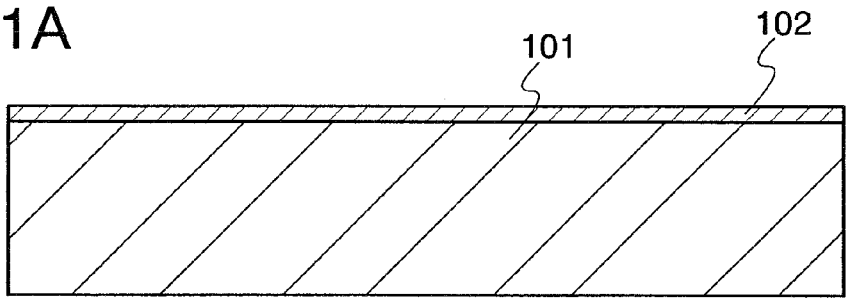
FIGS. 1A to 1D are views illustrating a manufacturing method of an SOI substrate of Embodiment Mode 1.

Embodiment Modes of the present invention will be hereinafter described with reference to the accompanying drawings. Note that the present invention is not limited to the description below and it is easily understood by those skilled in the art that modes and details of the present invention can be modified in various ways without departing from the purpose and scope of the present invention. Therefore, the present invention should not be interpreted as being limited to the description below of Embodiment Modes. Note that, in structures of the present invention described below, reference numerals indicating the same portions or portions having the similar functions are used in common in different drawings, and repeated description thereof will be omitted.

[Embodiment Mode1]

In this embodiment mode, a manufacturing method of an SOI substrate, in which a single crystal semiconductor substrate is separated into a supporting substrate to which a single crystal semiconductor layer is bonded and part of a single crystal semiconductor substrate, dry etching is performed on a surface of the single crystal semiconductor layer bonded to the supporting substrate, and the surface of the single crystal semiconductor layer on which the dry etching is performed is irradiated with a laser beam, will be described with reference to drawings. Moreover, in this embodiment mode, a manufacturing method of an SOI substrate in which provision of a single crystal semiconductor layer for a substrate whose allowable temperature limit is low, such as a glass substrate, is one of objects will also be described.

First, a single crystal semiconductor substrate 101 is prepared. The single crystal semiconductor substrate 101 is processed to have a desired size and shape. The single crystal semiconductor substrate 101 is, for example, a single crystal silicon substrate, a germanium substrate, a semiconductor substrate made of a compound such as gallium arsenide or indium phosphide, or the like. Circular substrates which are 5 inches (125 mm) in diameter, 6 inches (150 mm) in diameter, 8 inches (200 mm) in diameter, and 12 inches (300 mm) in diameter are the typical single crystal silicon substrates. In addition, a circular substrate which is 18 inches (450 mm) in diameter can also be used. Note that the shape of the single crystal silicon substrate is not limited to a circular shape, and a single crystal silicon substrate processed into a rectangular shape can also be used.

An insulating layer 102 containing nitrogen is formed over one of surfaces of the single crystal semiconductor substrate 101 (see FIG. 1A). It is preferable to provide the insulating layer 102 containing nitrogen for the purpose of preventing impurity contamination from the supporting substrate side when part of the single crystal semiconductor substrate 101 is bonded to the supporting substrate to provide the single crystal semiconductor layer in a later step. That is, the insulating layer 102 containing nitrogen serves as a barrier layer for preventing an impurity such as mobile ions or moisture contained in the supporting substrate from diffusing into the single crystal semiconductor layer. Therefore, in the case where contamination by an impurity element is not a problem, the insulating layer 102 containing nitrogen can be omitted.

The insulating layer 102 containing nitrogen can be formed as a single layer or a stacked layer with two or more layers using a silicon nitride layer, a silicon nitride oxide layer, or a silicon oxynitride layer by a chemical vapor deposition (CVD) method, a sputtering method, or the like. The insulating layer 102 containing nitrogen is preferably formed to a thickness of 50 nm to 200 nm inclusive. For example, a silicon oxynitride layer and a silicon nitride oxide layer can be stacked in this order on the single crystal semiconductor substrate 101 side to form the insulating layer 102 containing nitrogen. Note that the chemical vapor deposition (CVD) method in this specification includes, in its category, a plasma CVD method, a thermal CVD method, and a photo-CVD method.

Note that a silicon oxynitride layer means a layer that contains more oxygen than nitrogen and, in the case where measurements are performed using Rutherford backscattering spectrometry (RBS) and hydrogen forward scattering (HFS), includes oxygen, nitrogen, silicon, and hydrogen at concentrations ranging from 50 at. % to 70 at. %, 0.5 at. % to 15 at. %, 25 at. % to 35 at. %, and 0.1 at. % to 10 at. %, respectively. Further, a silicon nitride oxide film means a film that contains more nitrogen than oxygen and, in the case where measurements are performed using RBS and HFS, includes oxygen, nitrogen, silicon, and hydrogen at concentrations ranging from 5 at. % to 30 at. %, 20 at. % to 55 at. %, 25 at. % to 35 at. %, and 10 at. % to 30 at. %, respectively. Note that percentages of nitrogen, oxygen, silicon, and hydrogen fall within the ranges given above, where the total number of atoms contained in the silicon oxynitride film or the silicon nitride oxide film is defined as 100 at. %.

Figure 1B:
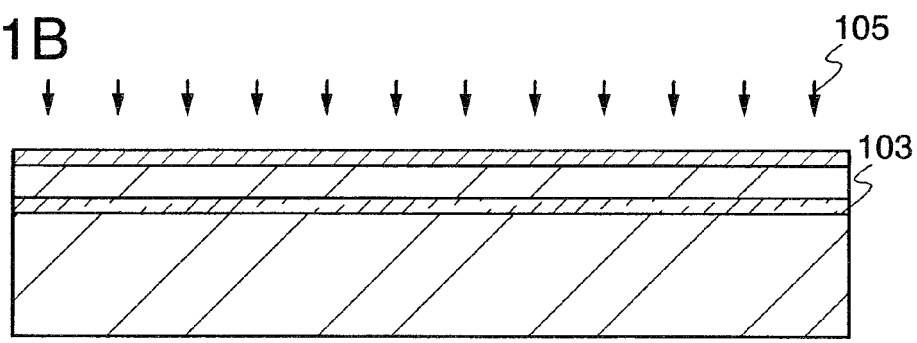

Next, through the insulating layer 102, the single crystal semiconductor substrate 101 is irradiated with an ion beam 105 including ions accelerated by an electric field, so that the ions are introduced into the single crystal semiconductor substrate 101; accordingly, a damaged region 103 is formed in a region at a predetermined depth from one of surfaces of the single crystal semiconductor substrate 101 (see FIG. 1B). The ion beam 105 is generated in such a manner that a source gas is excited to generate plasma of the source gas, and ions contained in the plasma are extracted from the plasma by an electric field effect.

The depth at which the damaged region 103 is formed can be controlled by the acceleration voltage of the ion beam 105 and the incident angle thereof. The damaged region 103 is formed as deep as the average depth at which the ions enters. The depth to which ions are introduced determines the thickness of the single crystal semiconductor layer separated from the single crystal semiconductor substrate 101. The depth at which the damaged region 103 is formed is controlled so that the thickness of the single crystal semiconductor layer becomes 20 nm to 500 nm inclusive, preferably 20 nm to 200 nm inclusive.

An ion implantation apparatus or an ion doping apparatus can be used in order to add ions to the single crystal semiconductor substrate 101. In an ion implantation apparatus, a source gas is excited to generate plasma, ion species are extracted from the plasma, the ion species are mass-separated, and an object to be processed is irradiated with the ion species having a predetermined mass. In an ion doping apparatus, a source gas is excited to generate plasma, ion species are extracted from the plasma, and an object to be processed is irradiated with the ion species without being mass-separated. Note that in an ion doping apparatus provided with a mass separator, ion implantation with mass separation can be performed in a similar manner to an ion implantation apparatus. In this specification, the use of one of an ion implantation apparatus and an ion doping apparatus is specified only in the case where one of them needs to be used, whereas in the case where there is not specific description, either of them may be used to perform ion irradiation.

An ion irradiation step in the case of using an ion doping apparatus can be performed under the following conditions, for example.

Acceleration voltage: greater than or equal to 10 kV and less than or equal to 100 kV (preferably greater than or equal to 20 kV and less than or equal to 80 kV)

Dose: greater than or equal to $1\times10^{16}$ ions/cm$^2$ and less than or equal to $4\times10^{16}$ ions/cm$^2$ Beam current density: 2 µA/cm$^2$ (preferably greater than or equal to 5 µA/cm$^2$, further preferably greater than or equal to 10 µA/cm$^2$)

In the case of using an ion doping apparatus, a hydrogen gas can be used as a source gas of the ion irradiation step. With use of a hydrogen gas (an H$_2$ gas), H$^+$, H$_2^+$, and H$_3^+$ can be generated as ion species. In the case of using a hydrogen gas as a source gas, it is preferable to perform irradiation with a large amount of H$_3^+$. When irradiation with a large amount of H$_3^+$ is performed, irradiation efficiency with ions is increased in comparison with the case of irradiation with H$^+$ and H$_2^+$. In other words, time required for ion irradiation can be shortened. Further, separation at the damaged region 103 can be performed more easily. Moreover, with use of H$_3^+$, the average depth at which ions enter can be shallower; thus, the damaged region 103 can be formed at a shallower region.

In the case of using an ion implantation apparatus, it is preferable to perform mass separation to emit H$_3^+$ ions. Needless to say, irradiation with H$_2^+$ ions may be performed. Note that, since ion species are selected to perform irradiation in the case of using an ion implantation apparatus, irradiation efficiency with ions is decreased more than in the case of using an ion doping apparatus, in some cases.

In the case of using an ion doping apparatus, it is preferable that H$_3^+$ ions be contained at greater than or equal to 70% of the total amount of H$^+$, H$_2^+$, and H$_3^+$ in the ion beam 105. The proportion of H$_3^+$ ions is preferably greater than or equal to 80%. With the proportion of H$_3^+$ increased as described above, hydrogen of greater than or equal to $1\times10^{20}$ atoms/cm$^3$ can be contained in the damaged region 103, and thus separation of the semiconductor layer can be easily performed.

For a source gas in the ion irradiation step, instead of a hydrogen gas, one or more kinds of gas selected from a rare gas such as helium or argon, a halogen gas typified by a fluorine gas or a chlorine gas, or a halogen compound gas such as a fluorine compound gas (e.g., BF$_3$) can be used. In the case of using helium for a source gas, the ion beam 105 with high proportion of He+ ions can be formed without mass separation. With use of such an ion beam 105, the damaged region 103 can be efficiently formed.

An ion irradiation method, which is one aspect of the present invention, is considered below.

In the present invention, a single crystal semiconductor substrate is irradiated with ions that are derived from hydrogen (H) (hereafter referred to as "hydrogen ion species"). More specifically, a hydrogen gas or a gas containing hydrogen in its composition is used as a source material; a hydrogen plasma is generated; and the single crystal semiconductor substrate is irradiated with the hydrogen ion species in the hydrogen plasma.

(Ions in Hydrogen Plasma)

In such a hydrogen plasma as described above, hydrogen ion species such as $H^+$, $H_2^+$, and $H_3^+$ exist. Here are reaction equations for reaction processes (formation processes, destruction processes) of the hydrogen ion species.

$$e + H \rightarrow e + H^+ + e \tag{1}$$

$$e + H_2 \rightarrow e + H_2^+ + e \tag{2}$$

$$e + H_2 \rightarrow e + (H_2)^* \rightarrow e + H^+ H \tag{3}$$

$$e + H_2^+ \rightarrow e + (H_2^+)^* \rightarrow e + H^+ + H \tag{4}$$

$$H_2^+ + H_2 \rightarrow H_3^+ + H \tag{5}$$

$$H_2^+ + H_2 \rightarrow H^+ + H + H_2 \tag{6}$$

$$e + H_3^+ \rightarrow e + H^+ + H + H \tag{7}$$

$$e + H_3^+ \rightarrow H_2 + H \tag{8}$$

$$e + H_3^+ \rightarrow H + H + H \tag{9}$$

Figure 30:
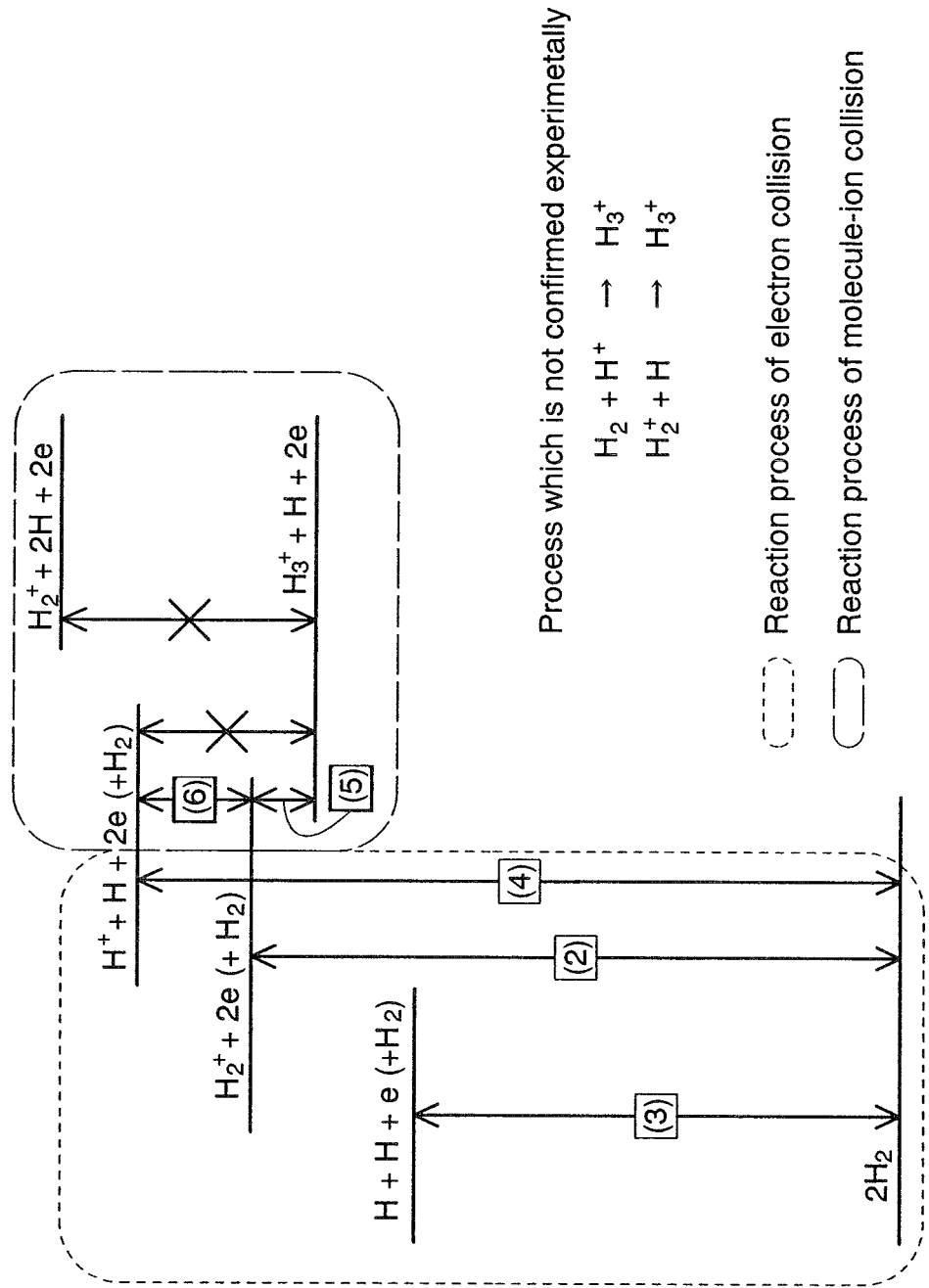
FIG. 30 is an energy diagram of hydrogen ion species.

FIG. 30 is an energy diagram which schematically illustrates some of the above reactions. Note that the energy diagram shown in FIG. 30 is merely a schematic diagram and does not exactly depict the relationship of the energy of the reactions.

($H_3^+$ Formation Process)

As described above, $H_3^+$ is mainly produced through the reaction process that is represented by the reaction equation (5). On the other hand, as a reaction that competes with the reaction equation (5), there is the reaction process represented by the reaction equation (6). For the amount of $H_3^+$ to increase, at the least, it is necessary that the reaction of the reaction equation (5) occur more often than the reaction of the reaction equation (6) (note that because there are also other reactions, (7), (8), and (9), through which the amount of $H_3^+$ is decreased, the amount of $H_3^+$ is not necessarily increased even if the reaction of the reaction equation (5) occurs more often than the reaction of the reaction equation (6)). In contrast, when the reaction of the reaction equation (5) occurs less often than the reaction of the reaction equation (6), the proportion of $H_3^+$ in plasma is decreased.

The amount of increase in the product on the right-hand side (rightmost side) of each reaction equation given above depends on the density of a source material on the left-hand side (leftmost side) of the reaction equation, the rate coefficient of the reaction, and the like. Here, it is experimentally confirmed that, when the kinetic energy of $H_2^+$ is lower than approximately 11 eV, the reaction of the reaction equation (5) is the main reaction (that is, the rate coefficient of the reaction equation (5) is sufficiently higher than the rate coefficient of the reaction equation (6)) and that, when the kinetic energy of $H_2^+$ is higher than approximately 11 eV, the reaction of the reaction equation (6) is the main reaction.

A force is exerted on a charged particle by an electric field, and the charged particle gains kinetic energy. The kinetic energy corresponds to the amount of decrease in potential energy due to an electric field. For example, the amount of kinetic energy that a given charged particle gains before colliding with another particle is equal to the difference between a potential energy at a potential before the charged particle moves and a potential energy at a potential before the collision. That is, in a situation where a charged particle can travel a long distance in an electric field without colliding with another particle, the kinetic energy (or the average thereof) of the charged particle tends to be higher than that in a situation where the charged particle cannot. Such a tendency toward an increase in kinetic energy of a charged particle can be shown in a situation where the mean free path of a particle is long, that is, in a situation where pressure is low.

Even in a situation where the mean free path is short, the kinetic energy of a charged particle is high if the charged particle can gain a high amount of kinetic energy while traveling through the path. That is, it can be said that, even in the situation where the mean free path is short, the kinetic energy of a charged particle is high if the potential difference is large.

This is applied to $H_2^+$. Assuming that an electric field is present as in a plasma generation chamber, the kinetic energy of $H_2^+$ is high in a situation where the pressure inside the chamber is low and the kinetic energy of $H_2^+$ is low in a situation where the pressure inside the chamber is high. That is, because the reaction of the reaction equation (6) is the main reaction in the situation where the pressure inside the chamber is low, the amount of $H_3^+$ tends to be decreased, and because the reaction of the reaction equation (5) is the main reaction in the situation where the pressure inside the chamber is high, the amount of $H_3^+$ tends to be increased. In addition, in a situation where an electric field in a plasma generation region is high, that is, in a situation where the potential difference between given two points is large, the kinetic energy of $H_2^+$ is high, and in the opposite situation, the kinetic energy of $H_2^+$ is low. That is, because the reaction of the reaction equation (6) is the main reaction in the situation where the electric field is high, the amount of $H_3^+$ tends to be decreased, and because the reaction of the reaction equation (5) is the main reaction in a situation where the electric field is low, the amount of $H_3^+$ tends to be increased.

(Differences Depending on Ion Source)

Figure 31:
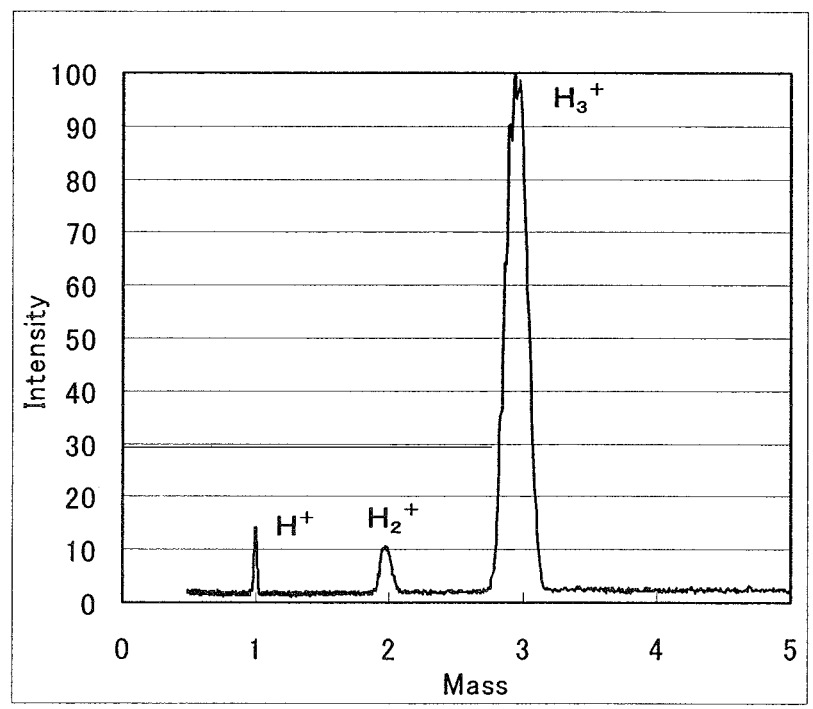
FIG. 31 is a graph showing the results of ion mass spectrometry.

Here, an example, in which the proportions of ion species (particularly, the proportion of $H_3^+$) are different, is described. FIG. 31 is a graph illustrating the results of mass spectrometry of ions that are generated from a 100% hydrogen gas (with the pressure of an ion source of $4.7 \times 10^{-2}$ Pa). Note that this mass spectrometry was performed by measurement of ions that were extracted from the ion source. The horizontal axis represents ion mass. In the spectrum, the mass 1 peak, the mass 2 peak, and the mass 3 peak correspond to $H^+$, $H_2^+$, and $H_3^+$, respectively. The vertical axis represents the intensity of the spectrum, which corresponds to the number of ions. In FIG. 31, the number of ions with different masses is expressed as a relative proportion where the number of ions with a mass of 3 is defined as 100. It can be seen from FIG. 31 that the ratio between ion species that are generated from the ion source, i.e., the ratio between $H^+$, $H_2^+$, and $H_3^+$, is approximately 1:1:8. Note that ions at such a ratio can also be generated by an ion doping apparatus which has a plasma source portion (ion source) that generates plasma, an extraction electrode that extracts an ion beam from the plasma, and the like.

Figure 32:
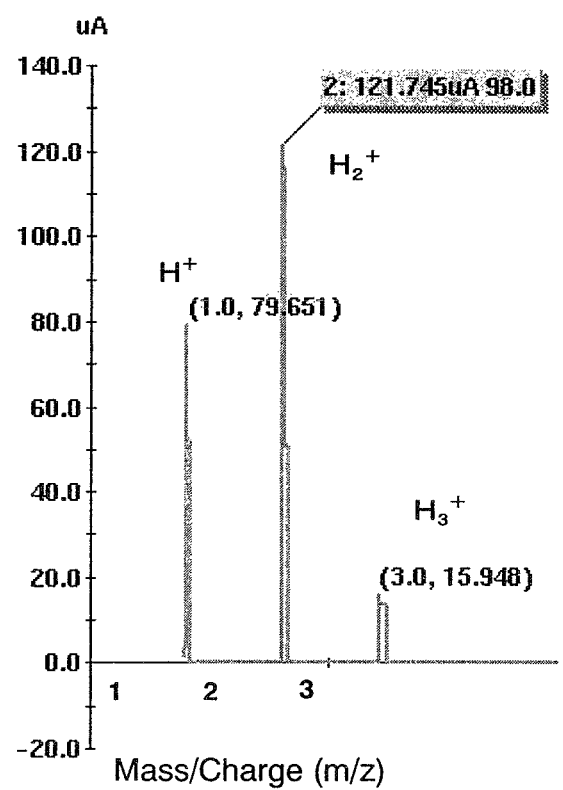
FIG. 32 is a graph showing the results of ion mass spectrometry.

FIG. 32 is a graph showing the results of mass spectrometry of ions that are generated from $PH_3$ when an ion source different from that for the case of FIG. 31 is used and the pressure of the ion source is approximately $3 \times 10^{-3}$ Pa. The results of this mass spectrometry focus on the hydrogen ion species. In addition, the mass spectrometry was performed by measurement of ions that were extracted from the ion source. As in FIG. 31, the horizontal axis represents ion mass, and the mass 1 peak, the mass 2 peak, and the mass 3 peak correspond to $H^+$, $H_2^+$, and $H_3^+$, respectively. The vertical axis represents the intensity of a spectrum corresponding to the number of ions. It can be found from FIG. 32 that the ratio between ion species in plasma, i.e., the ratio between $H^+$, $H_2^+$, and $H_3^+$, is approximately 37:56:7. Note that although FIG. 32 illustrates the data obtained when the source gas is $PH_3$, the ratio between the hydrogen ion species is about the same when a 100% hydrogen gas is used as a source gas, as well.

In the case of the ion source from which the data shown in FIG. 32 is obtained, $H_3^+$, of $H^+$, $H_2^+$, and $H_3^+$, is generated at a proportion of only approximately 7%. On the other hand, in the case of the ion source from which the data shown in FIG. 31 is obtained, the proportion of $H_3^+$ can be greater than or equal to 50% (under the above-described conditions, approximately 80%). This is thought to result from the pressure and electric field inside a chamber, which is clearly shown in the above consideration.

($H_3^+$ Irradiation Mechanism)

When plasma that contains a plurality of ion species as shown in FIG. 31 is generated and a single crystal semiconductor substrate is irradiated with the generated ion species without any mass separation being performed, the surface of the single crystal semiconductor substrate is irradiated with each of $H^+$, $H_2^+$, and $H_3^+$ ions. In order to reproduce the mechanism, from the irradiation with ions to the formation of an ion-introduced region, the following five types of models are considered.

Model 1, where the ion species used for irradiation is $H^+$, which is still $H^+$ (H) after the irradiation.

Model 2, where the ion species used for irradiation is $H_2^+$, which is still $H_2^+$ ($H_2$) after the irradiation.

Model 3, where the ion species used for irradiation is $H_2^+$, which splits into two H atoms ($H^+$ ions) after the irradiation.

Model 4, where the ion species used for irradiation is $H_3^+$, which is still $H_3^+$ ($H_3$) after the irradiation.

Model 5, where the ion species used for irradiation is $H_3^+$, which splits into three H atoms ($H^+$ ions) after the irradiation.

(Comparison of Simulation Results with Measured Values)

Based on the above models, the irradiation of an Si substrate with hydrogen ion species was simulated. As simulation software, SRIM, the Stopping and Range of Ions in Matter (an improved version of TRIM, the Transport of Ions in Matter, which is simulation software for ion introduction processes by a Monte Carlo method) was used. Note that for the calculation, a calculation based on Model 2 was performed with the $H_2^+$ replaced by $H^+$ that has twice the mass. In addition, a calculation based on Model 4 was performed with the $H_3^+$ replaced by $H^+$ that has three times the mass. Furthermore, a calculation based on Model 3 was performed with the $H_2^+$ replaced by $H_+$ that has half the kinetic energy, and a calculation based on Model 5, with the $H_3^+$ replaced by $H^+$ that has one-third the kinetic energy.

Note that SRIM is software intended for amorphous structures, but SRIM can be applied to cases where irradiation with the hydrogen ion species is performed with high energy at a high dose. This is because the crystal structure of an Si substrate changes into a non-single-crystal structure due to the collision of the hydrogen ion species with Si atoms.

Figure 33:
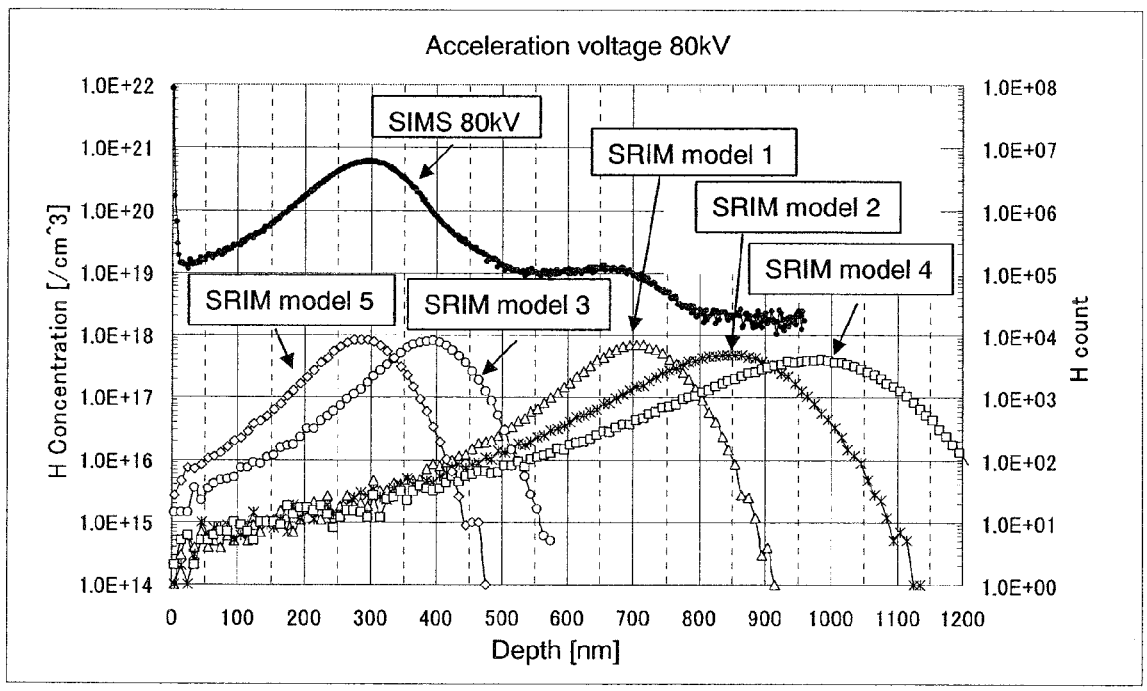
FIG. 33 is a graph showing a depth profile (measured value and calculated value) of a hydrogen element in the case of acceleration voltage of 80 kV.

FIG. 33 illustrates the calculation results obtained when irradiation with the hydrogen ion species (irradiation with 100,000 atoms for H) is performed using Models 1 to 5. FIG. 33 also illustrates the hydrogen concentration (secondary ion mass spectrometry (SIMS) data) in an Si substrate irradiated with the hydrogen ion species of FIG. 31. The results of calculations performed using Models 1 to 5 are expressed on the vertical axis (right axis) as the number of hydrogen atoms, and the SIMS data is expressed on the vertical axis (left axis) as the density of hydrogen atoms. The horizontal axis represents depth from the surface of an Si substrate. If the SIMS data, which is measured values, is compared with the calculation results, Models 2 and 4 obviously do not match the peaks of the SIMS data and a peak corresponding to Model 3 cannot be observed in the SIMS data. This shows that the contribution of each of Models 2 to 4 is relatively small. Considering that the kinetic energy of ions is on the order of kiloelectron volts whereas the H—H bond energy is only approximately several electron volts, it is thought that the contribution of each of Models 2 and 4 is small because $H_2^+$ and $H_3^+$ mostly split into $H^+$ or H by colliding with Si atoms.

Figure 34:
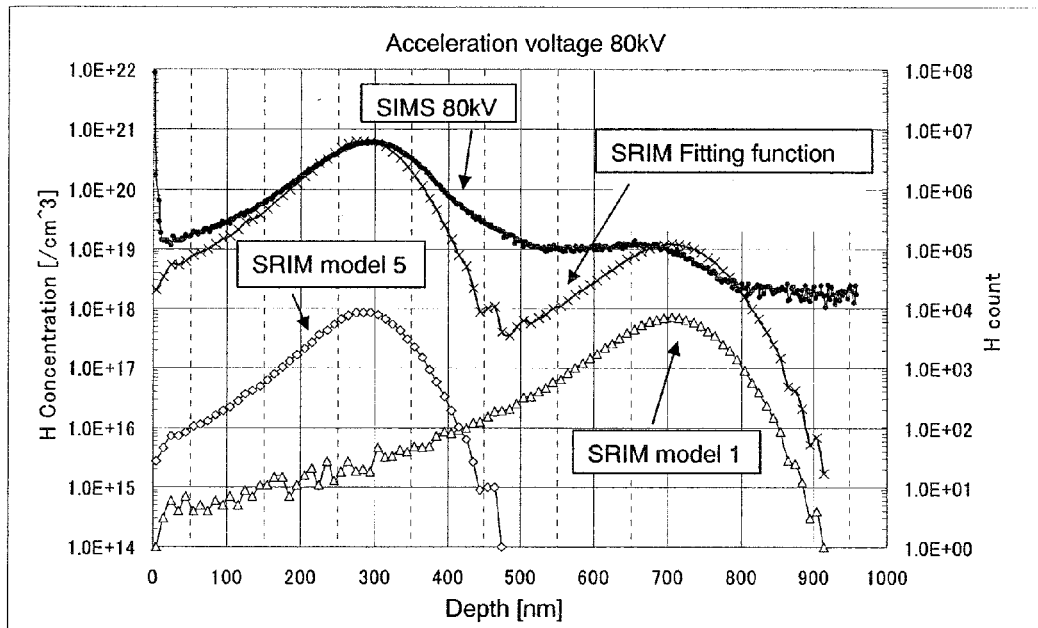
FIG. 34 is a graph showing a depth profile (measured value, calculated value, and fitting function) of a hydrogen element in the case of acceleration voltage of 80 kV.
Figure 35:
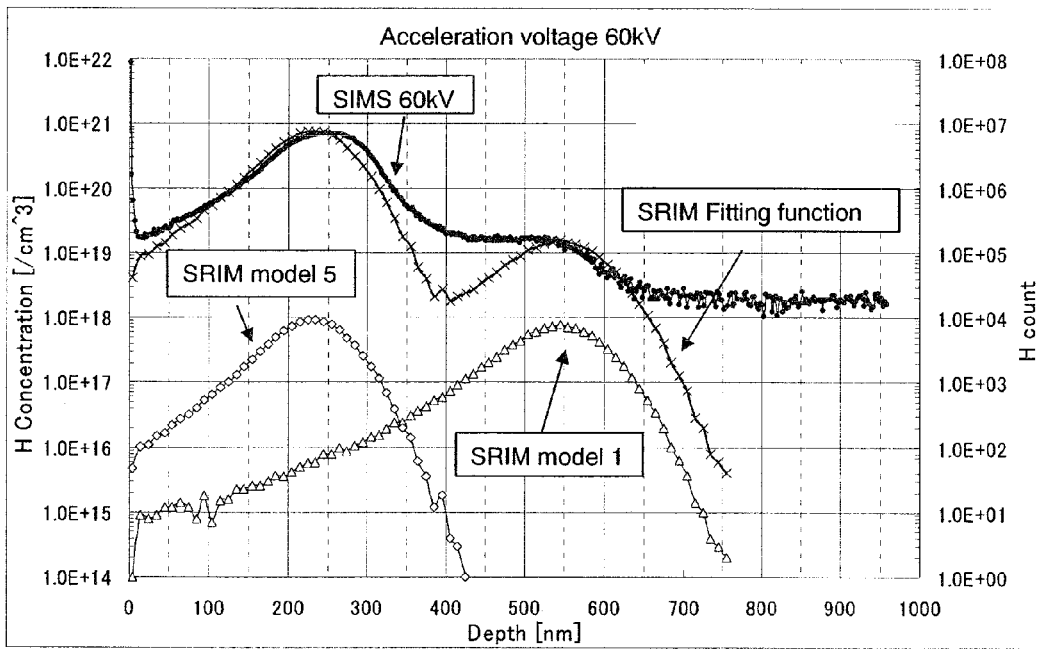
FIG. 35 is a graph showing a depth profile (measured value, calculated value, and fitting function) of a hydrogen element in the case of acceleration voltage of 60 kV.
Figures 36, 37:
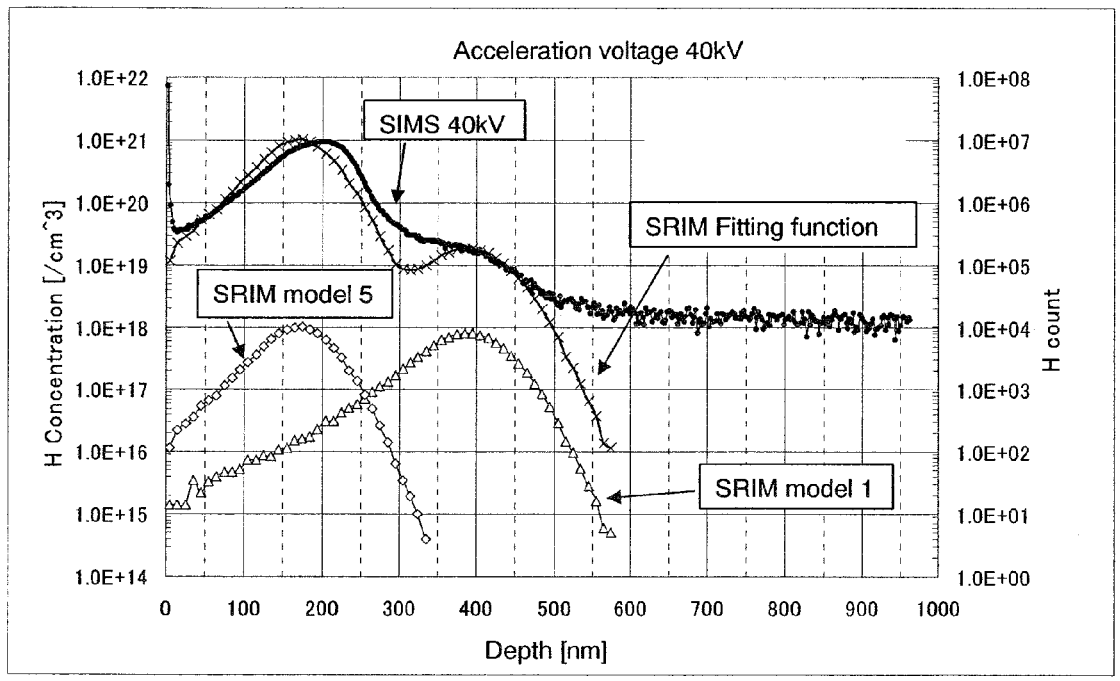
FIG. 36 is a graph showing a depth profile (measured value, calculated value, and fitting function) of a hydrogen element in the case of acceleration voltage of 40 kV.
FIG. 37 is a table showing a ratio of fitting parameter (the ratio of hydrogen element and the ratio of hydrogen ion species).

Accordingly, Models 2 to 4 will not be considered hereinafter. FIGS. 34 to 36 each illustrate the calculation results obtained when irradiation with the hydrogen ion species (irradiation with 100,000 atoms for H) is performed using Models 1 and 5. FIGS. 34 to 36 also each illustrate the hydrogen concentration (SIMS data) in an Si substrate irradiated with the hydrogen ion species of FIG. 31, and the simulation results fitted to the SIMS data (hereinafter referred to as a fitting function). Here, FIG. 34 illustrates the case where the acceleration voltage is 80 kV; FIG. 35, the case where the acceleration voltage is 60 kV; and FIG. 36, the case where the acceleration voltage is 40 kV. Note that the results of calculations performed using Models 1 and 5 are expressed on the vertical axis (right axis) as the number of hydrogen atoms, and the SIMS data and the fitting function are expressed on the vertical axis (left axis) as the density of hydrogen atoms. The horizontal axis represents depth from the surface of an Si substrate.

The fitting function is obtained using the calculation formula given below, in consideration of Models 1 and 5. Note that in the calculation formula, X and Y represent fitting parameters and V represents volume.

(Fitting Function)=$X/V \times$(Data of Model 1)+$Y/V \times$(Data of Model 5)

In consideration of the ratio between ion species used for actual irradiation ($H^+$:$H_2^+$:$H_3^+$ is approximately 1:1:8), the contribution of $H_2^+$ (i.e., Model 3) should also be considered; however, Model 3 is excluded from the consideration given here for the following reasons:

Since the amount of hydrogen introduced through the irradiation process represented by Model 3 is lower than that introduced through the irradiation process of Model 5, there is no significant influence even if Model 3 is excluded from the consideration (no peak appears in the SIMS data either).

Model 3, the peak position of which is close to that of Model 5, is likely to be obscured by channeling (movement of atoms due to crystal lattice structure) that occurs in Model 5. That is, it is difficult to estimate fitting parameters for Model 3. This is because this simulation assumes amorphous Si, and the influence due to crystallinity is not considered.

FIG. 37 lists the above-described fitting parameters. At any of the acceleration voltages, the ratio of the amount of H introduced according to Model 1 to that introduced according to Model 5 is approximately 1:42 to 1:45 (the amount of H in Model 5, when the amount of H in Model 1 is defined as 1, is approximately 42 to 45), and the ratio of the number of ions used for irradiation, $H^+$ (Model 1) to that of $H_3^+$ (Model 5) is approximately 1:14 to 1:15 (the amount of $H_3^+$ in Model 5, when the amount of $H^+$ in Model 1 is defined as 1, is approximately 14 to 15 inclusive). Considering that Model 3 is not considered and the calculation assumes amorphous Si, it can be said that values close to that of the ratio between ion species used for actual irradiation ($H^+:H_2^+:H_3^+$ is approximately 1:1:8) is obtained.

(Effects of Use of $H_3^+$)

A plurality of benefits resulting from $H_3^+$ can be enjoyed by irradiation of a substrate with hydrogen ion species with a higher proportion of $H_3^+$ as shown in FIG. 31. For example, because $H_3^+$ splits into $H^+$, H, or the like to be introduced into a substrate, ion introduction efficiency can be improved compared with the case of irradiation mainly with $H^+$ or $H_2^+$. This leads to an improvement in SOI substrate production efficiency. In addition, because the kinetic energy of $H_+$ or H after $H_3^+$ splits similarly tends to be low, $H_3^+$ is suitable for manufacture of thin semiconductor layers.

Note that in this specification, a method is described in which an ion doping apparatus that is capable of irradiation with the hydrogen ion species as shown in FIG. 31 is used in order to efficiently perform irradiation with $H_3^+$. Ion doping apparatuses are inexpensive and excellent for use in large-area treatment. Therefore, by irradiation with $H_3^+$ with use of such an ion doping apparatus, significant effects such as an improvement in semiconductor characteristics, an increase in area, a reduction in costs, and an improvement in production efficiency can be obtained. On the other hand, if the first priority is given to irradiation with $H_3^+$, there is no need to interpret the present invention as being limited to the use of an ion doping apparatus.

Figure 1C:
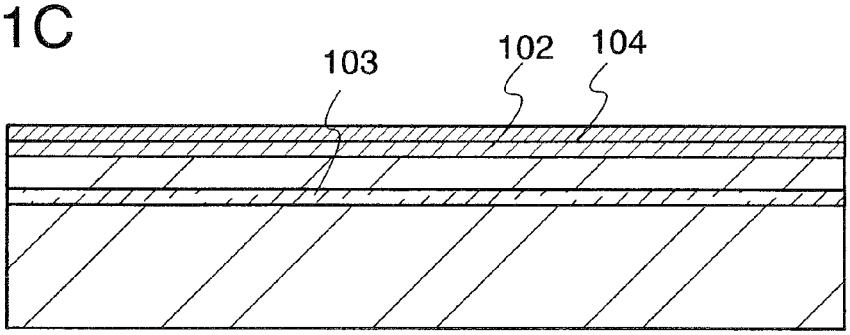

Next, an insulating layer 104 (also referred to as a "bonding layer") is formed over the single crystal semiconductor substrate 101 with the insulating layer 102 interposed therebetween (see FIG. 1C). The insulating layer 104 is formed as a surface where the single crystal semiconductor substrate 101 forms a bond with the supporting substrate. The insulating layer 104 may have a single layer structure or a stacked layer structure, and an insulating layer in which a surface which is to form a bond with the supporting substrate (hereinafter also referred to as a "bonding surface") has a smooth surface and becomes a hydrophilic surface is preferably used.

For the insulating layer which has a smooth surface and can form a hydrophilic surface, silicon oxide containing hydrogen, silicon nitride containing hydrogen, silicon nitride containing oxygen and hydrogen, silicon oxynitride, silicon nitride oxide, or the like can be used.

As silicon oxide containing hydrogen, for example, silicon oxide formed by a chemical vapor deposition method using organosilane is preferable. With use of the insulating layer 104 which is formed using organosilane, for example, a silicon oxide film, a bond between the supporting substrate and the single crystal semiconductor layer can be made strong. Examples of organosilane that can be used include silicon-containing compounds such as tetraethoxysilane (TEOS) (chemical formula: $Si(OC_2H_5)_4$), tetramethylsilane (TMS) (chemical formula: $Si(CH_3)_4$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), and tris(dimethylamino)silane (chemical formula: $SiH(N(CH_3)_2)_3$).

A silicon oxide layer can also be formed by a chemical vapor deposition method using monosilane, disilane, or trisilane as a source gas. The silicon oxide layer may be a thermal oxide film, and it is preferable to contain chlorine. Silicon nitride containing hydrogen can be formed by a plasma CVD method using a silane gas and an ammonia gas. Hydrogen may be added to the gases.

Silicon nitride containing oxygen and hydrogen can be formed by a plasma CVD method using a silane gas, an ammonia gas and a nitrous oxide gas. In any case, any of silicon oxide, silicon oxynitride, or silicon nitride oxide, which contains hydrogen and is formed by a chemical vapor deposition method such as a plasma CVD method, a low-pressure CVD method, or a normal-pressure CVD method using a silane gas, or the like as a source gas can be used. Deposition by a chemical vapor deposition method is performed at a temperature low enough to keep from degassing of the damaged region 103 formed in the single crystal semiconductor substrate 101. For example, the deposition temperature is preferably less than or equal to 350° C. Note that, for heat treatment in separation of the single crystal semiconductor layer from the single crystal semiconductor substrate 101, a heat treatment temperature that is higher than the film formation temperature in a chemical vapor deposition method is applied. In any case, an insulating layer can be used as the insulating layer 104 as long as it has a smooth surface and a surface to which a hydroxyl group is attached.

The insulating layer 104 can be formed to a thickness of greater than or equal to 10 nm and less than or equal to 200 nm. The preferable thickness is greater than or equal to 10 nm and less than or equal to 100 nm, and the more preferable thickness is greater than or equal to 20 nm and less than or equal to 50 nm.

Figure 1D:
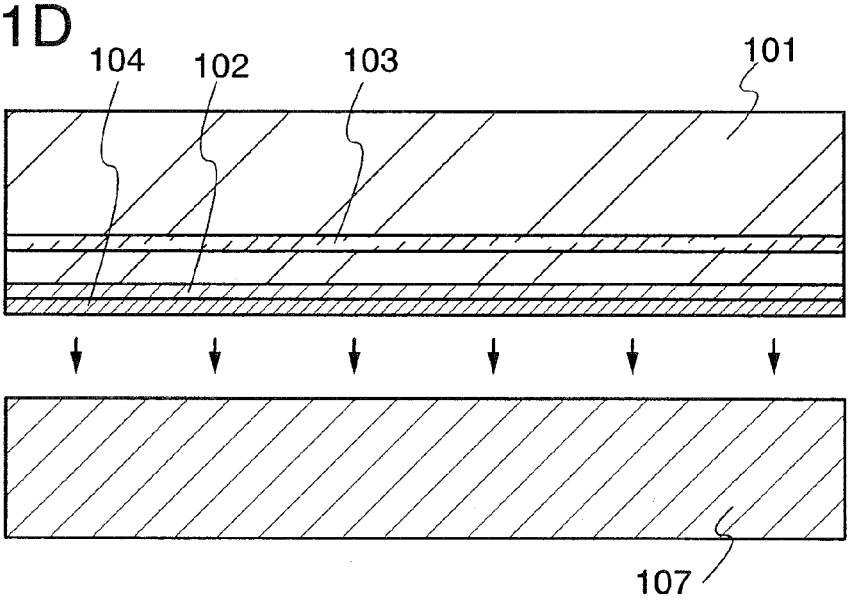

Next, the single crystal semiconductor substrate 101 and a supporting substrate 107 are bonded to each other (see FIG. 1D). A surface of the insulating layer 104 formed over the single crystal semiconductor substrate 101 and a surface of the supporting substrate 107 are placed in close contact with each other, whereby the single crystal semiconductor substrate 101 and the supporting substrate 107 are bonded to each other. This bond is formed by a hydrogen bond or Van der Waals forces. Hydroxyl groups or water molecules on surfaces of the single crystal semiconductor substrate 101 and the supporting substrate 107 which have become hydropholic serve as an adhesive, whereby the bond is formed. The water molecules are diffused by heat treatment, and silanol groups (Si—OH) of remaining components are bonded to each other by a hydrogen bond. Further, in this bonding portion, by hydrogen being released, a Si—O—Si bond (siloxane bond) is formed to generate a covalent bond, so that the single crystal semiconductor substrate 101 and the supporting substrate 107 can be bonded to each other strongly.

As the supporting substrate 107, a substrate having an insulating surface is used. For example, variety of glass substrates used in the electronics industry, such as an aluminosilicate glass substrate, an aluminoborosilicate glass substrate, or a barium borosilicate glass substrate; a quartz substrate; a ceramic substrate, or a sapphire substrate can be given. It is preferable to use a glass substrate for the supporting substrate 107: for example, a large-sized mother glass substrate called the sixth generation (1500 mm×1850 mm), the seventh generation (1870 mm×2200 mm), or the eighth generation (2200 mm×2400 mm) is used. Manufacture of an SOI substrate with a large-area mother glass substrate used as the supporting substrate 107 makes it possible to realize a large-area SOI substrate. As a result, the number of display panels which is manufactured from a single substrate (panels yielded per substrate) can be increased, and accordingly, productivity can be improved.

A variety of glass substrates used in the electronics industry such as an aluminosilicate glass substrate, an aluminoborosilicate glass substrate, or a barium borosilicate glass substrate, which have polished surfaces, are preferably used because of high planarity thereof. The polished surface of the glass substrate and the single crystal semiconductor substrate or the second insulating layer formed over the single crystal semiconductor substrate are bonded to each other, whereby defective bonding can be reduced. The glass substrate may be polished with cerium oxide or the like, for example. By polishing treatment, the single crystal semiconductor substrate can be bonded to almost entire surface including an end region on a main surface of the glass substrate.

In order to favorably perform bonding between the supporting substrate 107 and the insulating layer 104, a bonding surface may be activated. For example, one or both of the surfaces which are to form a bond are irradiated with an atom beam or an ion beam. When an atom beam or an ion beam is used, a neutral atom beam of an inert gas of argon or the like or an ion beam of an inert gas can be used. It is also possible to activate the bonding surface by plasma irradiation or radical treatment. Such surface treatment facilitates formation of a bond between different kinds of materials even at a temperature of less than or equal to 400° C.

Figure 2A:
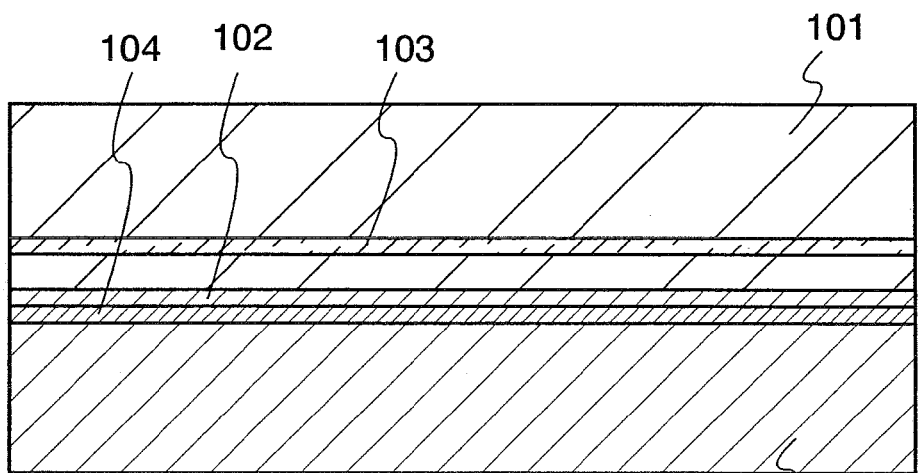
FIGS. 2A to 2C are views illustrating a manufacturing method of an SOI substrate of Embodiment Mode 1.

After the supporting substrate 107 and the single crystal semiconductor substrate 101 are bonded to each other with the insulating layer 104 interposed therebetween (see FIG. 2A), it is preferable that one or both of heat treatment and pressure treatment be performed. Heat treatment or pressure treatment makes it possible to increase bonding strength between the supporting substrate 107 and the single crystal semiconductor substrate 101. The heat treatment is performed at a temperature less than or equal to the allowable temperature limit of the supporting substrate 107. The pressure treatment is performed so that pressure is applied perpendicularly to the bonding surface, in consideration of the pressure resistance of the supporting substrate 107 and the single crystal semiconductor substrate 101.

Figure 2B:
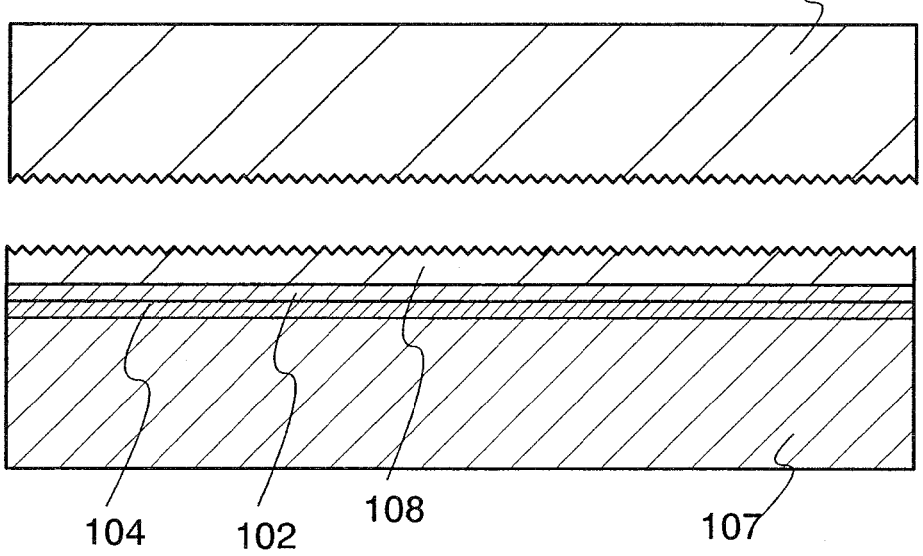

Heat treatment is performed on the single crystal semiconductor substrate 101 to separate the single crystal semiconductor substrate 101 at the damaged region 103 (see FIG. 2B). The heat treatment is preferably performed at a temperature greater than or equal to the temperature at which the insulating layer 104 is formed and less than or equal to the allowable temperature limit of the supporting substrate 107. By heat treatment at 400° C. to 700° C., for example, a change occurs in the volume of microvoids formed in the damaged region 103, so that the single crystal semiconductor substrate 101 is separated at the damaged region 103. Since the insulating layer 104 is bonded to the supporting substrate 107, a single crystal semiconductor layer 108 separated from the single crystal semiconductor substrate 101 is bonded to the supporting substrate 107. The single crystal semiconductor layer 108 having the same crystal structure and crystal orientation as the single crystal semiconductor substrate 101 remains in the supporting substrate 107.

Heat treatment in a temperature range of 400° C. to 700° C. may be continuously performed with the same apparatus as the above heat treatment for improving the bonding strength or with another apparatus. For example, after heat treatment in a furnace at 200° C. for two hours, the temperature is increased to near 600° C. and held for two hours, the temperature is decreased to a temperature ranging from 400° C. to a room temperature, and then the single crystal semiconductor substrate and the supporting substrate are taken out of the furnace. Alternatively, heat treatment may be performed with a temperature increasing from room temperature. Further alternatively, heat treatment may be performed in a furnace at 200° C. for two hours, and then, heat treatment may be performed in a temperature range of 600° C. to 700° C. with a rapid thermal annealing (RTA) apparatus for 1 minute to 30 minutes (e.g., at 600° C. for seven minutes, or at 650° C. for seven minutes).

By heat treatment in a temperature range of 400° C. to 700° C., bond between the insulating layer and the supporting substrate shifts from hydrogen bond to covalent bond, and a gas with which the damaged region is irradiated is taken out and pressure rises, whereby the semiconductor layer can be separated from the single crystal semiconductor substrate at the damaged region. After the heat treatment, the supporting substrate and the single crystal semiconductor substrate are in a state where one of the supporting substrate and the single crystal semiconductor substrate is provided over the other, and the supporting substrate and the single crystal semiconductor substrate can be separated from each other without application of large force. For example, a substrate provided over the other is lifted by a vacuum chuck, so that the substrate can be easily separated. At this time, if a substrate on a lower side is fixed with a vacuum chuck or a mechanical chuck, both the supporting substrate and the single crystal semiconductor substrate can be separated from each other without horizontal deviation.

Note that in FIGS. 1A to 1D, FIGS. 2A to 2C, FIGS. 3A to 3C, and FIGS. 4A to 4D, the single crystal semiconductor substrate 101 has the same size as that of the supporting substrate 107; however, the present invention is not limited thereto. The single crystal semiconductor substrate 101 and the supporting substrate 107 may have a smaller size or the single crystal semiconductor substrate 101 may have a larger size than the supporting substrate 107.

Next, crystal defects remaining on the surface of the single crystal semiconductor layer 108 bonded to the supporting substrate 107 are removed by dry etching. Defects due to the ion addition step for forming the damaged region 103 or the separation step exist on the surface of the single crystal semiconductor layer 108 shown in FIG. 2B, and the defects damage the planarity of the surface of the single crystal semiconductor layer 108. It is difficult to form a gate insulating layer which is thin and has high withstand voltage on such a surface of the single crystal semiconductor layer 108 whose planarity is damaged. In the case where defects exist at the single crystal semiconductor layer 108, the performance and reliability of the transistor are adversely affected; for example, the localized level density at the interface with the gate insulating layer is increased; thus, treatment for removing the defects of the single crystal semiconductor layer 108 is performed. Note that the uneven shape of the surface of the single crystal semiconductor layer 108 in FIG. 2B just shows characteristically that the surface is rough and has poor planarity, and the actual shape is not limited thereto.

Figure 2C:
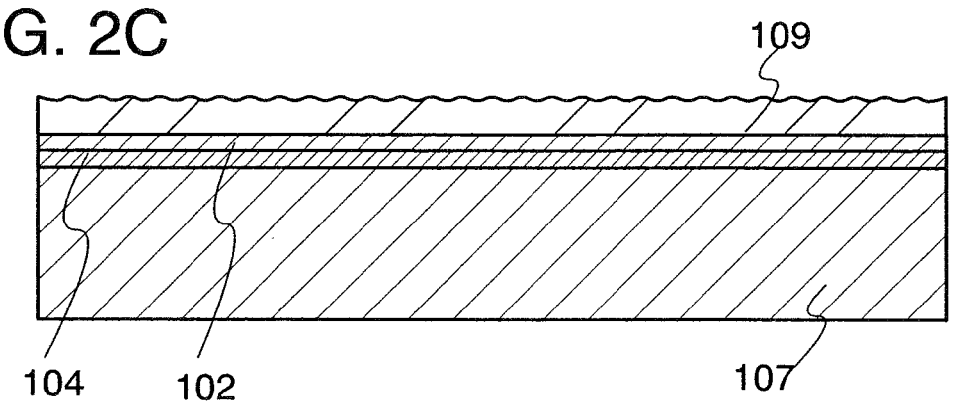

In order to remove defects existing on the surface of the single crystal semiconductor layer 108, dry etching is performed on the surface of the single crystal semiconductor layer 108 (see FIG. 2C). In this embodiment mode, for example, a dry etching method such as reactive ion etching (RIE), ICP (inductively coupled plasma) etching, ECR (electron cyclotron resonance) etching, parallel plate (capacitive coupled plasma) etching, magnetron plasma etching, dual-frequency plasma etching, or helicon wave plasma etching is used.

A natural oxide film is formed on the surface of the single crystal semiconductor layer 108. When dry etching is performed on the single crystal semiconductor layer 108 on which the natural oxide film is formed, the thickness of the single crystal semiconductor layer 108 after the dry etching varies. The surface of the single crystal semiconductor layer 108 is processed with dilute hydrofluoric acid, and the natural oxide film is removed and a contaminant such as dust which is attached to the surface is also removed to clean the surface of the single crystal semiconductor layer 108. Then, a silicon oxide layer is formed over the cleaned single crystal semiconductor layer 108 (not shown). Chemical oxide can be used for the silicon oxide layer. For example, chemical oxide can be formed in such a manner that the surface of the single crystal semiconductor layer is processed with ozone-containing water.

Dry etching is performed on the single crystal semiconductor layer 108 on which the silicon oxide layer is formed. By dry etching and removal of the surface of the single crystal semiconductor layer 108, defects formed on the surface of the single crystal semiconductor layer 108 can be removed, and thus surface roughness of the single crystal semiconductor layer 108 can be reduced. For example, when ICP etching is used, etching may be performed under the following conditions: the flow rate of chlorine, which is an etching gas: 40 sccm to 100 sccm; power applied to a coil electrode: 100 W to 200 W; the temperature of a lower electrode (on the bias side): 40 W to 100 W; and the reaction pressure: 0.5 Pa to 1.0 Pa. For the etching gas, a chloride gas such as chlorine, boron chloride, silicon chloride or carbon tetrachloride; a fluoride gas such as carbon tetrafluoride, sulfur fluoride, or nitrogen fluoride; or oxygen is used as appropriate. For example, when etching is performed under the following conditions: a flow rate of chlorine, which is an etching gas, of 100 sccm, reaction pressure of 1.0 Pa, a temperature of the lower electrode of 70° C., RF (13.56 MHz) power applied to the coil electrode of 150 W, power applied to the lower electrode (on the bias side) of 40 W, the thickness of the single crystal semiconductor layer 108 can be reduced to about 50 nm to 60 nm. The size and depth of the defect of the single crystal semiconductor layer results from the amount of energy or the dose of addition of ions. Thus, the thickness of the single crystal semiconductor layer to be removed by dry etching may be set as appropriate depending on the thickness of the single crystal semiconductor layer 108 before dry etching and surface roughness thereof.

The dry etching shown in FIG. 2C can be performed as follows: a flow rate of chlorine, which is an etching gas, of 100 sccm, power applied to the coil electrode of 150 W, power applied to the lower electrode (on the bias side) of 40 W, reaction pressure of 1.0 Pa to remove the single crystal semiconductor layer 108 to about 95 nm.

By dry etching performed on the surface of the single crystal semiconductor layer bonded to the supporting substrate by separation of the single crystal semiconductor substrate, defects due to an ion addition step or a separation step can be removed; thus, surface roughness of the single crystal semiconductor layer can be reduced.

Furthermore, by the above-described dry etching, the thickness of the single crystal semiconductor layer 108 can be reduced to the thickness which is optimum for a semiconductor element to be formed later.

Figure 3A:
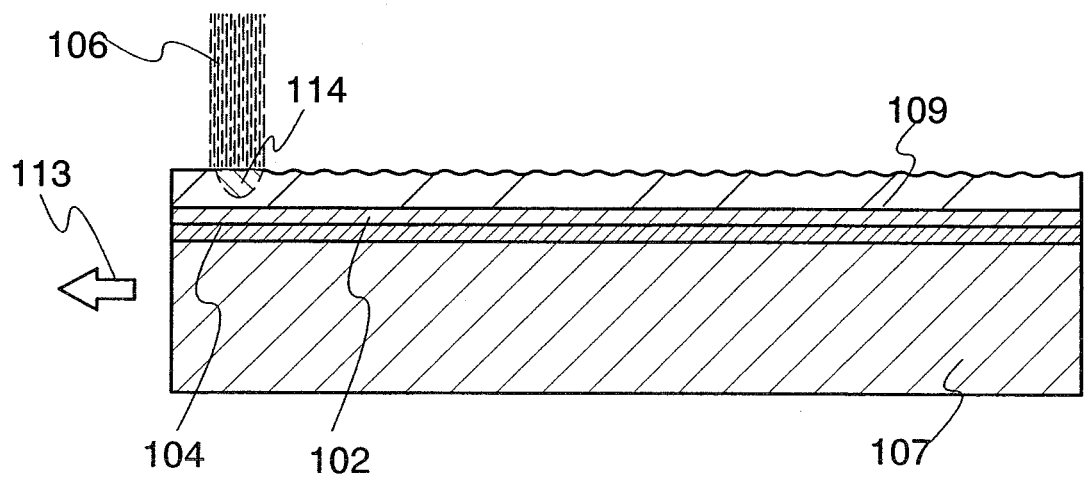
FIGS. 3A to 3C are views illustrating a manufacturing method of an SOI substrate of Embodiment Mode 1.

Note that crystal defects are formed in the single crystal semiconductor layer 109 bonded to the supporting substrate 107 due to formation of the damaged region 103 and separation at the damaged region 103. In order to reduce the crystal defects in the single crystal semiconductor layer 109 and recover the crystallinity of the single crystal semiconductor layer 109, the single crystal semiconductor layer 109 is irradiated with a laser beam 106 as shown in FIG. 3A.

As indicated by an arrow 113, the surface of the single crystal semiconductor layer 109 is irradiated with a laser beam 106 in such a manner that the single crystal semiconductor layer 109 is scanned with the laser beam 106 while the supporting substrate 107 is moved. By irradiation with the laser beam 106, part of the single crystal semiconductor layer 109 or the entire layer in the depth direction is melted. When the single crystal semiconductor layer is melted, planarity is increased by an effect of surface tension. In FIG. 3A, the state in which part of the single crystal semiconductor layer is melted is schematically shown, and at least part of a part 114 surrounded by a dotted line becomes a liquid phase after exceeding 1410° C. which is the melting point of silicon.

By irradiation with the laser beam 106, a region of the single crystal semiconductor layer 109 which is irradiated with the laser beam is partially melted or completely melted. Note that a state in which the single crystal semiconductor layer 109 is completely melted refers to a state in which the whole layer, which is from the top surface to bottom surface of the layer, is melted. As for a stacked layer structure of FIG. 3A, a state in which the single crystal semiconductor layer is completely melted refers to a state in which the single crystal semiconductor layer 109, from the top surface thereof to the interface with the insulating layer 102, is melted to be in a liquid state. On the other hand, partial melting of the single crystal semiconductor layer 109 refers to melting in such a manner that the depth to which the single crystal semiconductor layer 109 is melted is shallower than the interface with the insulating layer 102 (the thickness of the single crystal semiconductor layer 109). That is, a state in which the single crystal semiconductor layer 109 is partially melted refers to a state in which an upper layer of the single crystal semiconductor layer 109 is melted to become a liquid phase and a bottom layer thereof is not melted to remain a single crystal semiconductor in a solid phase.

A region is scanned with the laser beam 106 while being completely melted by irradiation with the laser beam 106, so that crystal growth can occur from a single crystal semiconductor which is adjacent to the melted region, and horizontal growth occurs. A part which is not melted is a single crystal and crystal orientations are aligned; thus, crystal boundaries are not formed, and a single crystal semiconductor layer 110 after the laser beam irradiation can be a single crystal semiconductor layer without crystal boundaries. Moreover, the completely melted region is recrystallized by solidification, and a single crystal semiconductor which is adjacent to the completely melted region and which is not melted and a single crystal semiconductor in which crystal orientations are aligned are formed. Thus, in the case of using single crystal silicon whose plane orientation of a main surface is (100) for the single crystal semiconductor substrate 101, the plane orientation of a main surface of the single crystal semiconductor layer 110 is (100), and the plane orientation of a main surface of the single crystal semiconductor layer 110 which is completely melted by laser beam irradiation and recrystallized is (100).

The single crystal semiconductor layer 109 is partially or completely melted by irradiation with the laser beam 106, whereby the single crystal semiconductor layer 110 whose surface is flat can be formed. Since the part of the single crystal semiconductor layer 109 which is melted is liquid, the part is modified by an effect of surface tension so that the surface area thereof becomes smallest. In other words, the liquid part is modified so that concavity and convexity are removed, and this liquid part is solidified to be recrystallized; thus, the single crystal semiconductor layer 110 whose surface is planarized can be formed.

Figure 3B:
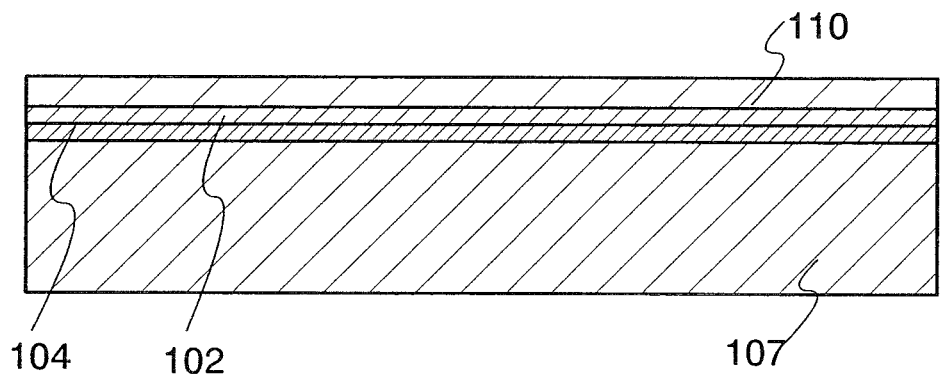

After melting, the single crystal semiconductor layer 109 is cooled and solidified, whereby the single crystal semiconductor layer 110 whose upper surface is further planarized and which is recrystallized can be formed as shown in FIG. 3B. Laser beam irradiation makes it possible to reduce distortion of the single crystal semiconductor layer 110. Note that improvement in the crystallinity of the single crystal semiconductor layer 110 by the laser beam 106 can be confirmed from Raman shift obtained from Raman spectroscopy, a full width at half maximum, or the like. In addition, improvement in the planarity of the single crystal semiconductor layer 110 can be confirmed with an atomic force microscope or the like.

Since the laser beam 106 is used in this laser beam irradiation step, increase in the temperature of the supporting substrate 107 can be suppressed. Thus, a substrate whose allowable temperature limit is low, such as a glass substrate, can be used as the supporting substrate 107.

A laser of the laser beam 106 having oscillation wavelengths in a range of from ultraviolet light to a visible light region is used. The wavelength of the laser beam 106 is a wavelength that is absorbed by the semiconductor layer 109. The wavelength can be determined in consideration of the skin depth of the laser beam, or the like. For example, the wavelength can be in the range of greater than or equal to 190 nm and less than or equal to 700 nm.

The laser can be a continuous wave laser, a pseudo continuous wave laser, or a pulsed laser. A pulsed laser is preferable for partial melting. For example, the following lasers can be used: a pulsed laser which can emit a laser beam having a repetition rate of less than or equal to 1 MHz and a pulse width of greater than or equal to 10 nanosecond and less than or equal to 500 nanosecond and an XeCl excimer laser which can emit a laser beam having a repetition rate of 10 Hz to 300 Hz, a pulse width of 25 nanosecond, and a wavelength of 308 nm.

The energy of the laser beam 106 can be determined in consideration of a wavelength, the skin depth of the laser beam 106, and the like. The energy of the laser beam 106 can be, for example, in the range of greater than or equal to 300 mJ/cm$^2$ and less than or equal to 800 mJ/cm$^2$. For example, when the thickness of the semiconductor layer 109 is approximately 120 nm, a pulsed laser is used as a laser and the wavelength of the laser beam 106 is 308 nm, energy density of the laser beam 106 can be 600 mJ/cm$^2$ to 700 mJ/cm$^2$.

Irradiation with the laser beam 106 is preferably performed in a rare gas atmosphere or an inert atmosphere such as a nitrogen atmosphere or in a vacuum state. In order to perform irradiation with the laser beam 106 in an inert atmosphere, irradiation with the laser beam may be performed in an airtight chamber while the atmosphere in the chamber is controlled. When the chamber is not used, by blowing of an inert gas such as a nitrogen gas to the surface irradiated with the laser beam 106, irradiation with the laser beam 106 in the inert atmosphere can be realized.

An inert atmosphere such as nitrogen or a vacuum state has higher effect of improving planarity of the semiconductor layer 109 than an air atmosphere, and an inert atmosphere or a vacuum state is more effective in suppressing generation of cracks and ridges than an air atmosphere, the applicable energy range for the laser beam 106 is widened.

It is preferable to make energy distribution of the laser beam 106 uniform and make a shape of the cross section linear by an optical system. Thus, irradiation with the laser beam 106 can be performed uniformly with high throughput. A beam length of the laser beam 106 is made longer than one side of the supporting substrate 107, whereby the whole single crystal semiconductor layer 109 which is bonded to the supporting substrate 107 can be irradiated with the laser beam by scanning at a time. The beam length of the laser beam 106 may be a length such that the whole single crystal semiconductor layer 109 bonded to the supporting substrate 107 can be irradiated with the laser beam 106 by scanning plural times, when it is shorter than one side of the supporting substrate 107.

Note that before irradiating the single crystal semiconductor layer 109 with the laser beam 106, treatment for removing an oxide film such as a natural oxide film which is formed on the surface of the single crystal semiconductor layer 109 is performed. The reason why the oxide film is removed is that effect of planarization cannot be sufficiently obtained when irradiation with the laser beam 106 is performed in a state where the oxide film remains on the surface of the single crystal semiconductor layer 109. The oxide film can be removed by treatment of the single crystal semiconductor layer 109 with hydrofluoric acid. The treatment with hydrofluoric acid is preferably performed until the surface of the semiconductor layer 109 exhibits a water-repellent property. It can be confirmed, from the single crystal semiconductor layer 109 exhibiting a water-repellent property, that the oxide film is removed from the single crystal semiconductor layer 109.

A step of irradiation with the laser beam 106 in FIG. 3A can be performed as follows: first, the single crystal semiconductor layer 109 is processed with a hydrofluoric acid solution which is diluted to 1/100 for 110 seconds to remove the oxide film over the surface of the semiconductor layer 109; as the laser of the laser beam 106, an XeCl excimer laser (with a wavelength of 308 nm, a pulse width of 25 nanoseconds, and repetition rate of 60 Hz) is used; the cross section of the laser beam 106 is shaped into a linear form of 300 mm×0.34 mm by an optical system; the scanning speed of the laser beam 106 is 2.0 mm/sec; scanning pitch is 33 μm; and the number of beam shots is approximately 10. Scanning with the laser beam 106 is performed with a nitrogen gas blown to the surface which is irradiated. When the supporting substrate 107 is 730 mm×920 mm, since the beam length of the laser beam 106 is 300 mm, a region which is irradiated with the laser beam 106 is divided into three parts, whereby the whole single crystal semiconductor layer 109 bonded to the supporting substrate 107 can be irradiated with laser beam 106.

The single crystal semiconductor layer 109 is irradiated with the laser beam as described above, part or all of the single crystal semiconductor layer 109 is melted and recrystallized, so that a better single crystal semiconductor layer can be obtained. Accordingly, defects caused by addition of ions can be reduced, and a single crystal semiconductor layer whose crystallinity is recovered can be obtained. Moreover, dry etching is performed before laser beam irradiation, so that the single crystal semiconductor layer can be prevented from including defects or damage at the time of being melted.

The single crystal semiconductor layer 109 is recrystallized, so that a transistor with high on current and high field effect mobility can be manufactured using the single crystal semiconductor substrate 101. The single crystal semiconductor layer 109 is recrystallized by irradiation with the laser beam 106, and thus a single crystal can be formed by recrystallization of the single crystal semiconductor layer 109 without application of force which damages the supporting substrate 107 and without heating the supporting substrate 107 at a temperature exceeding its allowable temperature limit.

Moreover, the laser beam irradiation makes it possible to heat and cool down a surface of the supporting substrate in a short time; thus, increase in the temperature of the supporting substrate can be suppressed, and a substrate whose allowable temperature limit is low, such as a glass substrate, can be used as the supporting substrate. Thus, damage in the single crystal semiconductor layer due to the ion addition step can be sufficiently recovered.

In the case where the surface of the single crystal semiconductor layer 108 is removed by dry etching before irradiation with the laser beam 106, damage such as crystal defects is generated near the surface of the single crystal semiconductor layer 108 due to dry etching in some cases. However, irradiation with the laser beam 106 makes it possible to repair damage caused by dry etching.

A single crystal semiconductor substrate is separated along a damaged region thereof and dry etching is performed on a single crystal semiconductor layer which is firmly bonded to a supporting substrate, so that crystal defects of a surface of the single crystal semiconductor layer can be removed and surface roughness of the single crystal semiconductor layer can be reduced. Moreover, since defects of the surface of the single crystal semiconductor layer are removed by dry etching, the single crystal semiconductor layer can be prevented from including the defects at the time of being melted by laser beam irradiation. Thus, a single crystal semiconductor layer whose crystal defects are reduced and which has high planarity can be obtained.

Next, by irradiation with the laser beam 106, an SOI substrate having the single crystal semiconductor layer 110 shown in FIG. 3B is formed. Treatment for reducing the thickness of the single crystal semiconductor layer 110 to the thickness which is optimal for a semiconductor element to be formed later is performed (see FIG. 3C).

In order to reduce the thickness of the single crystal semiconductor layer 110, either dry etching or wet etching, or a combination thereof may be performed. For example, in the case where the single crystal semiconductor substrate 101 is a silicon substrate, the thickness of the single crystal semiconductor layer 110 can be reduced by dry etching using $SF_6$ and $O_2$ as a process gas (see FIG. 3C).

By etching after the laser beam irradiation, an SOI substrate having a single crystal semiconductor layer with a thickness which is optimal for a semiconductor element can be manufactured. By this etching, the single crystal semiconductor layer is preferably thinned to a thickness of greater than or equal to 5 nm and less than or equal to 100 nm, more preferably greater than or equal to 5 nm and less than or equal to 50 nm. For example, when the thickness of the single crystal semiconductor layer bonded to the supporting substrate is 110 nm, wet etching is performed to thin the single crystal semiconductor layer by 15 mm and etching is performed after the laser beam irradiation, whereby the thickness of a single crystal semiconductor layer 111 can be 60 nm. Note that etching is not necessarily performed on the surface of the single crystal semiconductor layer 110 after irradiation with the laser beam 106. For example, when the thickness of the single crystal semiconductor layer bonded to the supporting substrate is 110 nm, dry etching before irradiation with the laser beam 106 can also be performed to thin the single crystal semiconductor layer to a thickness of 60 nm.

After irradiation with the laser beam 106, heat treatment is preferably performed on the semiconductor layer 111 at greater than or equal to 500° C. and less than or equal to 700° C. By this heat treatment, the defects of the semiconductor layer 111, which are not recovered by irradiation with the laser beam 106, can be eliminated and distortion of the semiconductor layer 111 can be relieved. A rapid thermal anneal (RTA) apparatus, a resistance heating furnace, or a microwave heating apparatus can be used for this heat treatment. As an RTA apparatus, a gas rapid thermal anneal (GRTA) apparatus or a lamp rapid thermal anneal (LRTA) apparatus can be used. For example, when a resistance heating furnace is used, heat treatment may be performed at 550° C. for four hours.

Figure 3C:
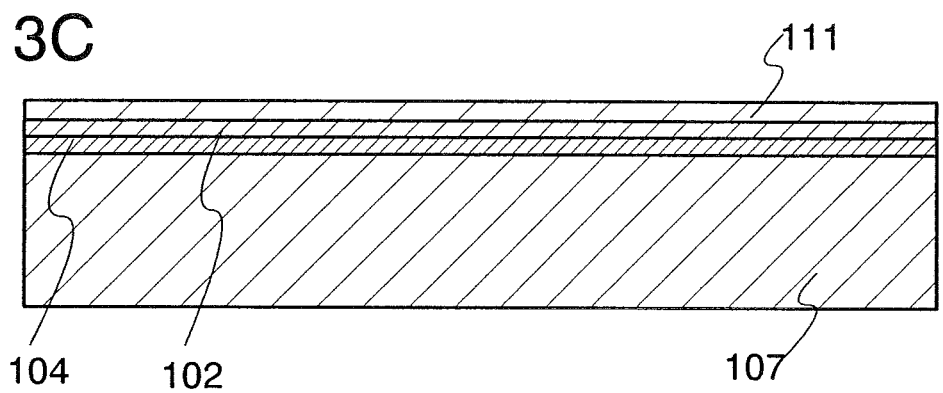

Through the above-described steps, an SOI substrate shown in FIG. 3C can be manufactured.

As described above, in this embodiment mode, dry etching and laser beam irradiation are performed on the single crystal semiconductor layer bonded to the supporting substrate, so that an SOI substrate having the single crystal semiconductor layer with reduced crystal defects can be manufactured. Moreover, even when a substrate whose allowable temperature limit is low, such as a glass substrate, is used, an SOI substrate provided with a single crystal semiconductor layer which is sufficient for practical use can be manufactured.

By formation of a semiconductor element such as a transistor with use of the single crystal semiconductor layer of this embodiment mode, the thickness of a gate insulating layer can be reduced and the localized interface state density with the gate insulating layer can be reduced. In addition, the thickness of the single crystal semiconductor layer is reduced, so that a transistor of complete depletion type with a small subthreshold value can be manufactured over the supporting substrate, with use of a single crystal semiconductor layer.

Figure 4A:
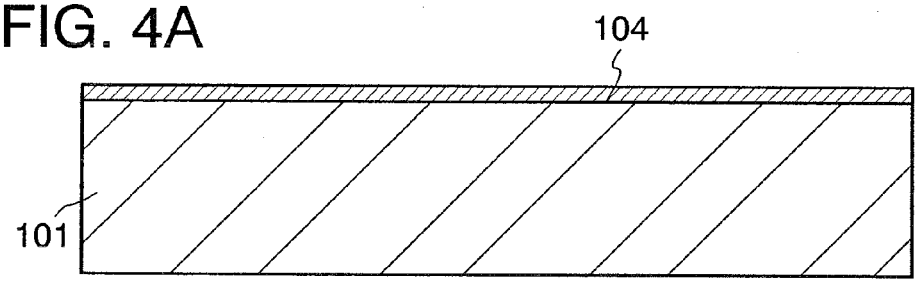
FIGS. 4A to 4D are views illustrating a manufacturing method of an SOI substrate of Embodiment Mode 1.

Note that, although with reference to FIGS. 1A to 1D, FIGS. 2A to 2C and FIGS. 3A to 3C, a process of forming the single crystal semiconductor layer by provision of the insulating layers over the single crystal semiconductor substrate 101 is described, with reference to FIGS. 4A to 4D, a process of forming the single crystal semiconductor layer by provision of the insulating layer over the supporting substrate as well will be described. FIG. 4A shows the single crystal semiconductor substrate 101 which is similar to that shown in FIG. 1A. Next, the insulating layer 104 is formed over the single crystal semiconductor substrate 101. Note that a step of forming the insulating layer 104 is performed similarly to the case of FIG. 1C.

Figure 4B:
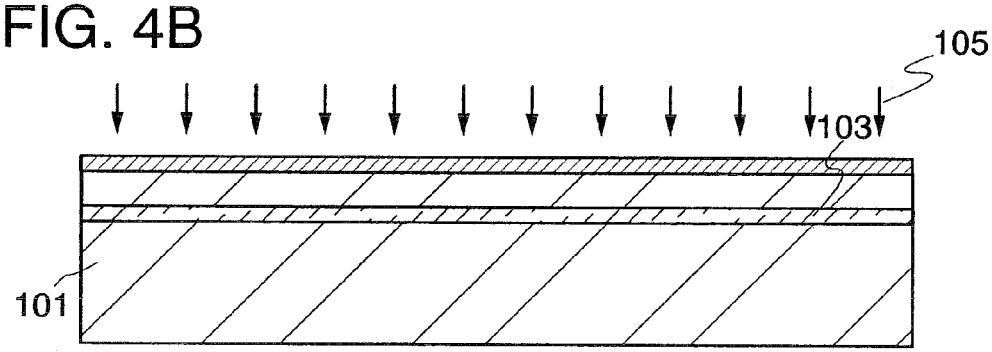

FIG. 4B shows a step of adding ions accelerated by an electric field at a predetermined depth of the single crystal semiconductor substrate 101 to form the damaged region 103. The addition of ions is performed similarly to the case of FIG. 1B.

Figure 4C:
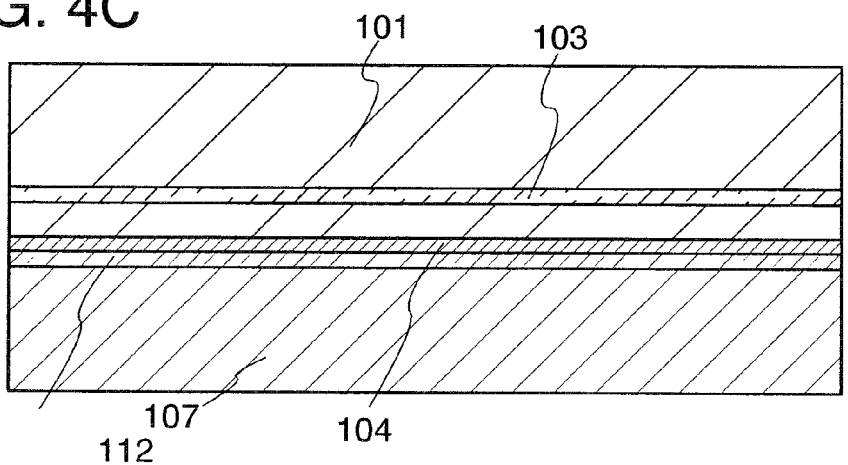

FIG. 4C shows a step in which the supporting substrate 107 over which an insulating layer 112 serving as a barrier layer is formed and a surface of the single crystal semiconductor substrate 101 on which the insulating layer 104 is formed are placed in close contact with each other, so that the single crystal semiconductor substrate 101 and the supporting substrate 107 are bonded to each other. The insulating layer 112 over the supporting substrate 107 and the insulating layer 104 of the single crystal semiconductor substrate 101 are placed in close contact with each other, so that the single crystal semiconductor substrate 101 and the supporting substrate 107 are bonded to each other. When the supporting substrate 107 is a substrate including an impurity such as an alkali metal or an alkaline earth metal by which reliability of the semiconductor device is reduced, the insulating layer 112 can prevent such an impurity from diffusing from the supporting substrate 107 into the single crystal semiconductor layer 108.

The insulating layer 112 can be formed as a single layer structure or a stacked layer structure of a silicon nitride layer, a silicon nitride oxide layer, a silicon oxynitride layer, and the like by a plasma CVD method. The insulating layer 112 is preferably formed to a thickness ranging from 50 nm to 200 nm. For example, a silicon oxynitride layer and a silicon nitride oxide layer are stacked from the supporting substrate 107 side, whereby the insulating layer 112 can be formed.

Figure 4D:
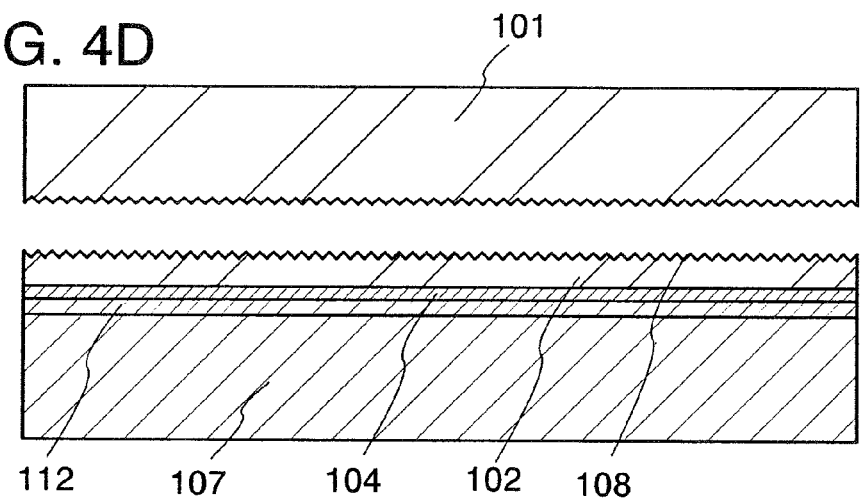

After that, the single crystal semiconductor substrate 101 is separated as shown in FIG. 4D. Heat treatment for separating the single crystal semiconductor layer is performed similarly to the case shown in FIG. 2B. The temperature of heat treatment in a bonding step and a separating step is set at less than or equal to that of the heat treatment which has been performed on the supporting substrate 107 in advance. In this manner, the SOI substrate shown in FIG. 4D can be obtained.

The following steps can be performed similarly to the case of FIG. 2C and FIGS. 3A to 3C.

Note that, although the example in which the single crystal semiconductor substrate 101 and the supporting substrate 107 have the same size is shown in FIGS. 1A to 1D, FIGS. 2A to 2C, FIGS. 3A to 3C, and FIGS. 4A to 4D, the present invention is not limited thereto. The single crystal semiconductor substrate 101 and the supporting substrate 107 may have a smaller size. The single crystal semiconductor substrate 101 may be larger than the supporting substrate 107.

Figure 5:
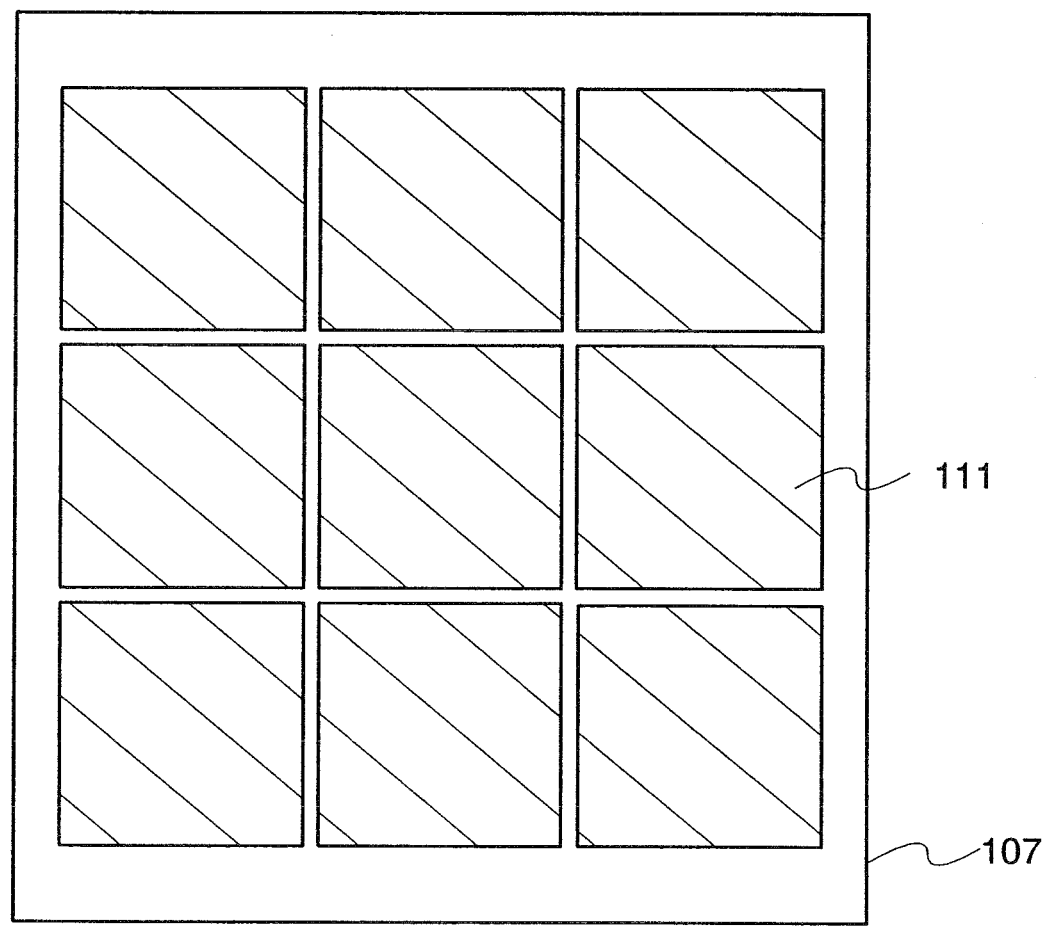
FIG. 5 is a view illustrating a manufacturing method of an SOI substrate of Embodiment Mode 1.

Note that in order to achieve increase in size of the SOI substrate, a structure may be employed in which a plurality of single crystal semiconductor layers 111 are bonded to one supporting substrate 107. For example, through the steps described with reference to FIGS. 1A to 1C, a plurality of single crystal semiconductor substrate 101 in each of which the damaged region 103 is formed are prepared. Next, through the bonding step in FIG. 1D, the plurality of single crystal semiconductor substrates 101 are temporarily bonded to one supporting substrate 107. Then, heat treatment in FIG. 2B is performed to separate each of the single crystal semiconductor substrates 101, whereby the plurality of single crystal semiconductor layers 111 are fixed to the supporting substrate 107. After that, through the steps shown in FIG. 2C and FIGS. 3A to 3C, the SOI substrate to which the plurality of single crystal semiconductor layers 111 are bonded can be manufactured (see FIG. 5).

In this embodiment mode, when a single crystal silicon substrate is used as the single crystal semiconductor substrate 101, single crystal silicon can be obtained as the single crystal semiconductor layer 111.

In a manufacturing method of an SOI substrate according to this embodiment mode, a process temperature can be less than or equal to 700° C.; thus, a glass substrate can be used as the supporting substrate 107. That is, the SOI substrate can be formed over a glass substrate similarly to a conventional thin film transistor and a single crystal silicon layer can be used for the single crystal semiconductor layer. These make it possible to form a transistor with high performance and high reliability in which high speed operation is possible and which can be driven with a low subthreshold value, high field effect mobility, and low consumption voltage can be manufactured over a supporting substrate such as a glass substrate. Therefore, a semiconductor device which has high performance and high reliability can be manufactured with high yield.

Since CMP treatment which is unsuitable for increase in area is not needed, increase in area of a semiconductor device having high performance can be realized. Needless to say, without limitation to the case of using a large-area substrate, even when a small substrate is used, a favorable semiconductor device can be provided.

[Embodiment Mode 2]

In this embodiment mode, a manufacturing method of a CMOS (complementary metal oxide semiconductor) will be described as an example of a manufacturing method of a semiconductor device including a semiconductor element having high performance and high reliability with high yield with reference to FIGS. 6A to 6E and FIGS. 7A to 7D. Note that repetitive descriptions for the same components as or components having similar functions to the components in Embodiment Mode 1 are omitted.

Figure 6A:
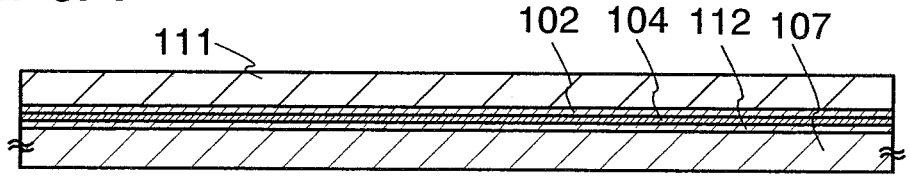
FIGS. 6A to 6E are views illustrating a manufacturing method of a semiconductor device of Embodiment Mode 2.

In FIG. 6A, the insulating layer 112 serving as a barrier layer, the insulating layer 104, the insulating layer 102 serving as a barrier layer, and the single crystal semiconductor layer 111 are formed over the supporting substrate 107. Note that, although an example in which an SOI substrate having a structure shown in FIG. 6A is used will be described in this embodiment mode, an SOI substrate having another structure described in this specification can also be used.

Since the single crystal semiconductor layer 111 is separated from the single crystal semiconductor substrate 101 and subjected to heat treatment by supply of high energy with use of at least one kind of particles having the high energy and first etching, the single crystal semiconductor layer 111 with reduced crystal defects and high planarity is obtained.

In the single crystal semiconductor layer 111, a p-type impurity such as boron, or aluminum, gallium or an n-type impurity such as phosphorus or arsenic is preferably added in accordance with a formation region of an n-channel field effect transistor or a p-channel field effect transistor. In other words, a p-type impurity is added to a formation region of an n-channel field effect transistor or an n-type impurity is added to a formation region of a p-channel field effect transistor, whereby so-called well regions are formed. The dose of impurity ions may range from about $1\times10^{12}$ ions/cm$^2$ to $1\times10^{14}$ ions/cm$^2$. Furthermore, in the case of controlling the threshold voltage of the field effect transistor, a p-type or n-type impurity may be added to the well regions.

Figure 6B:
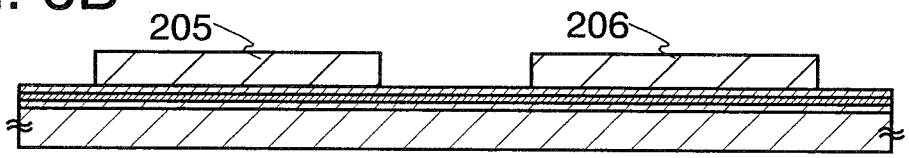

The single crystal semiconductor layer 111 is etched into island shapes in accordance with the position of the semiconductor element to form separated single crystal semiconductor layers 205 and 206 (see FIG. 6B).

An oxide film over the single crystal semiconductor layer is removed, and a gate insulating layer 207 which covers the single crystal semiconductor layers 205 and 206 is formed. Since the single crystal semiconductor layers 205 and 206 in this embodiment mode have high planarity, even if a gate insulating layer formed over the single crystal semiconductor layers 205 and 206 is a thin gate insulating layer, the gate insulating layer can cover the single crystal semiconductor layers 205 and 206 with favorable coverage. Therefore, a property defect due to a coverage defect of the gate insulating layer can be prevented, and a semiconductor device having high reliability can be manufactured with high yield. Reduction in the thickness of the gate insulating layer 207 has an effect of operating a thin film transistor with low voltage at high speed.

The gate insulating layer 207 may be formed of silicon oxide or a stacked structure of silicon oxide and silicon nitride. The gate insulating layer 207 may be formed by deposition of an insulating film by a plasma CVD method or a low pressure CVD method or is preferably formed by solid phase oxidation or solid phase nitridation by plasma treatment. This is because a gate insulating layer formed by oxidation or nitridation of a single crystal semiconductor layer by plasma treatment is dense, has high withstand voltage, and is excellent in reliability.

As the gate insulating layer 207, a high dielectric constant material such as zirconium dioxide, hafnium oxide, titanium dioxide, or tantalum pentoxide may be used. Using a high dielectric constant material for the gate insulating layer 207 makes it possible to reduce gate leakage current.

Figure 6C:
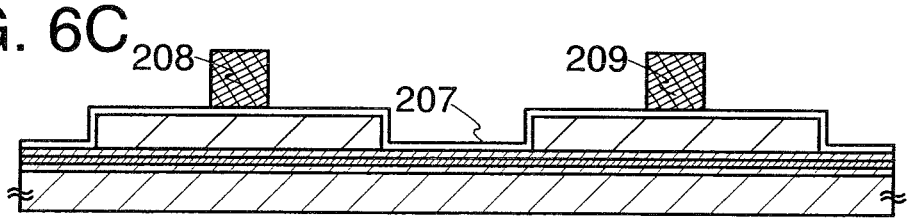
Figure 6D:
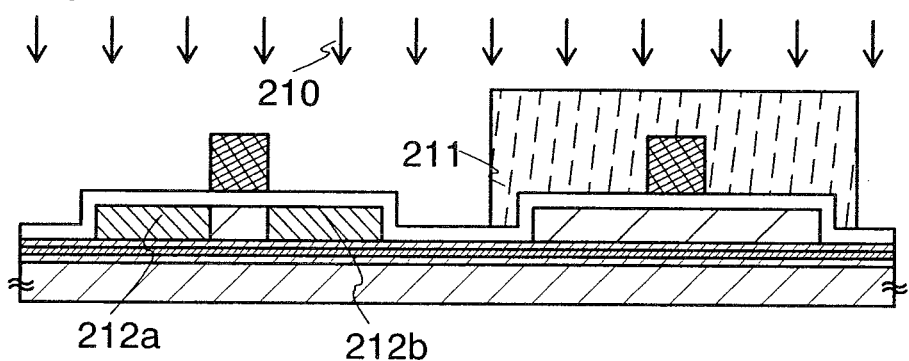
Figure 6E:
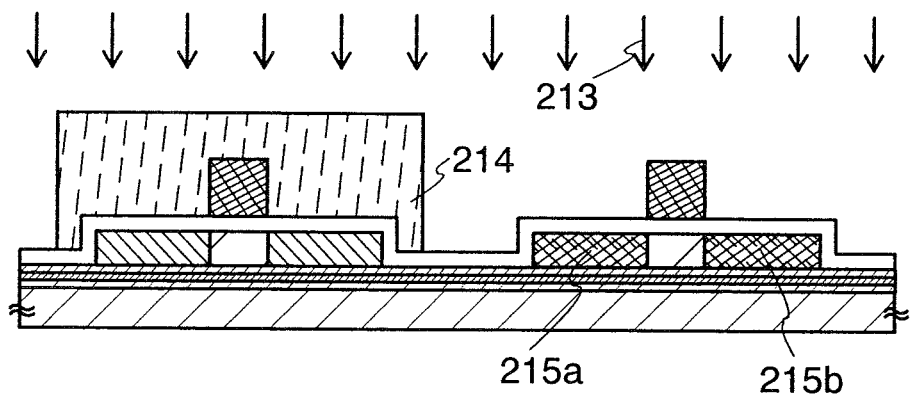

A gate electrode layer 208 and a gate electrode layer 209 are formed over the gate insulating layer 207 (see FIG. 6C). The gate electrode layers 208 and 209 can be formed by a sputtering method, an evaporation method, a CVD method, or the like. The gate electrode layers 208 and 209 may be formed of an element selected from tantalum (Ta), tungsten (W), titanium (Ti), molybdenum (Mo), aluminum (Al), copper (Cu), chromium (Cr), or neodymium (Nd); or an alloy material or a compound material containing any of the above elements as its main component. Alternatively, as the gate electrode layers 208 and 209, a semiconductor film typified by a polycrystalline silicon layer doped with an impurity element such as phosphorus, or an AgPdCu alloy may be used.

A mask 211 which covers the semiconductor layer 206 is formed. With use of the mask 211 and the gate electrode layer 208 as masks, an impurity element 210 imparting n-type conductivity is added to form first n-type impurity regions 212a and 212b (see FIG. 6D). In this embodiment mode, phosphine ($PH_3$) is used as a doping gas containing an impurity element. Here, doping is performed so that the first n-type impurity regions 212a and 212b contain an impurity element imparting n-type conductivity at a concentration of about $1 \times 10^{17}/cm^3$ to $5 \times 10^{18}/cm^3$. In this embodiment mode, phosphorus (P) is used as an impurity element imparting n-type conductivity.

Next, a mask 214 which covers the single crystal semiconductor layer 205 is formed. With use of the mask 214 and the gate electrode layer 209 as masks, an impurity element 213 imparting p-type conductivity is added to form first p-type impurity regions 215a and 215b (see FIG. 6E). In this embodiment mode, diborane ($B_2H_6$) or the like is used as a doping gas containing an impurity element because boron (B) is used as an impurity element.

Figure 7A:
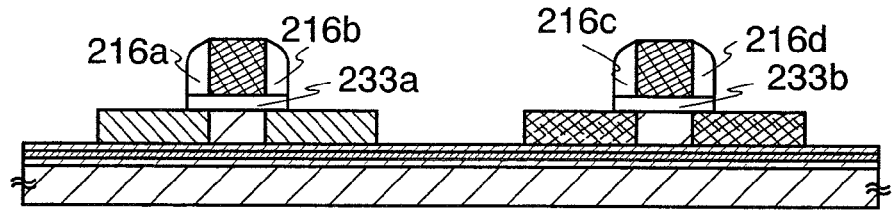
FIGS. 7A to 7D are views illustrating a manufacturing method of a semiconductor device of Embodiment Mode 2.
Figure 7B:
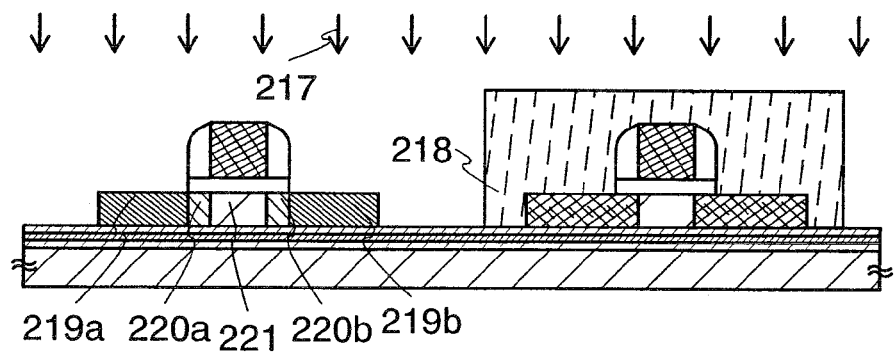
Figure 7C:
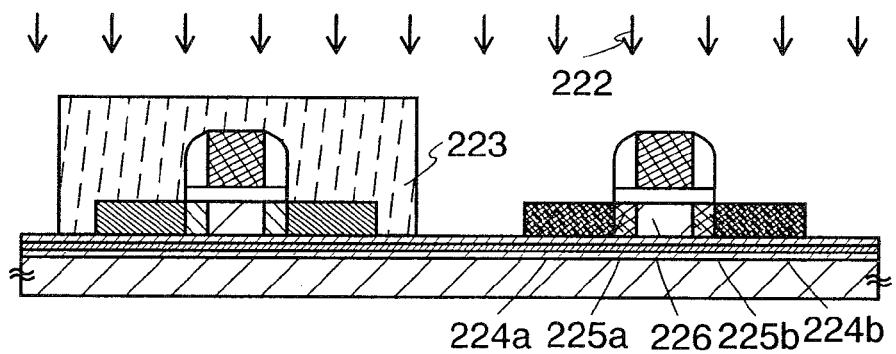

The mask 214 is removed, sidewall insulating layers 216a to 216d with a sidewall structure are formed on side surfaces of the gate electrode layers 208 and 209, and gate insulating layers 233a and 233b are formed (see FIG. 7A). The sidewall insulating layers 216a to 216d with a sidewall structure may be formed on the side surfaces of the gate electrode layers 208 and 209 in a self-alignment manner, in the following manner: an insulating layer covering the gate electrode layers 208 and 209 is formed and is processed by anisotropic etching using an RIE (reactive ion etching) method. Here, there is no particular limitation on the insulating layers and the insulating layers are preferably layers of silicon oxide with favorable step coverage, which are formed by reaction of TEOS (tetraethyl orthosilicate), silane, or the like with oxygen, nitrous oxide, or the like. The insulating layers can be formed by a thermal CVD method, a plasma CVD method, a normal-pressure CVD method, a bias ECRCVD method, a sputtering method, or the like. The gate insulating layers 233a and 233b can be formed by etching of the gate insulating layer 207 with use of the gate electrode layers 208 and 209 and the sidewall insulating layers 216a to 216d as masks.

In this embodiment mode, in etching the insulating layer, the insulating layer over the gate electrode layers are removed to expose the gate electrode layers. However, the sidewall insulating layers 216a to 216d may be formed to have a shape in which the insulating layer over the gate electrode layers remains. In addition, a protective film may be formed over the gate electrode layers in a later step. By protection of the gate electrode layers in this manner, film reduction of the gate electrode layers can be prevented when the gate electrode layers are processed by etching. In the case of forming silicide in a source region and a drain region, since a metal film formed for formation of the silicide is not in contact with the gate electrode layers, even when a material of the metal film can easily react with a material of the gate electrode layer, defects such as chemical reaction or diffusion can be prevented. Various etching methods such as a dry etching method or a wet etching method may be used for etching. In this embodiment mode, a dry etching method is used. As an etching gas, a chlorine-based gas typified by $Cl_2$, $BCl_3$, $SiCl_4$, $CCl_4$, or the like, a fluorine-based gas typified by $CF_4$, $SF_6$, $NF_3$, or the like, or $O_2$ can be used as appropriate.

Next, a mask 218 which covers the single crystal semiconductor layer 206 is formed. The mask 218, the gate electrode layer 208, and the sidewall insulating layers 216a and 216b are used as masks, and an impurity element 217 imparting n-type conductivity is added to form second n-type impurity regions 219a and 219b and third n-type impurity regions 220a and 220b. In this embodiment mode, $PH_3$ is used as a doping gas containing an impurity element. Here, the doping is performed so that the second n-type impurity regions 219a and 219b contain an impurity element imparting n-type conductivity at a concentration of about $5 \times 10^{19}/cm^3$ to $5 \times 10^{20}/cm^3$. In addition, a channel formation region 221 is formed in the single crystal semiconductor layer 205 (see FIG. 7B).

The second n-type impurity regions 219a and 219b are high-concentration n-type impurity regions and serve as a source and a drain. On the other hand, the third n-type impurity regions 220a and 220b are low-concentration impurity regions and serve as LDD (lightly doped drain) regions. Since the third n-type impurity regions 220a and 220b are formed in Loff regions, which are not covered with the gate electrode layer 208, off current can be reduced. Accordingly, a semiconductor device with higher reliability and lower power consumption can be manufactured.

The mask 218 is removed, and a mask 223 which covers the semiconductor layer 205 is formed. With use of the mask 223, the gate electrode layer 209, and the sidewall insulating layers 216c and 216d as masks, an impurity element 222 that imparting p-type conductivity is added to form second p-type impurity regions 224a and 224b, and third p-type impurity regions 225a and 225b.

Doping is performed so that the second p-type impurity regions 224a and 224b contain an impurity element imparting p-type conductivity at a concentration of about $1 \times 10^{2}/cm^3$ to $5 \times 10^{21}/cm^3$. In this embodiment mode, the third p-type impurity regions 225a and 225b are formed in a self-alignment manner by the sidewall insulating layers 216c and 216d so as to have a lower concentration than the second p-type impurity regions 224a and 224b. In addition, a channel formation region 226 is formed in the single crystal semiconductor layer 206 (see FIG. 7C).

The second p-type impurity regions 224a and 224b are high-concentration p-type impurity regions and serve as a source and a drain. On the other hand, the third p-type impurity regions 225a and 225b are low-concentration impurity regions and serve as LDD (lightly doped drain) regions. Since the third p-type impurity regions 225a and 225b are formed in Loff regions, which are not covered with the gate electrode layer 209, off current can be reduced. Accordingly, a semiconductor device with higher reliability and lower power consumption can be manufactured.

The mask 223 is removed, and heat treatment, irradiation with strong light, or irradiation with a laser beam may be performed in order to activate the impurity element. At the same time as the activation, plasma damage to the gate insulating layer and plasma damage to an interface between the gate insulating layer and the single crystal semiconductor layer can be repaired.

Next, an interlayer insulating layer which covers the gate electrode layers and the gate insulating layers is formed. In this embodiment mode, a stacked structure of an insulating film 227 containing hydrogen to serve as a protective film and an insulating layer 228 is employed. The insulating film 227 and the insulating layer 228 may be formed using a silicon nitride film, a silicon nitride oxide film, a silicon oxynitride film, or a silicon oxide film by a sputtering method or a plasma CVD method. Alternatively, a single layer structure or a stacked structure of three or more layers using another insulating film containing silicon may also be employed.

Furthermore, a step in which heat treatment is performed at 300° C. to 550° C. for 1 to 12 hours in a nitrogen atmosphere to hydrogenate the single crystal semiconductor layer is performed. Preferably, the temperature is 400° C. to 500° C. This step is a step for terminating a dangling bond of the semiconductor layer by hydrogen contained in the insulating film 227, which is an interlayer insulating layer. In this embodiment mode, heat treatment is performed at 410° C. for one hour.

The insulating film 227 and the insulating layer 228 can be formed of a material selected from aluminum nitride (AlN), aluminum oxynitride (AlON), aluminum nitride oxide in which the amount of nitrogen is higher than that of oxygen (AlNO), aluminum oxide, diamond-like carbon (DLC), nitrogen-containing carbon (CN), or other substances containing an inorganic insulating material. A siloxane resin may also be used. The siloxane resin is a resin including a Si—O—Si bond. Siloxane has a skeletal structure formed of a bond of silicon (Si) and oxygen (O). As a substituent, an organic group containing at least hydrogen (e.g., an alkyl group or an aryl group) is used. A fluoro group may be included in the organic group. Further, an organic insulating material such as polyimide, acrylic, polyamide, polyimide amide, resist, benzocyclobutene, or polysilazane may also be used. A coating film with a favorable planarity formed by a coating method may also be used.

The insulating film 227 and the insulating layer 228 can be formed with use of dipping, spray coating, a doctor knife, a roll coater, a curtain coater, a knife coater, a CVD method, an evaporation method, or the like. The insulating film 227 and the insulating layer 228 may also be formed by a droplet discharging method. A droplet discharging method requires less material solution. In addition, a method capable of transferring or drawing a pattern similarly to a droplet discharging method, for example, a printing method (a method of forming a pattern, such as screen printing, offset printing, or the like) can also be used.

Next, contact holes (openings) reaching the single crystal semiconductor layers are formed in the insulating film 227 and the insulating layer 228 using a resist mask. Etching may be performed once or plural times depending on selectivity of a material to be used. The insulating film 227 and the insulating layer 228 are partly removed by, the etching to form the openings reaching the second n-type impurity regions 219a and 219b and the second p-type impurity regions 224a and 224, which are source regions and drain regions. The etching may be performed by wet etching, dry etching, or both wet etching and dry etching. A hydrofluoric-acid-based solution such as a mixed solution of ammonium hydrogen fluoride and ammonium fluoride may be used as an etchant of wet etching. As an etching gas, a chlorine-based gas typified by $Cl_2$, $BCl_3$, $SiCl_4$, $CCl_4$, or the like, a fluorine-based gas typified by $CF_4$, $SF_6$, $NF_3$, or the like, or $O_2$ can be used as appropriate. Further, an inert gas may be added to an etching gas to be used. As an inert element to be added, one or a plurality of elements selected from He, Ne, Ar, Kr, or Xe can be used.

A conductive film is formed so as to cover the openings, and the conductive film is etched to form wiring layers 229a, 229b, 230a, and 230b which serve as source and drain electrode layers which are electrically connected to parts of source regions and drain regions. The wiring layers can be formed by formation of a conductive film by a PVD method, a CVD method, an evaporation method, or the like, and then, etching the conductive film into a desired shape. Further, a conductive film can be selectively formed in a predetermined position by a droplet discharging method, a printing method, an electroplating method, or the like. Moreover, a reflow method or a damascene method may also be used. As a material for the wiring layers, metal such as Ag, Au, Cu, Ni, Pt, Pd, Ir, Rh, W, Al, Ta, Mo, Cd, Zn, Fe, Ti, Zr, or Ba; Si or Ge; or an alloy or nitride thereof can be used. A stacked structure of these materials may also be employed.

Figure 7D:
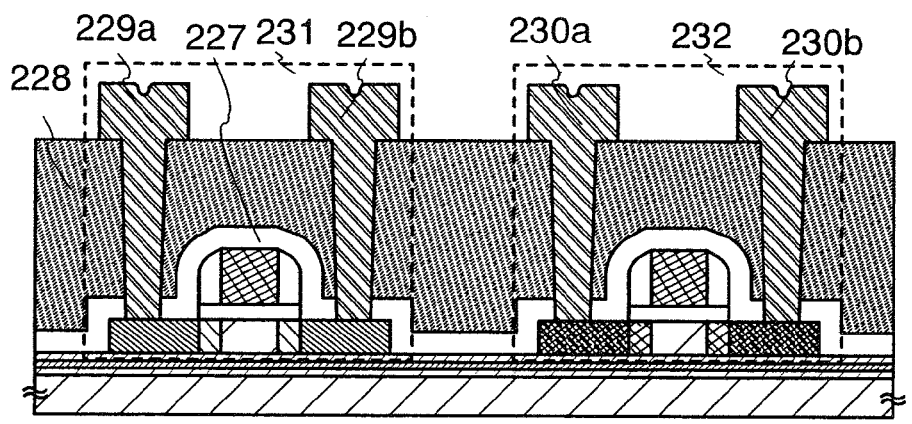

Through the above-described steps, a semiconductor device having a CMOS structure which includes a thin film transistor 231, which is an n-channel thin film transistor, and a thin film transistor 232, which is a p-channel thin film transistor, can be formed (see FIG. 7D). Although not shown in the drawings, a CMOS structure is described in this embodiment mode; thus, the thin film transistor 231 and the thin film transistor 232 are electrically connected to each other.

A structure of the thin film transistor is not limited to that described in this embodiment mode, and a single gate structure in which one channel formation region is formed, a double gate structure in which two channel formation regions are formed, or a triple gate structure in which three channel formation regions are formed may be employed.

As described above, a semiconductor device which has high performance and high reliability can be formed with high yield with use of an SOI substrate which has a single crystal semiconductor layer with reduced crystal defects and high planarity.

In this manner, thin film transistors can be manufactured using an SOI substrate. The single crystal semiconductor layer of the SOI substrate has almost no crystal defects and is a single crystal semiconductor layer with reduced interface state density with the gate insulating layer 207. The semiconductor layer has a planarized surface and is thinned to a thickness of less than or equal to 50 nm. Accordingly, thin film transistors with excellent characteristics such as low driving voltage, high electron field effect mobility, and a low subthreshold value can be formed over the supporting substrate 107. Furthermore, plural transistors with high performance and no characteristic variation between the transistors can be formed over the same substrate. In other words, with use of the SOI substrate of the present invention, nonuniformity of the important characteristic value as transistor characteristics, such as threshold voltage or mobility, can be reduced and high performance such as high field effect mobility can be obtained.

Thus, a semiconductor device with high added value can be manufactured by formation of various semiconductor elements such as TFTs using the SOI substrate of the present invention.

[Embodiment Mode 3]

In this embodiment mode, a semiconductor device using an SOI substrate of the present invention and a manufacturing method thereof will be described. In this embodiment mode, a transistor will be described as an example of a semiconductor device using the SOI substrate of the present invention. When a plurality of transistors are combined, various semiconductor devices are manufactured. Hereinafter, a manufacturing method of a transistor will be described with reference to the cross-sectional views of FIGS. 27A to 27E, FIGS. 28A to 28C, and FIGS. 29A and 29B. Note that a method in which n-channel transistor and a p-channel transistor are manufactured at the same time will be described in this embodiment mode.

Figure 27A:
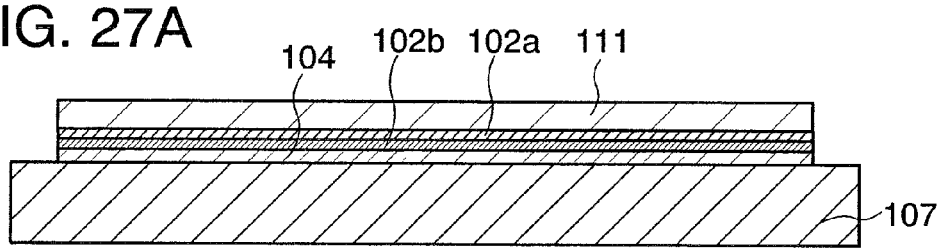
FIGS. 27A to 27E are views illustrating a manufacturing method of a semiconductor device of Embodiment Mode 3.

First, an SOI substrate is prepared as shown in FIG. 27A. In this embodiment mode, an SOI substrate is used in which a single crystal semiconductor layer 111 is fixed to a supporting substrate 107 having an insulating surface with an insulating layer 104, an insulating layer 102b, and an insulating layer 102a interposed therebetween. Note that a structure of an SOI substrate used for manufacturing a transistor is not limited to the structure shown in FIG. 27A, and the SOI substrate of the present invention can be used.

Note that it is preferable to add p-type impurity element such as boron, aluminum, or gallium, or an n-type impurity element such as phosphorus or arsenic to the single crystal semiconductor layer 111, in accordance with regions where an n-channel field effect transistor and a p-channel field effect transistor are formed. In other words, a p-type impurity element is added to the region where the n-channel field effect transistor is formed, and an n-type impurity element is added to the region where the p-channel field effect transistor is formed, so that so-called well regions are formed. The dose of impurity ions may be approximately greater than or equal to $1\times10^{12}$ ions/cm$^2$ and less than or equal to $1\times10^{14}$ ions/cm$^2$. Furthermore, in the case of controlling threshold voltage of a field effect transistor, a p-type impurity element or an n-type impurity element may be added to these well regions.

Figure 27B:
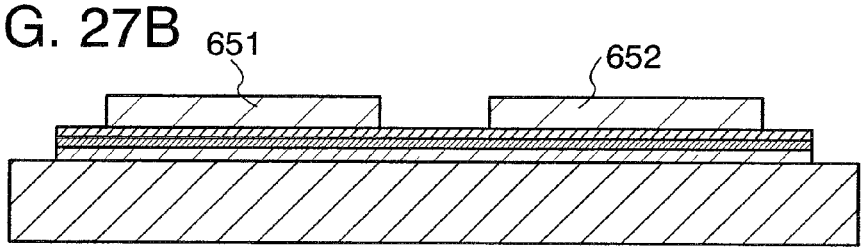

Next, as shown in FIG. 27B, the single crystal semiconductor layer 111 is etched to form a single crystal semiconductor layer 651 and a single crystal semiconductor layer 652 which are separated into island shapes in accordance with the arrangement of semiconductor elements. In this embodiment mode, the n-channel transistor is manufactured using the single crystal semiconductor layer 651 and the p-channel transistor is manufactured using the single crystal semiconductor layer 652.

Figure 27C:
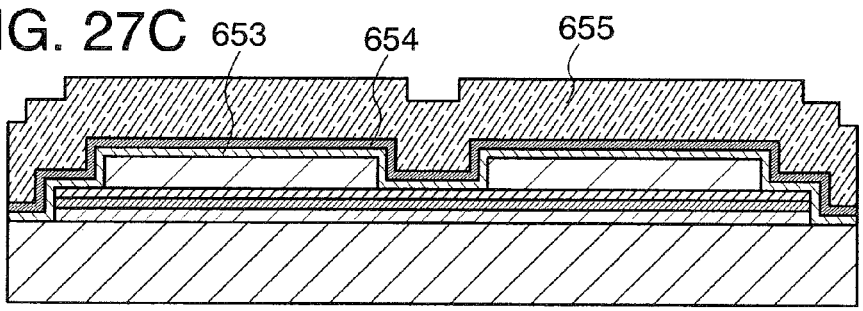

Next, as shown in FIG. 27C, a gate insulating layer 653, and a conductive layer 654 and a conductive layer 655 for forming a gate electrode are formed in this order over the single crystal semiconductor layer 651 and the single crystal semiconductor layer 652.

The gate insulating layer 653 is formed as a single layer or a stacked layer using an insulating layer such as a silicon oxide layer, a silicon oxynitride layer, a silicon nitride layer, or a silicon nitride oxide layer by a CVD method, a sputtering method, an ALE method, or the like.

The gate insulating layer 653 can be formed in such a manner that plasma treatment is performed on the single crystal semiconductor layer 651 and the single crystal semiconductor layer 652 to oxidize or nitride surfaces of the single crystal semiconductor layer 651 and the single crystal semiconductor layer 652. Plasma treatment in this case also includes that with plasma excited using microwaves (a typical frequency is 2.45 GHz). For example, treatment with plasma which is excited by microwaves and has an electron density of greater than or equal to $1\times10^{11}$/cm$^3$ and less than or equal to $1\times10^{13}$/cm$^3$ and an electron temperature of greater than or equal to 0.5 eV and less than or equal to 1.5 eV is also included. Oxidation treatment or nitridation treatment of the surfaces of the semiconductor layers with such plasma treatment makes it possible to form a thin and dense film. Moreover, since the surface of the semiconductor layer is directly oxidized, a film having good interface characteristics can be obtained. Alternatively, the gate insulating layer 653 may be formed in such a manner that plasma treatment using microwaves is performed on a film formed by a CVD method, a sputtering method, or an ALE method.

Since the gate insulating layer 653 forms the interface with the semiconductor layers, the gate insulating layer 653 is preferably formed so that a silicon oxide layer or a silicon oxynitride layer is located at the interface. This is because, if a film in which the amount of nitrogen is higher than that of oxygen, such as a silicon nitride layer or a silicon nitride oxide layer, is formed, problems of interface characteristics such as generation of trap levels might be caused.

The conductive layer for forming the gate electrode is formed as a single layer or a stacked layer using an element selected from tantalum, tantalum nitride, tungsten, titanium, molybdenum, aluminum, copper, chromium, or niobium, an alloy material or a compound material containing the element as its main component, or a semiconductor material typified by polycrystalline silicon doped with an impurity element such as phosphorus, by a CVD method or a sputtering method. In the case where the conductive layer is formed as a stacked layer, it can be formed using different conductive materials or can be formed using the same conductive material. In this embodiment mode, an example is described in which the conductive layer for forming the gate electrode is formed as a two-layer structure of the conductive layer 654 and the conductive layer 655.

In the case where the conductive layer for forming the gate electrode is formed as a two-layer structure of the conductive layer 654 and the conductive layer 655, for example, a stacked layer of a tantalum nitride layer and a tungsten layer; a tungsten nitride layer and a tungsten layer; or a molybdenum nitride layer and a molybdenum layer can be formed. Note that a stacked layer of a tantalum nitride layer and a tungsten layer is preferable because etching selectivity of both layers can be easily obtained. Note that, as for the stacked layer described as an example, the first mentioned layer is preferably formed over the gate insulating layer 653. In this embodiment mode, the conductive layer 654 is formed to a thickness of 20 nm to 100 nm. The conductive layer 655 is formed to a thickness of 100 nm to 400 nm. The gate electrode can also have a stacked structure of three or more layers, and in that case, a stacked structure of a molybdenum layer, an aluminum layer, and a molybdenum layer is preferably employed.

Next, a resist mask 656 and a resist mask 657 are selectively formed over the conductive layer 655. Then, first etching treatment and second etching treatment are performed using the resist mask 656 and the resist mask 657.

Figure 27D:
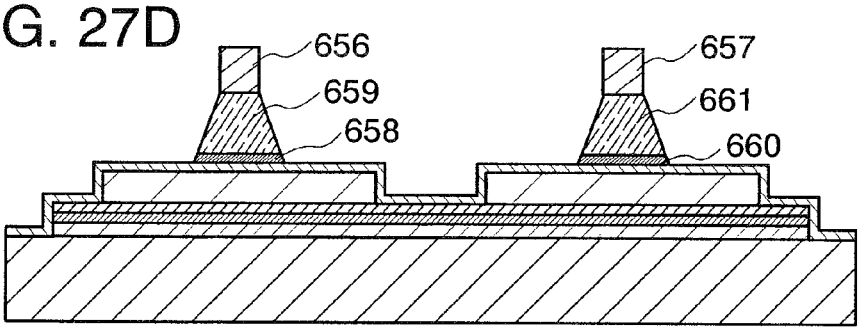

First, the conductive layer 654 and the conductive layer 655 are selectively etched by the first etching treatment using the resist mask 656 and the resist mask 657 to form a conductive layer 658 and a conductive layer 659 over the single crystal semiconductor layer 651 and to form a conductive layer 660 and a conductive layer 661 over the single crystal semiconductor layer 652 (see FIG. 27D).

Figure 27E:
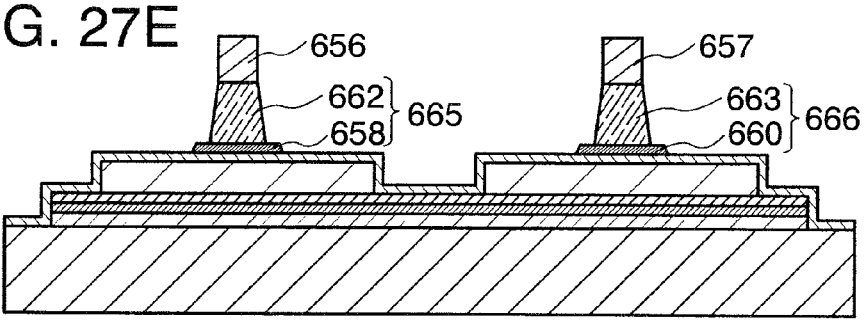
Figure 28A:
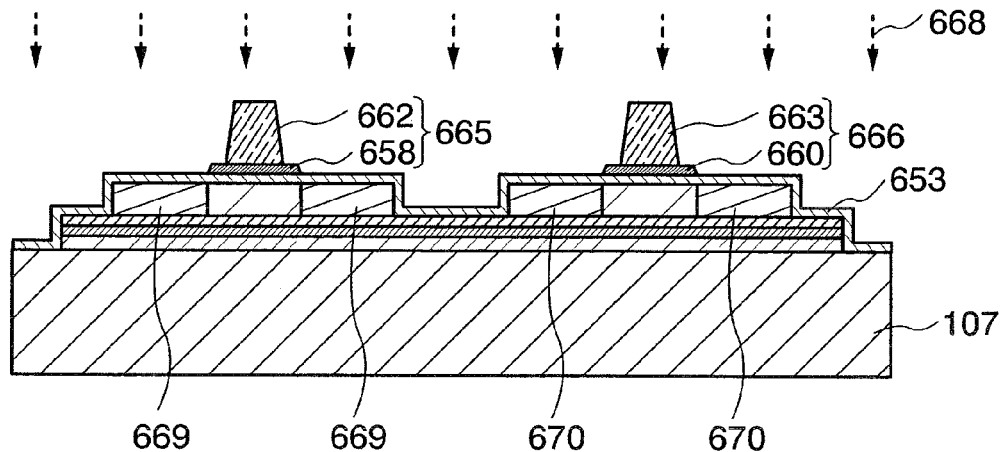
FIGS. 28A to 28C are views illustrating a manufacturing method of a semiconductor device of Embodiment Mode 3.
Figure 28B:
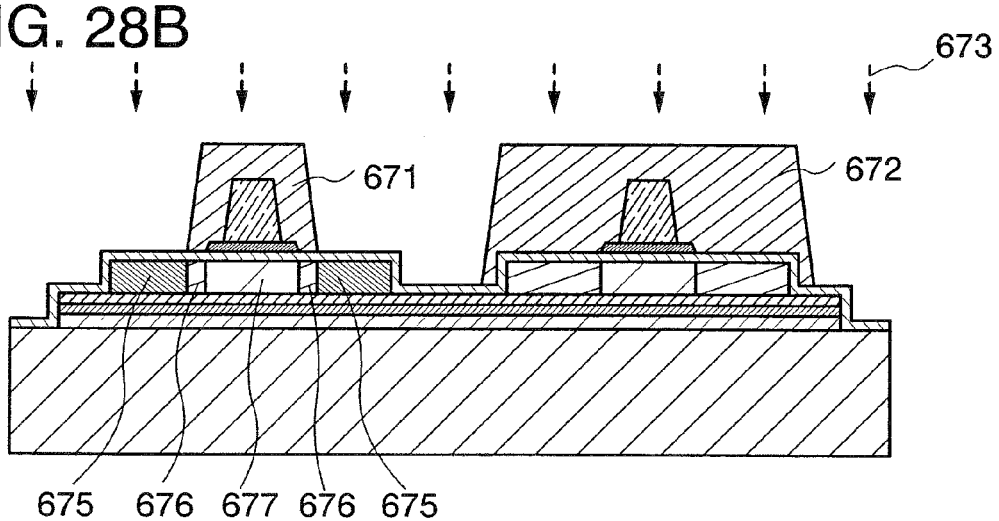
Figure 28C:
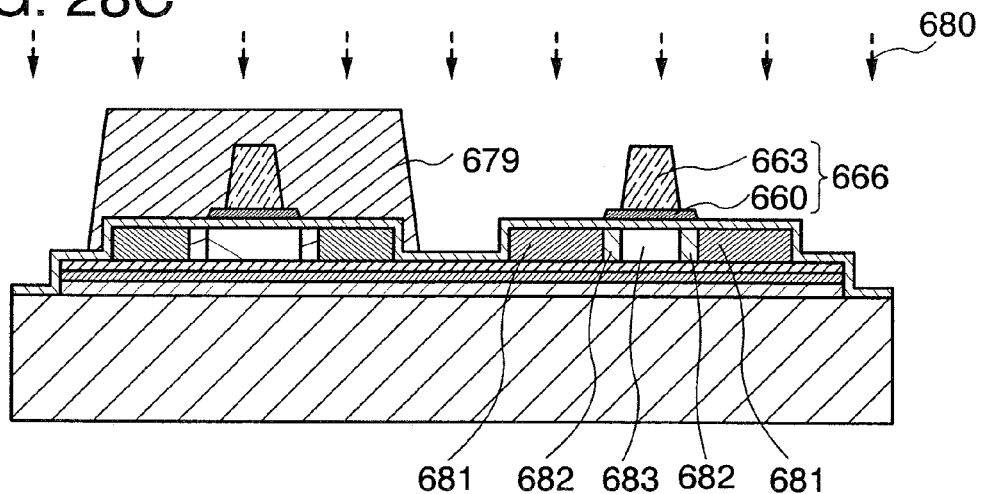

Next, edges of the conductive layer 659 and the conductive layer 661 are etched by the second etching treatment using the resist mask 656 and the resist mask 657 to form a conductive layer 662 and a conductive layer 663 (see FIG. 27E). The conductive layer 662 and the conductive layer 663 are formed so as to have smaller widths (lengths parallel to a direction in which carriers flow through channel formation regions (a direction in which a source region and a drain region are connected)) than those of the conductive layer 658 and the conductive layer 660, respectively. As described above, a gate electrode 665 having a two-layer structure of the conductive layers 658 and 662 and a gate electrode 666 having a two-layer structure of the conductive layers 660 and 663 are formed.

Although an etching method employed for the first etching treatment and the second etching treatment may be selected as appropriate, a dry etching apparatus using a high-density plasma source such as ECR (electron cyclotron resonance) or ICP (inductive coupled plasma) may be used in order to increase the etching rate. With appropriate control of the etching conditions of the first etching treatment and the second etching treatment, side surfaces of the conductive layers 658 and 660 and the conductive layers 662 and 663 can each have a desired tapered shape. The resist masks 656 and 657 may be removed after the desired gate electrodes 665 and 666 are formed.

Next, an impurity element 668 is added to the single crystal semiconductor layers 651 and 652 with use of the gate electrodes 665 and 666 as masks, respectively. A pair of impurity regions 669 is formed in the single crystal semiconductor layer 651 in a self-alignment manner with use of the conductive layers 658 and 662 as masks. A pair of impurity regions 670 is formed in the single crystal semiconductor layer 652 in a self-alignment manner with use of the conductive layers 660 and 663 as masks (see FIG. 28A).

As the impurity element 668, a p-type impurity element such as boron, aluminum, or gallium, or an n-type impurity element such as phosphorus or arsenic is added. Since a high-resistance region of the n-channel transistor is formed in this embodiment mode, phosphorus which is an n-type impurity element is added as the impurity element 668. Phosphorus is added to the impurity regions 669 so as to be contained at a concentration of about $1 \times 10^{17}$ atoms/cm$^3$ to $5 \times 10^{18}$ atoms/cm$^3$.

Next, in order to form impurity regions serving as a source region and a drain region of the n-channel transistor, a resist mask 671 is formed so as to partially cover the single crystal semiconductor layer 651, and a resist mask 672 is selectively formed so as to cover the single crystal semiconductor layer 652. Then, an impurity element 673 is added to the single crystal semiconductor layer 651 with use of the resist mask 671 as a mask to form a pair of impurity regions 675 in the single crystal semiconductor layer 651 (see FIG. 28B).

As the impurity element 673, phosphorus which is an n-type impurity element is added to the single crystal semiconductor layer 651 at a concentration of $5 \times 10^{19}$ atoms/cm$^3$ to $5 \times 10^{20}$ atoms/cm$^3$ inclusive. The impurity regions 675 serve as a source region and a drain region. The impurity regions 675 are formed in regions which do not overlap with the conductive layers 658 and 662.

In the single crystal semiconductor layer 651, impurity regions 676 are the impurity regions 669 to which the impurity element 673 is not added. The impurity regions 676 have a lower impurity concentration than the impurity regions 675 and serve as high-resistance regions or LDD regions. In the single crystal semiconductor layer 651, a channel formation region 677 is formed in a region which overlaps with the conductive layers 658 and 662.

Note that an LDD region refers to a region to which an impurity element is added at a low concentration and which is formed between a channel formation region and a source or drain region that is formed by addition of the impurity element at a high concentration. When an LDD region is provided, there is an advantageous effect in that an electric field in the vicinity of a drain region is reduced to prevent deterioration due to hot carrier injection. Further, a structure in which an LDD region overlaps with a gate electrode with a gate insulating layer interposed therebetween (also referred to as a "gate-drain overlapped LDD (GOLD) structure") may also be employed in order to prevent deterioration of an on-current value due to hot carriers.

Next, the resist masks 671 and 672 are removed, and then a resist mask 679 is formed so as to cover the single crystal semiconductor layer 651 in order to form a source region and a drain region of the p-channel transistor. Then, an impurity element 680 is added to the single crystal semiconductor layer 652 with use of the resist mask 679 and the conductive layers 660 and 663 as masks to form a pair of impurity regions 681, a pair of impurity regions 682, and a channel formation region 683 in the single crystal semiconductor layer 652 (see FIG. 28C).

For the impurity element 680, a p-type impurity element such as boron, aluminum, or gallium is used. In this embodiment mode, boron which is a p-type impurity element is added so as to be contained at a concentration of about $1 \times 10^{20}$ atoms/cm$^3$ to $5 \times 10^{21}$ atoms/cm$^3$.

In the single crystal semiconductor layer 652, the impurity regions 681 are formed in regions which do not overlap with the conductive layers 660 and 663 and serve as a source region and a drain region. Boron which is a p-type impurity element is added so as to be contained in the impurity regions 681 at a concentration of about $1 \times 10^{20}$ atoms/cm$^3$ to $5 \times 10^{21}$ atoms/cm$^3$.

The impurity regions 682 are formed in regions which overlap with the conductive layer 660 and do not overlap with the conductive layer 663, and are formed in such a manner that the impurity element 680 penetrate the conductive layer 660 to be added to the impurity regions 670. Since the impurity regions 670 have n-type conductivity, the impurity element 680 is added so that the impurity regions 682 have p-type conductivity. With adjustment of the concentration of the impurity element 680 contained in the impurity regions 682, the impurity regions 682 can serve as a source region and a drain region. Alternatively, the impurity regions 682 can serve as LDD regions.

In the single crystal semiconductor layer 652, the channel formation region 683 is formed in a region which overlaps with the conductive layers 660 and 663.

Next, an interlayer insulating layer is formed. The interlayer insulating layer can be formed as a single-layer structure or a stacked-layer structure. In this embodiment mode, the interlayer insulating layer is formed as a two-layer structure of an insulating layer 684 and an insulating layer 685 (see FIG. 29A).

As the interlayer insulating layer, a silicon oxide layer, a silicon oxynitride layer, a silicon nitride layer, a silicon nitride oxide layer, or the like can be formed by a CVD method or a sputtering method. Alternatively, the interlayer insulating film can be formed by an application method such as a spin coating method, using an organic material such as polyimide, polyamide, polyvinylphenol, benzocyclobutene, acrylic, or epoxy, a siloxane material such as a siloxane resin, an oxazole resin, or the like. Note that a siloxane material is a material including a Si—O—Si bond. Siloxane is composed of a skeleton structure formed by the bond of silicon (Si) and oxygen (O). As a substituent, an organic group containing at least hydrogen (e.g., an alkyl group or aromatic hydrocarbon) is used. A fluoro group may be included in the organic group.

For example, a silicon nitride oxide layer is formed to a thickness of 100 nm as the insulating layer 684, and a silicon oxynitride layer is formed to a thickness of 900 nm as the insulating layer 685. The insulating layer 684 and the insulating layer 685 are successively formed by a plasma CVD method. The interlayer insulating layer may also have a stacked-layer structure including three or more layers. Alternatively, a stacked-layer structure of a silicon oxide layer, a silicon oxynitride layer, or a silicon nitride layer and an insulating layer formed using an organic material such as polyimide, polyamide, polyvinyl phenol, benzocyclobutene, acrylic, or epoxy; a siloxane material such as a siloxane resin; or an oxazole resin can be employed.

Figure 29A:
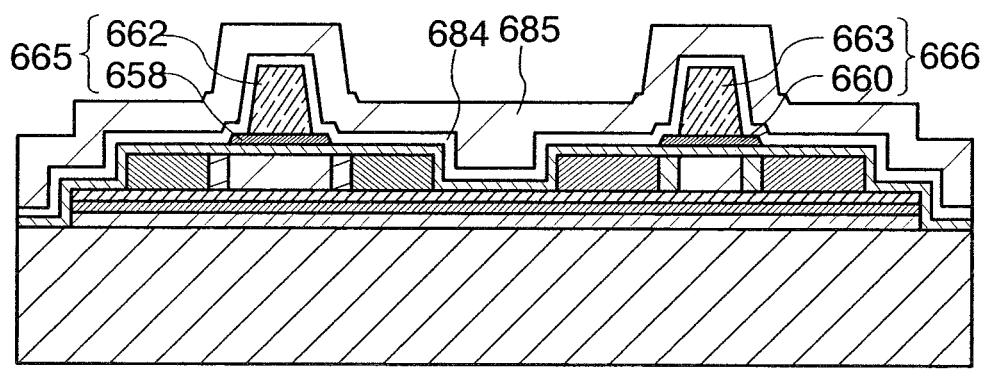
FIGS. 29A and 29B are views illustrating a manufacturing method of a semiconductor device of Embodiment Mode 3.
Figure 29B:
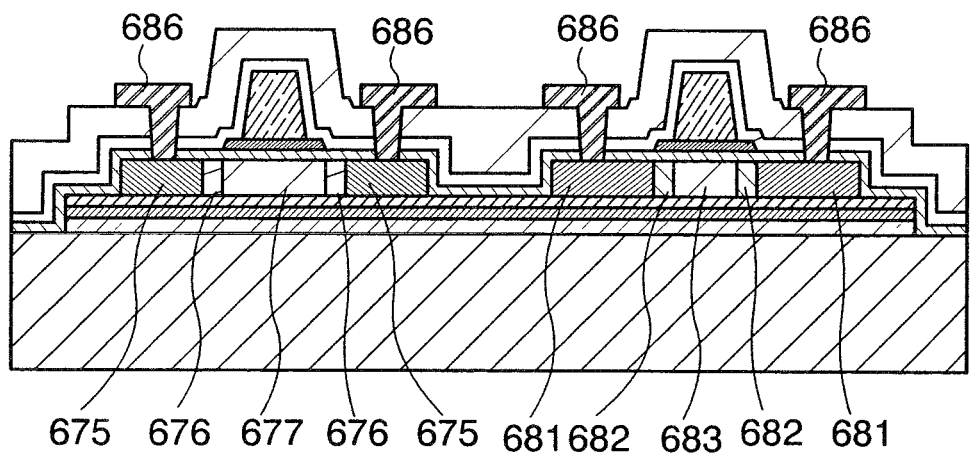

Next, contact holes are formed in the interlayer insulating layer (the insulating layers 684 and 685 in this embodiment mode), and conductive layers 686 functioning as a source electrode and a drain electrode are formed in the contact holes (see FIG. 29B).

The contact holes as selectively formed in the insulating layers 684 and 685 so as to reach the impurity regions 675 formed in the single crystal semiconductor layer 651 and the impurity regions 681 formed in the single crystal semiconductor layer 652.

For the conductive layers 686, a single layer or a stacked layer formed of one element selected from aluminum, tungsten, titanium, tantalum, molybdenum, nickel, or neodymium, or an alloy containing a plurality of above elements can be used. For example, for a conductive layer formed using an alloy containing a plurality of the above elements, an aluminum alloy containing titanium, an aluminum alloy containing neodymium, or the like can be formed. In the case where the conductive layers 686 are a stacked layer, a structure can be employed in which an aluminum layer or an aluminum alloy layer described above is sandwiched between titanium layers, for example.

As shown in FIG. 29B, the n-channel transistor and the p-channel transistor can be manufactured with use of the SOI substrate.

This embodiment mode can be freely combined with any of other embodiment modes.

[Embodiment Mode 4]

In this embodiment mode, an example of a semiconductor device having high performance and high reliability will be described. Specifically, as examples of the semiconductor device, examples of a microprocessor and a semiconductor device which has an arithmetic function and can transmit and receive data without contact will be described.

Figure 8:
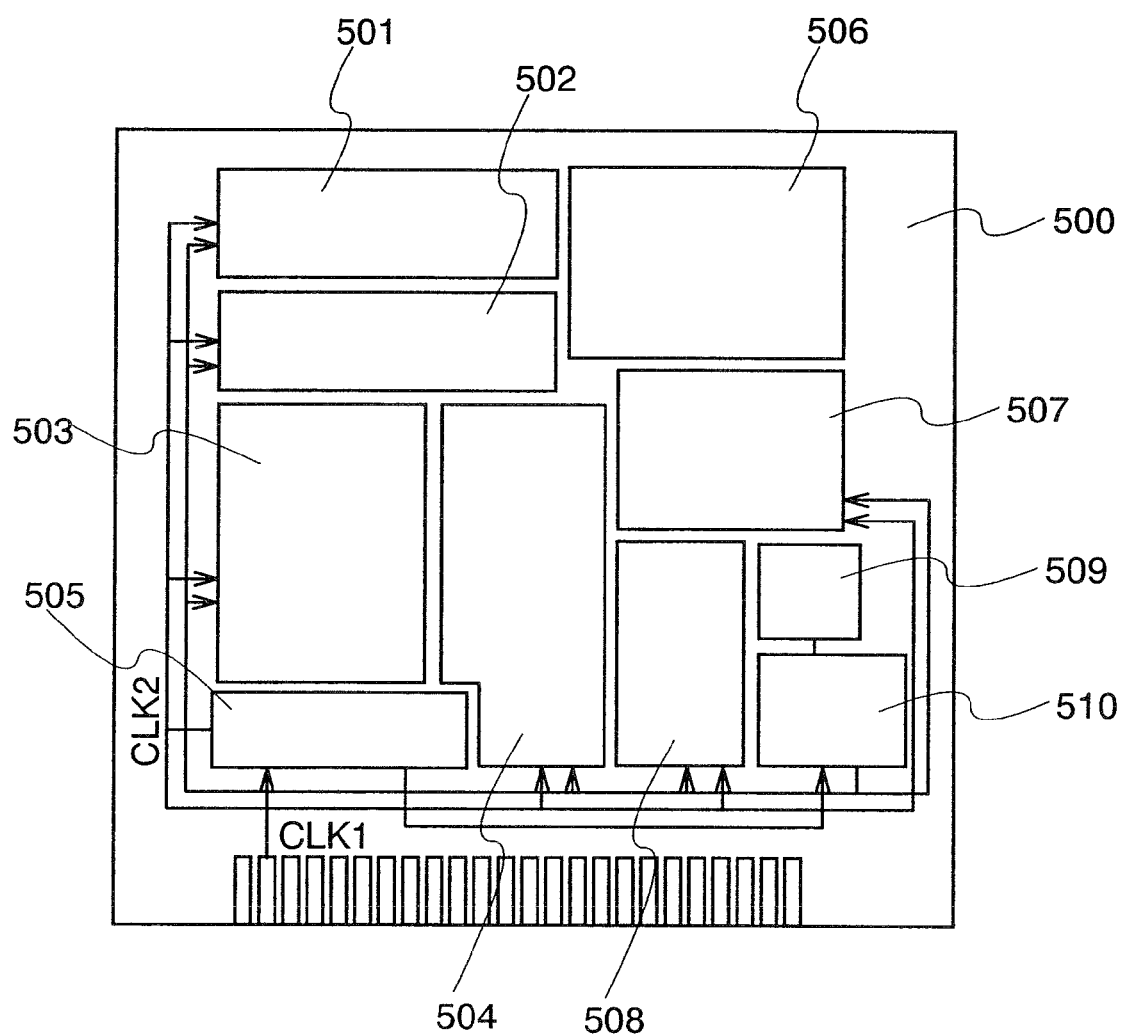
FIG. 8 is a block diagram showing a configuration of a microprocessor manufactured using an SOI substrate.

First, as an example of the semiconductor device, a microprocessor will be described. FIG. 8 is a block diagram illustrating a structural example of a microprocessor 500.

The microprocessor 500 includes an arithmetic logic unit (also referred to as an ALU) 501, an ALU controller 502, an instruction decoder 503, an interrupt controller 504, a timing controller 505, a register 506, a register controller 507, a bus interface (Bus I/F) 508, a read-only memory 509, and a ROM interface (ROM I/F) 510.

An instruction input to the microprocessor 500 through the bus interface 508 is input to the instruction decoder 503, decoded therein, and then input to the ALU controller 502, the interrupt controller 504, the register controller 507, and the timing controller 505. The ALU controller 502, the interrupt controller 504, the register controller 507, and the timing controller 505 conduct various controls based on the decoded instruction.

Specifically, the ALU controller 502 generates signals for controlling operation of the ALU 501. While the microprocessor 500 is executing a program, the interrupt controller 504 processes an interrupt request from an external input/output device or a peripheral circuit based on its priority or a mask state. The register controller 507 generates an address of the register 506, and reads and writes data from and to the register 506 in accordance with the state of the microprocessor 500. The timing controller 505 generates signals for controlling timing of operation of the ALU 501, the ALU controller 502, the instruction decoder 503, the interrupt controller 504, and the register controller 507.

For example, the timing controller 505 is provided with an internal clock generator for generating an internal clock signal CLK2 based on a reference clock signal CLK1, and supplies the clock signal CLK2 to the various above-mentioned circuits. Note that the microprocessor 500 shown in FIG. 8 is only an example in which the configuration is simplified, and an actual microprocessor may have various configurations depending on the uses.

The microprocessor 500 can achieve not only an increase in processing speed but also a reduction in power consumption because an integrated circuit is formed using a single crystal semiconductor layer (an SOI layer) with uniform crystal orientation which is bonded over a substrate having an insulating surface or an insulating substrate.

Figure 9:
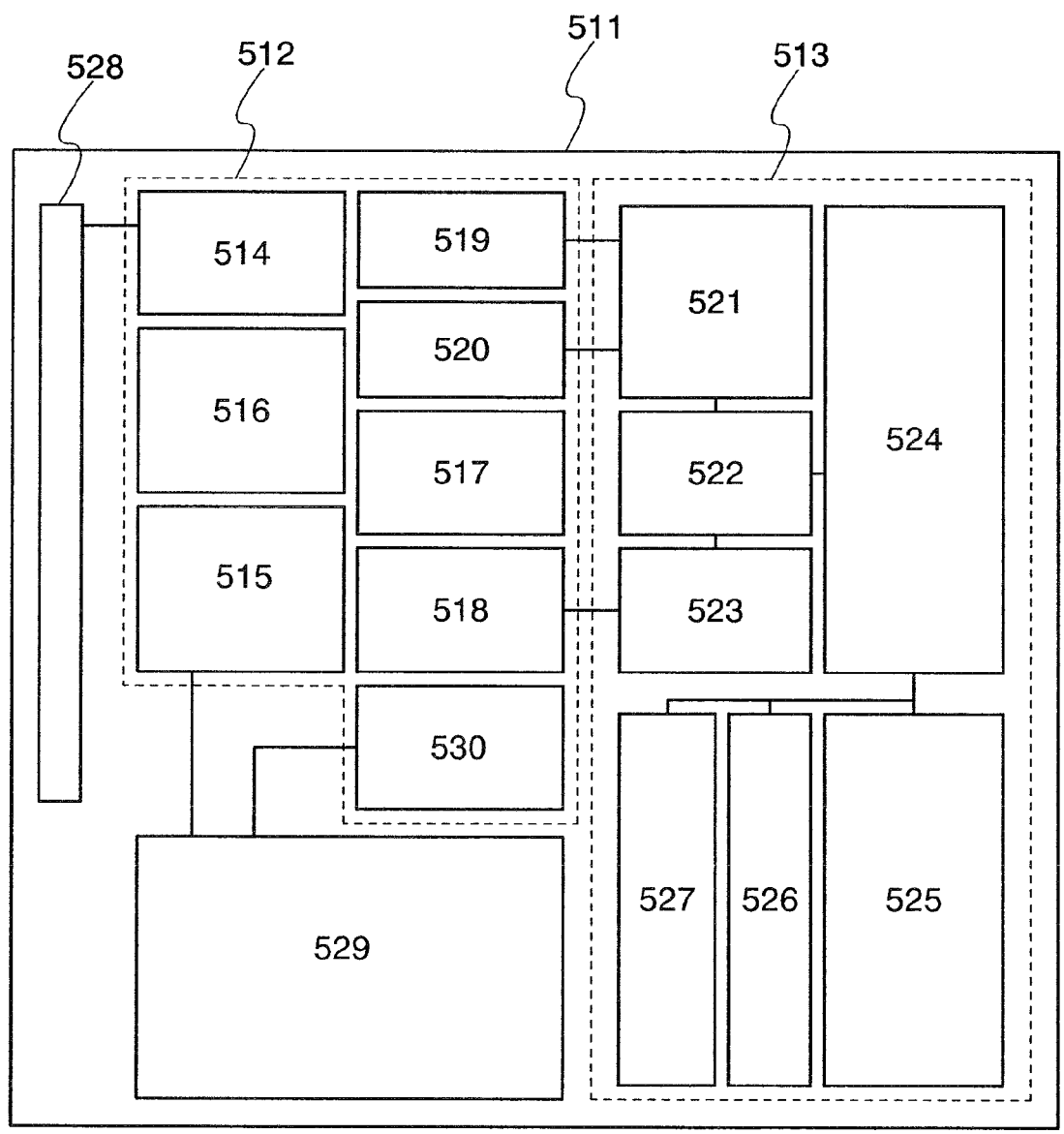
FIG. 9 is a block diagram illustrating a configuration of an RFCPU manufactured using an SOI substrate.

Next, an example of a semiconductor device having a function of transmitting and receiving data without contact and also having an arithmetic function is described. FIG. 9 is a block diagram illustrating a structural example of a semiconductor device. The semiconductor device shown in FIG. 9 can be regarded as a computer (hereinafter also referred to as an "RFCPU") which operates to transmit and receive signals to and from an external device by wireless communication.

As shown in FIG. 9, an RFCPU 511 includes an analog circuit portion 512 and a digital circuit portion 513. The RFCPU 511 includes, as the analog circuit portion 512, a resonance circuit 514 with a resonance capacitor, a rectifier circuit 515, a constant voltage circuit 516, a reset circuit 517, an oscillator circuit 518, a demodulator circuit 519, and a modulator circuit 520. The digital circuit portion 513 includes an RF interface 521, a control register 522, a clock controller 523, an interface 524, a central processing unit 525, a random access memory 526, and a read only memory 527.

The operation of the RFCPU 511 is as follows. The resonance circuit 514 generates an induced electromotive force based on a signal received by an antenna 528. The induced electromotive force is stored in a capacitor portion 529 through the rectifier circuit 515. This capacitor portion 529 is preferably formed using a capacitor such as a ceramic capacitor or an electric double layer capacitor. The capacitor portion 529 is not necessarily formed over the same substrate as the RFCPU 511 and can be attached as another component to a substrate having an insulating surface which partially constitutes the RFCPU 511.

The reset circuit 517 generates a signal for resetting and initializing the digital circuit portion 513. For example, the reset circuit 517 generates, as a reset signal, a signal that rises with delay after increase in the power supply voltage. The oscillator circuit 518 changes the frequency and duty ratio of a clock signal in response to a control signal generated by the constant voltage circuit 516. The demodulator circuit 519 is a circuit which demodulates a received signal, and the modulator circuit 520 is a circuit which modulates data that is to be transmitted.

For example, the demodulator circuit 519 is formed using a low-pass filter and binarizes a received signal of an amplitude shift keying (ASK) system based on the fluctuation of the received signal. The modulation circuit 520 transmits transmission data by changing the amplitude of a transmission signal of an amplitude shift keying (ASK) system. The modulation circuit 520 changes the resonance point of the resonance circuit 514, thereby changing the amplitude of a communication signal.

The clock controller 523 generates a control signal for changing the frequency and duty ratio of a clock signal in accordance with the power supply voltage or a consumption current of the central processing unit 525. The power supply voltage is managed by the power management circuit 530.

A signal input from the antenna 528 to the RFCPU 511 is demodulated by the demodulator circuit 519 and then decomposed into a control command, data, and the like by the RF interface 521. The control command is stored in the control register 522. The control command includes reading of data stored in the read only memory 527, writing of data to the random access memory 526, an arithmetic instruction to the central processing unit 525, and the like.

The central processing unit 525 accesses the read only memory 527, the random access memory 526, and the control register 522 via the interface 524. The interface 524 has a function of generating an access signal for any of the read only memory 527, the random access memory 526, and the control register 522 based on an address which is requested by the central processing unit 525.

As an arithmetic method of the central processing unit 525, a method may be employed in which the read only memory 527 stores an operating system (OS) and a program is read and executed at the time of starting operation. Alternatively, a method may be employed in which a circuit dedicated to arithmetic is formed as an arithmetic circuit and arithmetic processing is conducted using hardware. In a method in which both hardware and software are used, part of processing can be conducted by a circuit dedicated to arithmetic, and the other part of the arithmetic processing can be conducted by the central processing unit 525 using a program.

The RFCPU 511 described above can achieve not only an increase in processing speed but also a reduction in power consumption because an integrated circuit is formed using a semiconductor layer with uniform crystal orientation which is bonded over a substrate having an insulating surface or an insulating substrate. Accordingly, even when the capacitor portion 529 which supplies electric power is miniaturized, long-term operation is ensured.

[Embodiment Mode 5]

In this embodiment mode, a display device as an example of a semiconductor device having high performance and high reliability will be described with reference to FIG. 10, FIGS. 1A and 11B, FIGS. 12A and 12B, and FIGS. 13A to 13C.

Figure 10:
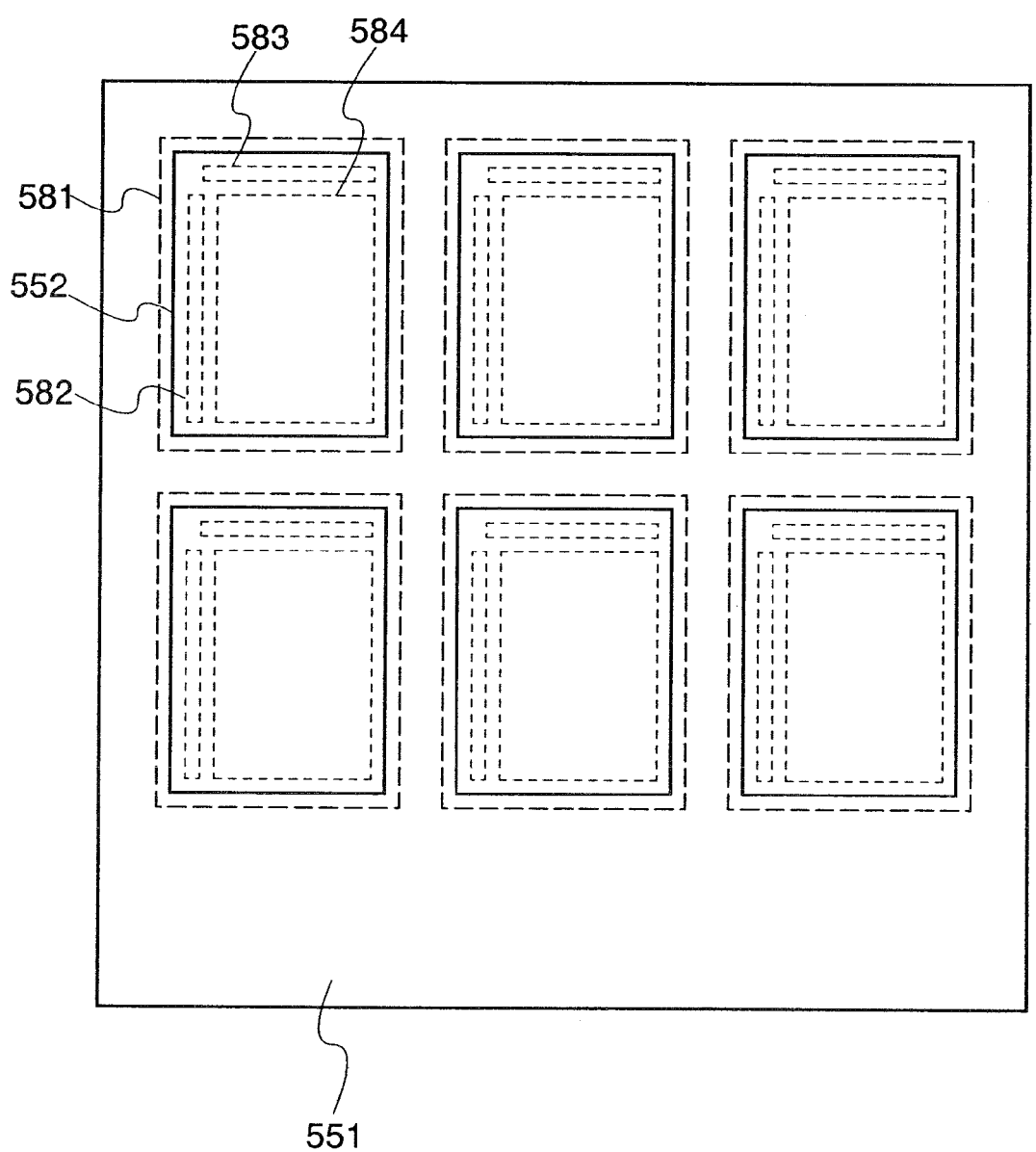
FIG. 10 is a front view of an SOI substrate in which mother glass is used for a supporting substrate.

A large-sized glass substrate called mother glass over which a display panel is manufactured can be used as a supporting substrate of an SOI substrate. FIG. 10 is a front view of an SOI substrate in which mother glass is used for a supporting substrate 107.

Single crystal semiconductor layers 552 which are separated from a plurality of single crystal semiconductor substrates are bonded to one mother glass 551. In order to divide the mother glass 551 to produce a plurality of display panels, the single crystal semiconductor layers 552 are preferably bonded to the inside of formation regions 581 of the display panels. Each of the display panels includes a scanning line driver circuit, a signal line driver circuit, and a pixel portion. Therefore, the single crystal semiconductor layers 552 are bonded to the regions where the above-described driver circuits and pixel portion are formed (a scanning line driver circuit formation region 582, a signal line driver circuit formation region 583, and a pixel formation region 584) in the formation regions 581 of the display panels.

Figure 11A:
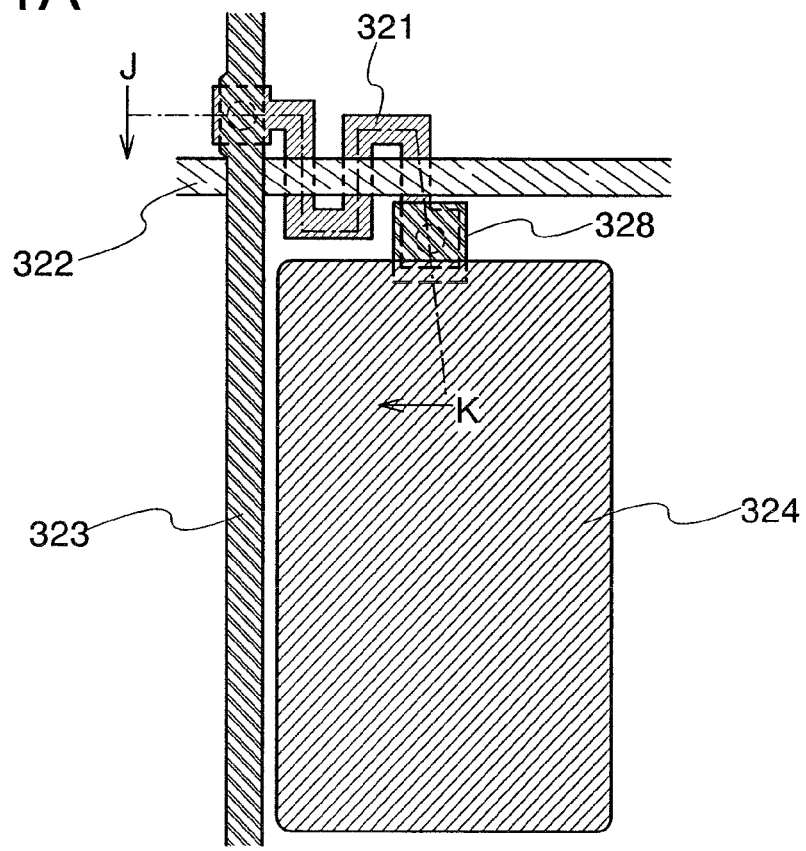
FIG. 11A is a plane view of a pixel of a liquid crystal display device and FIG. 11B is a cross-sectional view taken along the section line J-K in FIG. 11A.
Figure 11B:
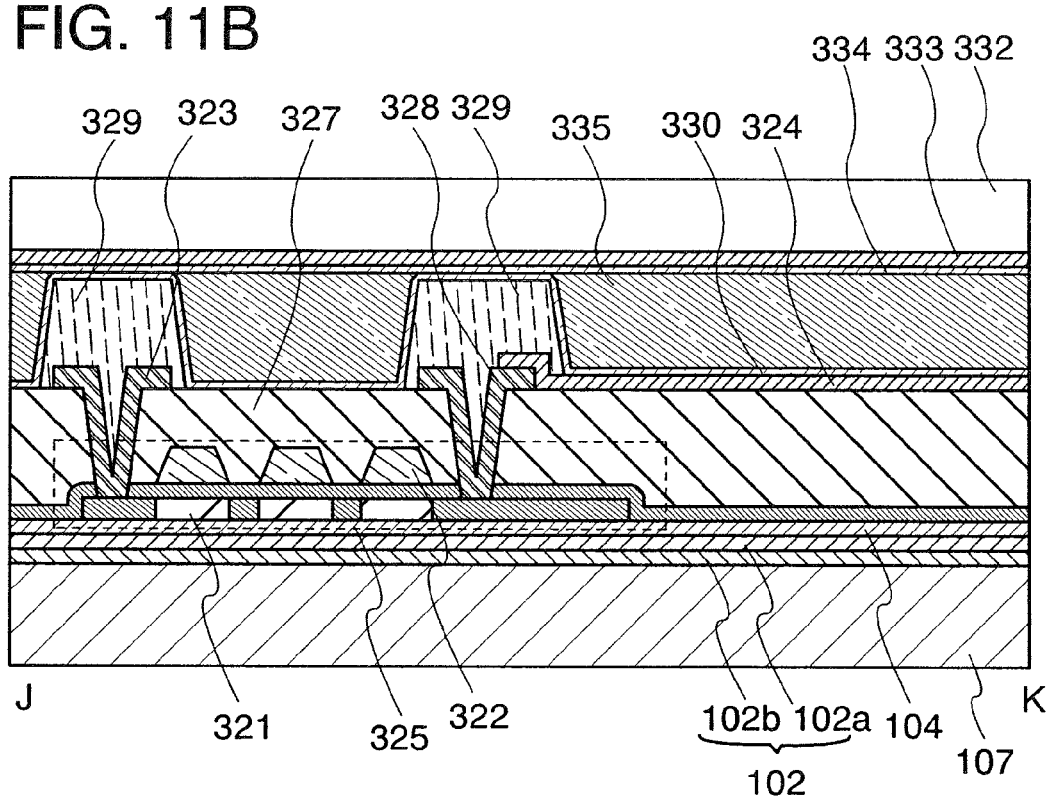

FIGS. 11A and 11B are views for showing a liquid crystal display device manufactured using the SOI substrate shown in FIG. 10. FIG. 11A is a plane view of a pixel of the liquid crystal display device and FIG. 11B is a cross-sectional view taken along the section line J-K in FIG. 11A.

In FIG. 11A, a single crystal semiconductor layer 321 is a layer formed of the single crystal semiconductor layer 552 which is attached to the mother glass 551 and included in a TFT of the pixel. Here, the SOI substrate manufactured by the method of Embodiment Mode 1 is used as the SOI substrate. As shown in FIG. 11B, over a supporting substrate 107, a substrate in which an insulating layer 102, an insulating layer 104, and a single crystal semiconductor layer are stacked is used. Note that the insulating layer 102 may be formed by a silicon nitride oxide layer 102a and a silicon oxynitride layer 102b, as in Embodiment Mode 1. The supporting substrate 107 is the divided mother glass 551. As shown in FIG. 11A, the pixel includes the single crystal semiconductor layer 321, a scanning line 322 which intersects with the single crystal semiconductor layer 321, a signal line 323 which intersects with the scanning line 322, a pixel electrode 324, and an electrode 328 which electrically connects the pixel electrode 324 and the single crystal semiconductor layer 321 to each other.

As shown in FIG. 11B, a TFT 325 of the pixel is formed over the insulating layers. A gate electrode of the TFT 325 is included in the scanning line 322, and a source electrode or a drain electrode of the TFT 325 is included in the signal line 323. The signal line 323, the pixel electrode 324, and the electrode 328 are provided over an interlayer insulating film 327. Column spacers 329 are formed over the interlayer insulating film 327, and an orientation film 330 is formed covering the signal line 323, the pixel electrode 324, the electrode 328, and the column spacers 329. A counter substrate 332 is provided with a counter electrode 333 and an orientation film 334 which covers the counter electrode 333. The column spacers 329 are formed in order to maintain a gap between the supporting substrate 107 and the counter substrate 332. A liquid crystal layer 335 is formed in the gap formed by the column spacers 329. At portions where the single crystal semiconductor layer 321 is connected to the signal line 323 and the electrode 328, steps are generated in the interlayer insulating film 327 due to formation of the contact holes. The steps disorder the orientation of liquid crystals of the liquid crystal layer 335. Therefore, the column spacers 329 are formed at the steps to prevent disorder of the orientation of liquid crystals.

Figure 12A:
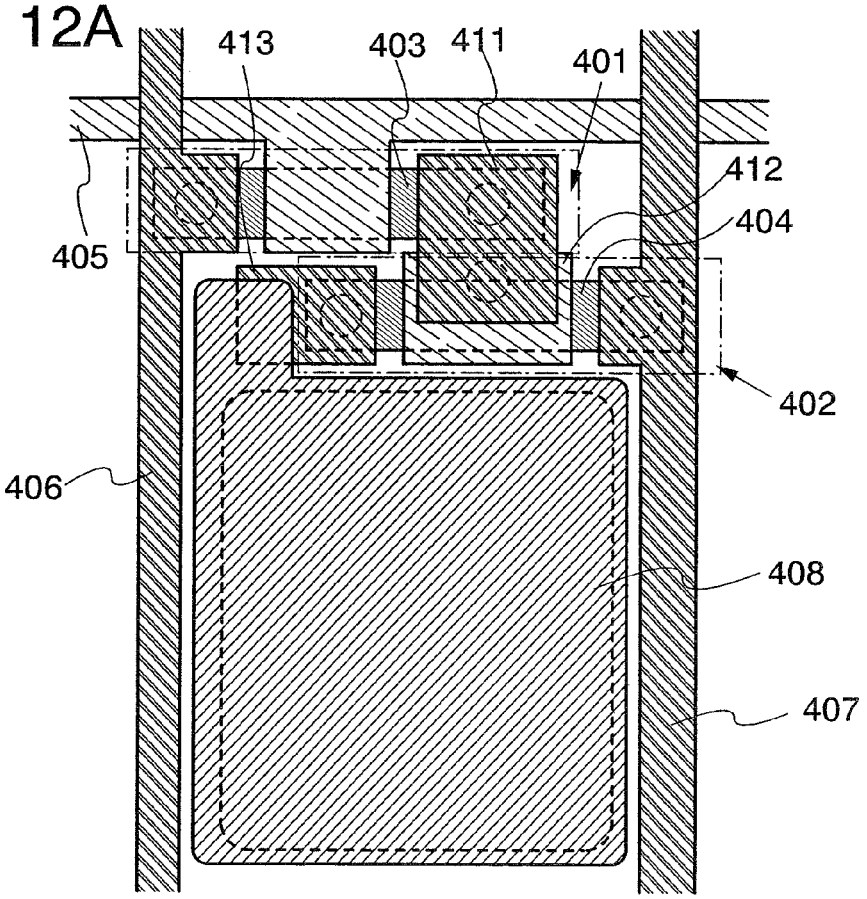
FIG. 12A is a plane view of an electroluminescence display device and FIG. 12B is a cross-sectional view taken along the section line J-K in FIG. 12A.
Figure 12B:
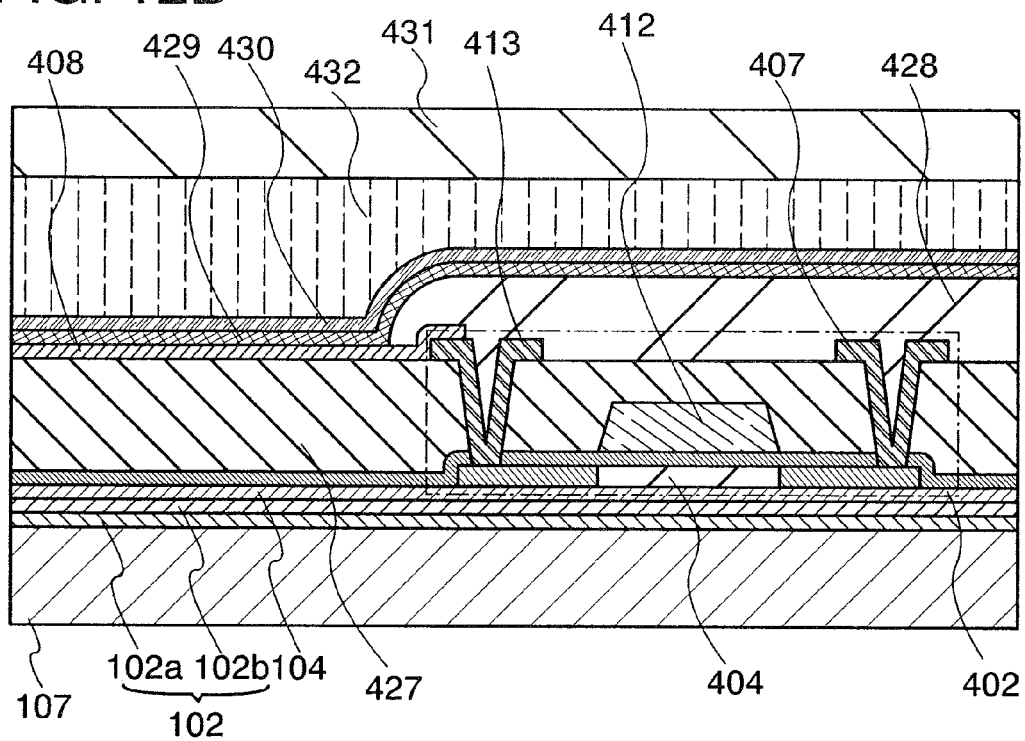

Next, an electroluminescence display device (hereinafter the device is referred to as an "EL display device") will be described. FIGS. 12A and 12B are drawings showing an EL display device manufactured using the SOI substrate shown in FIG. 10. FIG. 12A is a plane view of a pixel of the EL display device, and FIG. 12B is a cross-sectional view of the pixel.

FIG. 12A shows an example of an electroluminescence display device in which a transistor in a pixel portion is formed of a single crystal semiconductor layer. FIG. 12A is a plane view of a pixel, where a selection transistor 401 and a display control transistor 402 each including a TFT are formed. FIG. 12B is a cross-sectional view showing a main part including the display control transistor 402.

A single crystal semiconductor layer 403 of the selection transistor 401 and a single crystal semiconductor layer 404 of the display control transistor 402 are layers formed by processing of the single crystal semiconductor layer 552 of the SOI substrate of FIG. 10. The pixel includes a scanning line 405, a signal line 406, a current supply line 407, and a pixel electrode 408. In the EL display device, each pixel is provided with a light-emitting element having a structure in which a layer including an electroluminescent material (hereinafter this layer is referred to as an "EL layer") is sandwiched between a pair of electrodes. One electrode of the light-emitting element is the pixel electrode 408.

In the selection transistor 401, a gate electrode is included in the scanning line 405, one of a source electrode and a drain electrode is included in the signal line 406, and the other thereof is formed as an electrode 411. In the display control transistor 402, a gate electrode 412 is electrically connected to the electrode 411, one of a source electrode and a drain electrode is formed as an electrode 413 which is electrically connected to the pixel electrode 408, and the other thereof is included in the current supply line 407.

As the SOI substrate, the substrate manufactured by the method of Embodiment Mode 3 is used. Similarly to FIG. 11B, over the supporting substrate 107, the insulating layer 102, the insulating layer 104, and a single crystal semiconductor layer 404 are stacked. Note that the insulating layer 102 may be formed by a silicon nitride oxide layer 102a and a silicon oxynitride layer 102b, similarly to Embodiment Mode 1. The supporting substrate 107 is the divided mother glass 551.

As shown in FIG. 12B, an interlayer insulating film 427 is formed to cover the gate electrode 412 of the display control transistor 402. Over the interlayer insulating film 427, the signal line 406, the current supply line 407, the electrode 411, the electrode 413, and the like are formed. Further, the pixel electrode 408 which is electrically connected to the electrode 413 is formed over the interlayer insulating film 427. The periphery of the pixel electrode 408 is surrounded by a partition wall layer 428, which has an insulating property. An EL layer 429 is formed over the pixel electrode 408, and a counter electrode 430 is formed over the EL layer 429. A counter substrate 431 is provided as a reinforcing plate, and the counter substrate 431 is attached to the supporting substrate 107 with a resin layer 432. The pixel shown in FIGS. 12A and 12B is arranged in a matrix in the pixel portion of an EL display device.

The grayscale of the EL display device is controlled by either a current driving method by which the luminance of the light-emitting element is controlled by current or a voltage driving method by which the luminance thereof is controlled by voltage. The current drive method is difficult to employ when transistors have characteristics which are largely different for each pixel; therefore, a compensation circuit for compensating variation in characteristics is needed. When the SOI substrate of the present invention is used, characteristic variation of the selection transistor 401 and the display control transistor 402 between pixels is little; therefore, the current driving method can be employed.

As shown in FIGS. 11A and 11B and FIGS. 12A and 12B, an SOI substrate can be manufactured using mother glass for manufacturing a display device, and a display device can be manufactured using the SOI substrate. Moreover, since a microprocessor shown in FIG. 8 and FIG. 9 can also be formed on this SOI substrate, a display device can be equipped with a computer function. Furthermore, a display device capable of inputting and outputting data without contact can be manufactured.

That is, with use of the SOI substrate of the present invention, various electric appliances can be manufactured. As the electric appliances, there are cameras such as video cameras and digital cameras, navigation systems, audio reproducing devices (such as car audios and audio components), computers, game machines, portable information terminals (such as mobile computers, cellular phones, portable game machines, and electronic books), and image reproducing devices each of which is provided with a recording medium (specifically, devices that can reproduce image data recorded in a recording medium such as a digital versatile disk (DVD) and are equipped with a display device capable of displaying the image).

Figure 13A:
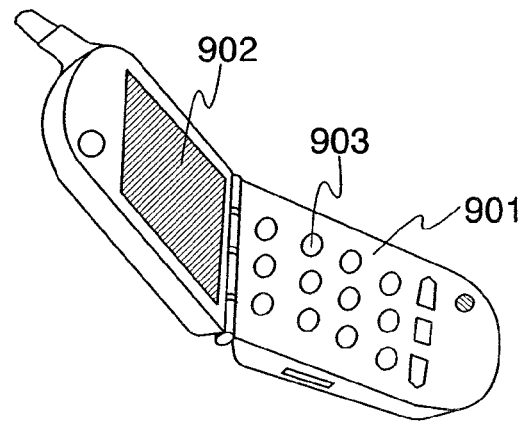
FIGS. 13A to 13C are diagrams illustrating electronic appliances to which the present invention is applied.
Figure 13B:
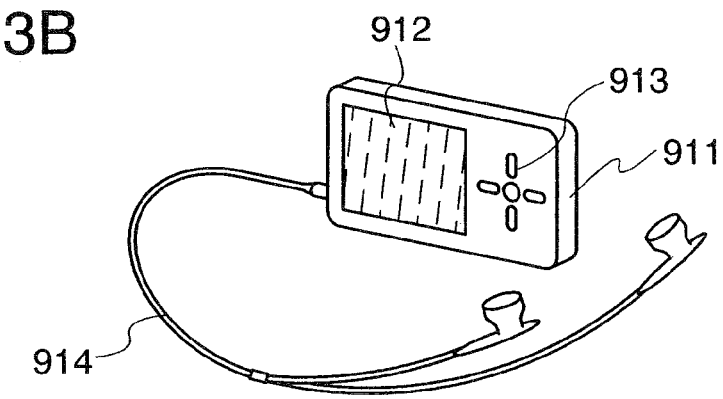
Figure 13C:
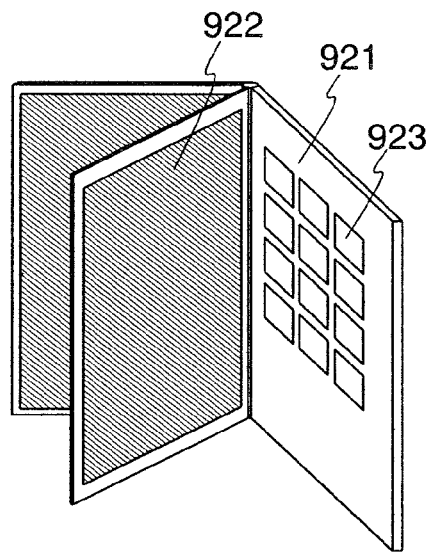

With reference to FIG. 13A to 13C, specific modes of the electric appliances will be described. FIG. 13A is an external view illustrating an example of a cellular phone 901. This cellular phone 901 includes a display portion 902, operation switches 903, and the like. The liquid crystal display device shown in FIGS. 11A and 11B or the EL display device shown in FIGS. 12A and 12B is applied to the display portion 902, so that the display portion 902 can have little display unevenness and excellent image quality. A semiconductor device formed using the SOI substrate of the present invention can also be applied to a microprocessor, a memory, or the like included in the cellular phone 901.

FIG. 13B is an external view illustrating an example of a structure of a digital player 911. The digital player 911 includes a display portion 912, operation portions 913, an earphone 914, and the like. The earphone 914 can be replaced by a headphone or a wireless earphone. The liquid crystal display device shown in FIGS. 1A and 11B or the display device shown in FIGS. 12A and 12B is applied to the display portion 912, so that high definition images or a large amount of textual information can be displayed even when the screen size is about 0.3 inches to 2 inches. A semiconductor device manufactured using the SOI substrate of the present invention can be applied to a memory portion which stores music information or a microprocessor which are included in the digital player 911.

FIG. 13C is an external view showing an e-book reader 921. This e-book reader 921 includes a display portion 922 and operation switches 923. The e-book reader 921 may incorporate a modem or may incorporate the RFCPU shown in FIG. 9, so that information can be transmitted and received wirelessly. The liquid crystal display device shown in FIGS. 11A and 11B or the EL display device shown in FIGS. 12A and 12B is applied to the display portion 922, images with high image quality can be displayed. In the e-book reader 921, a semiconductor device formed using an SOI substrate of the present invention can be applied to a memory portion which stores information or a microprocessor which makes the e-book reader 921 operate.

[Embodiment Mode 6]

With use of a semiconductor device having a display element to which the SOI substrate of the present invention is applied, a television device can be completed. An example of a television device having high performance and high reliability will be described.

Figure 14:
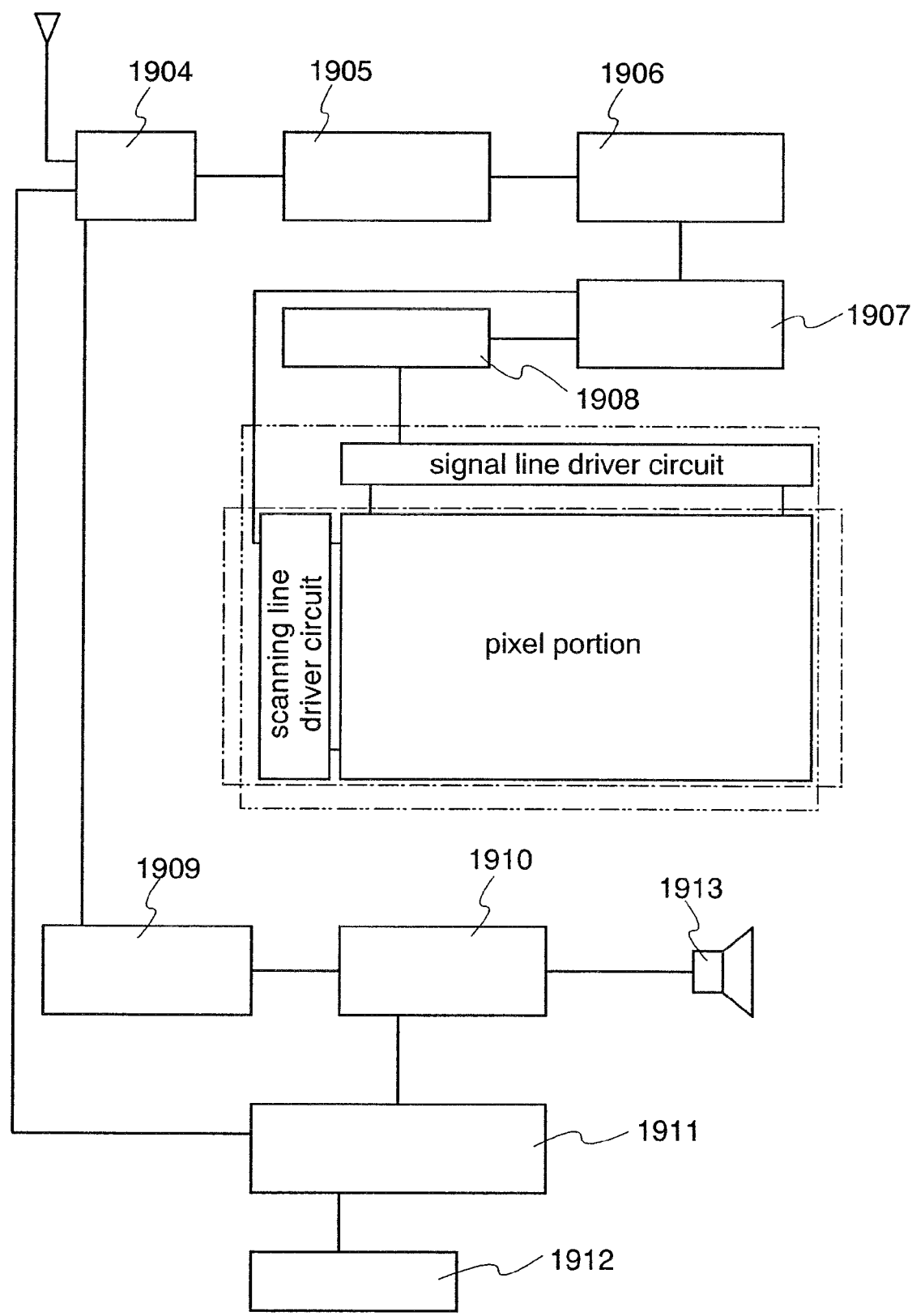
FIG. 14 is a block diagram illustrating a main configuration of an electronic appliance to which the present invention is applied.

FIG. 14 is a block diagram showing a main configuration of a television device (e.g., a liquid crystal television device or an EL television device).

As for the structures of other external circuits, a video signal amplifier circuit 1905 for amplifying video signals among signals received by a tuner 1904; a video signal processing circuit 1906 for converting signals outputted from the video signal amplifier circuit 1905 into color signals corresponding to red, green, and blue; a control circuit 1907 for converting the video signals so as to be inputted into the driver ICs; and the like are provided on the input side of the video signals. The control circuit 1907 outputs a signal to each of the scanning line side and the signal line side. In the case of digital driving, a signal divider circuit 1908 may be provided on the signal line side so that input digital signals can be divided into m pieces to be supplied.

Among the signals received by the tuner 1904, an audio signal is transmitted to an audio signal amplifier circuit 1909, and output thereof is supplied to a speaker 1913 through an audio signal processing circuit 1910. A control circuit 1911 receives control information on a receiving station (receiving frequency) or sound volume from an input portion 1912 and transmits the signal to the tuner 1904 or the audio signal processing circuit 1910.

Figure 15A:
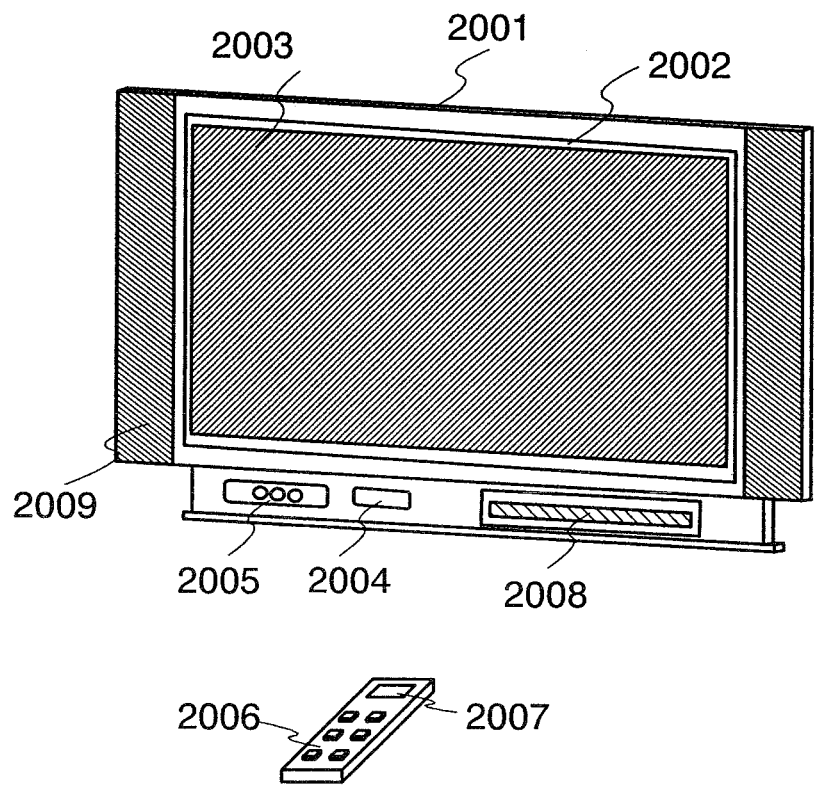
FIGS. 15A and 15B are diagrams illustrating electronic appliances to which the present invention is applied.
Figure 15B:
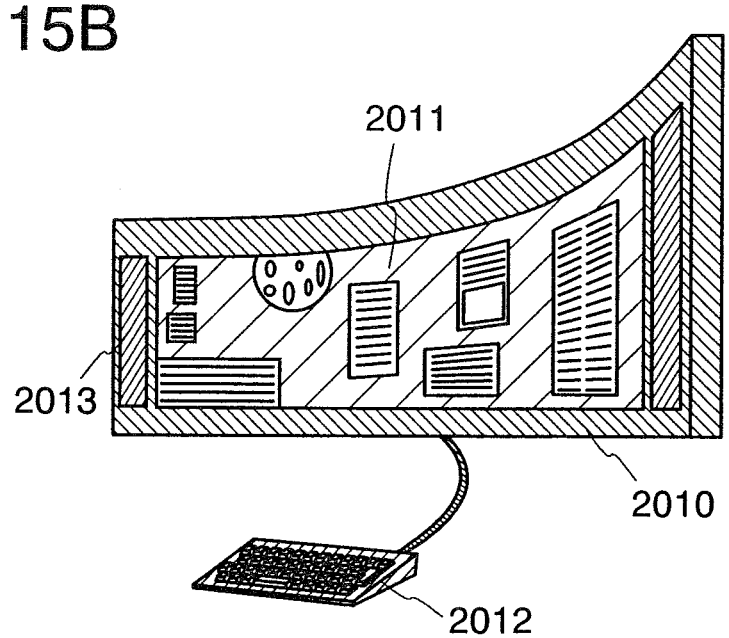

A display module is incorporated into a chassis as shown in FIGS. 15A and 15B, so that a television device can be completed. A display panel in which components up to an FPC are set is also generally called an EL display module. Thus, when an EL display module is used, an EL television device can be completed, and when a liquid crystal display module is used, a liquid crystal television device can be completed. A main screen 2003 is formed using the display module, and speaker portions 2009, operation switches, and the like are provided as its accessory equipment. As described above, the television device can be completed by application of the SOI substrate of the present invention.

In addition, reflected light of light entering from outside may be blocked with use of a retardation plate or a polarizing plate. In a top-emission semiconductor device, an insulating layer serving as a partition wall may be colored to be used as a black matrix. The partition wall can be formed by a droplet discharging method or the like as well, using pigment-based black resin or a resin material such as polyimide mixed with carbon black or the like, or a stack of these. The partition wall may also be formed in such a manner that different materials are discharged to the same region plural times by a droplet discharging method. A quarter wave plate or a half wave plate may be used as the retardation plate and may be designed to be able to control light. A structure is employed in which a light-emitting element, a sealing substrate (sealing material), a retardation plates (a quarter wave plate and a half wave plate), and a polarizing plate are provided in this order over a TFT element substrate. Light emitted from the light-emitting element travels through these to be emitted outside from the polarizing plate. The retardation plate or the polarizing plate may be provided on the side from which light is emitted or may be provided on the both sides in the case of a dual-emission semiconductor device in which light is emitted from the both sides. In addition, an anti-reflection film may be provided outside the polarizing plate. Accordingly, images with higher resolution and precision can be displayed.

As shown in FIG. 15A, a display panel 2002 using display elements is incorporated into a chassis 2001, and in addition to reception of general television broadcast by a receiver 2005, communication of information in one direction (from a transmitter to a receiver) or in two directions (between a transmitter and a receiver or between receivers) can be performed by connection to a wired or wireless communication network via a modem 2004. The television device can be operated using switches incorporated into the chassis or by a remote control device 2006 provided separately. A display portion 2007 which displays information to be outputted may be provided for the remote control device 2006.

Further, the television device may include a sub-screen 2008 formed using a second display panel to display channels, volume, or the like, in addition to the main screen 2003. In this structure, the main screen 2003 may be formed of an EL display panel which is excellent in a viewing angle, and the sub-screen may be formed of a liquid crystal display panel capable of displaying images with low power consumption. In order to prioritize low power consumption, a structure may also be employed in which the main screen 2003 is formed using a liquid crystal display panel, the sub-screen 2008 is formed using an EL display panel, and the sub-screen is able to be turned on or off. When the present invention is used, a high-performance and high-reliability semiconductor device can be manufactured with high productivity even with use of many TFTs and electronic components using such a large substrate.

FIG. 15B shows a television device which has a large display portion, for example, 20-inch to 80-inch display portion and includes a chassis 2010, a keyboard portion 2012 which is an operation portion, a display portion 2011, speaker portions 2013, and the like. The present invention is applied to the manufacture of the display portion 2011. Since a substance which can be curved is used for the display portion in FIG. 15B, a television device having a curved display portion is obtained. Since the shape of a display portion can be freely designed as described above, a television device having a desired shape can be manufactured.

By application of the SOI substrate of the present invention, a high-performance and high-reliability semiconductor device which has a display function can be manufactured with high productivity. Accordingly, a high-performance and high-reliability television device can be manufactured with high productivity.

Needless to say, the present invention is not limited to application to a television device, and can be applied to a variety of uses, such as a monitor of a personal computer, a large display medium such as an information display board at the train station, the airport, or the like, or an advertisement display board on the street.

[Embodiment Mode 7]

Figure 16A:
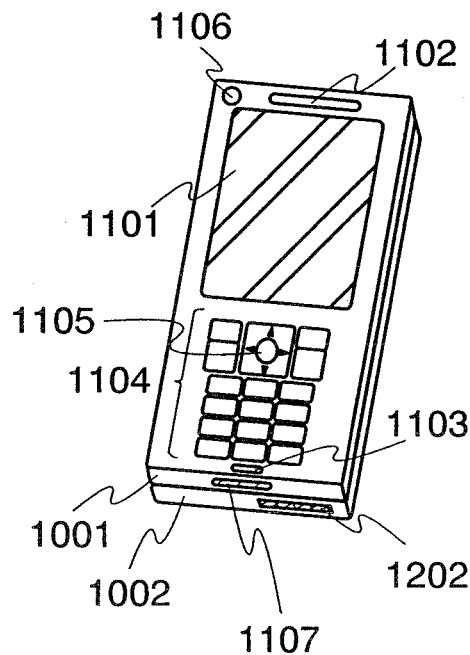
FIGS. 16A to 16C are diagrams illustrating a cellular phone to which the present invention is applied.
Figure 16B:
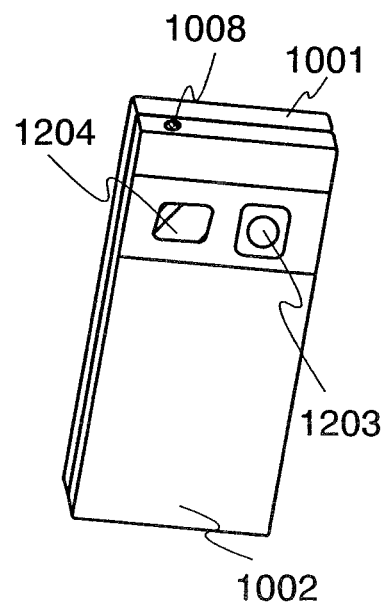
Figure 16C:
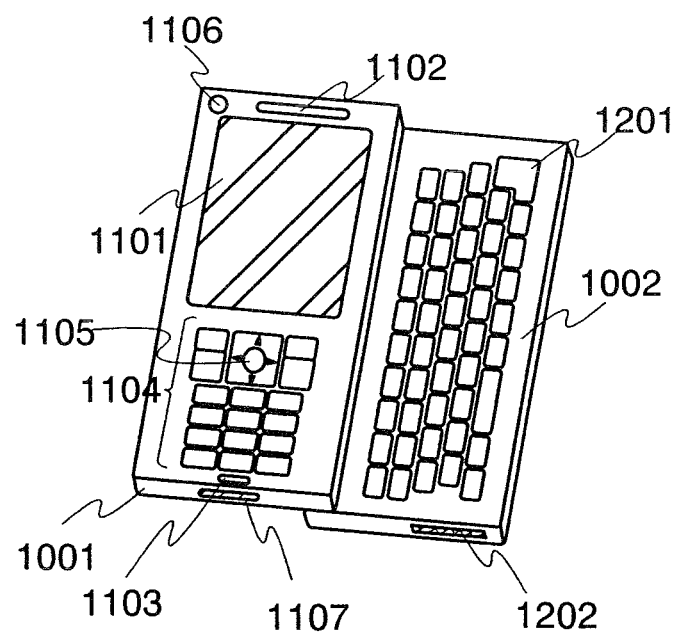

FIGS. 16A to 16C show an example of a structure of a cellular phone to which the present invention is applied, and the cellular phone is different from that shown in FIG. 13A. FIG. 16A is a front view, FIG. 16B is a back view, and FIG. 16C is a development view of the cellular phone. The cellular phone is a so-called smart phone which is equipped with functions both as a telephone and as a mobile information terminal, incorporates a computer, and is capable of various kinds of data processing other than verbal communication.

The cellular phone is formed by two chassis: a chassis 1001 and a chassis 1002. The chassis 1001 is provided with a display portion 1101, a speaker 1102, a microphone 1103, operation keys 1104, a pointing device 1105, a camera lens 1106, external connection terminal 1107, an earphone terminal 1008, and the like. The chassis 1002 is provided with a keyboard 1201, an external memory slot 1202, a camera lens 1203, a light 1204, and the like. An antenna is incorporated into the chassis 1001.

In addition to the above-described structure, a non-contact IC chip, a small recording device, or the like may be incorporated.

The display direction of the display portion 1101 which is capable of incorporating the semiconductor device described in the above embodiment modes changes according to usage patterns. The cellular phone is provided with the camera lens 1106 on the same surface as the display portion 1101, and thus it can be used as a video phone. A still image and a moving image can be shot with use of the display portion 1101 as a viewfinder, the camera lens 1203, and the light 1204. The speaker 1102 and the microphone 1103 are not limited to use for verbal communication, and can be used for a videophone, recording, reproduction, and the like. The operation keys 1104 are capable of being used for incoming and outgoing calls, simple input of information such as e-mail, scroll of a screen, cursor motion, and the like. Furthermore, the chassis 1001 and the chassis 1002 overlapping with each other shown in FIG. 16A can be unfolded as shown in FIG. 16C, so that the cellular phone can be used as a mobile information terminal. In this case, smooth operation is possible with use of the keyboard 1201 and the pointing device 1105. The external connection terminal 1107 can be connected to an AC adapter or a variety of cables such as a USB cable, and can be charged and perform data communication with a computer or the like. Moreover, a recording medium is inserted in the external memory slot 1202, so that the cellular phone can handle storage and movement of a larger amount of data.

Moreover, the cellular phone may be equipped with an infrared communication function, a television receiving function, and the like, in addition to the above-described functions.

Application of the SOI substrate of the present invention to the display portion 1101 makes it possible to provide a high-performance and high-reliability cellular phone.

Accordingly, by application of the SOI substrate of the present invention, a high-performance and high-reliability semiconductor device having a display function can be manufactured with high productivity. Thus, a high-performance and high-reliability cellular phone can be manufactured with high productivity.

As described above, the applicable range of the present invention is so wide that the present invention can be applied to electronic appliances and information displaying means of various fields.

[Embodiment 1]

Hereinafter, the present invention will be described in more detail based on Embodiment. Needless to say, the present invention is not limited at all by this embodiment and is specified by the scope of claims. In this embodiment, surface roughness of a single crystal semiconductor layer of an SOI substrate will be described.

A manufacturing method of an SOI substrate of this embodiment will be described with reference to FIGS. 17A to 17D. The manufacturing method shown in FIGS. 17A to 17D corresponds to the manufacturing method described in Embodiment Mode 1.

A single crystal silicon substrate is prepared as a semiconductor substrate. The single crystal silicon substrate is a p-type silicon substrate of 5 inches in diameter, and the plane orientation thereof is (100) and the side orientation thereof is <110>. Hereinafter, the single crystal silicon substrate is referred to as a "c-Si substrate 601".

The c-Si substrate 601 is washed with pure water, and then dried. Then, with a plasma CVD apparatus, a silicon oxynitride layer 602a is formed over the c-Si substrate 601, and a silicon nitride oxide layer 602b is formed over the silicon oxynitride layer 602a (see FIG. 17A).

When using a parallel plate plasma CVD apparatus, the silicon oxynitride layer 602a and the silicon nitride oxide layer 602b are successively formed without exposing the c-Si substrate 601 to atmosphere. The film-formation conditions at that time are described below. In this embodiment, before forming the silicon oxynitride layer 602a, a step of removing an oxide film of the c-Si substrate 601 by washing of the c-Si substrate 601 with a hydrofluoric acid solution for 60 seconds is performed.

Figure 17A:
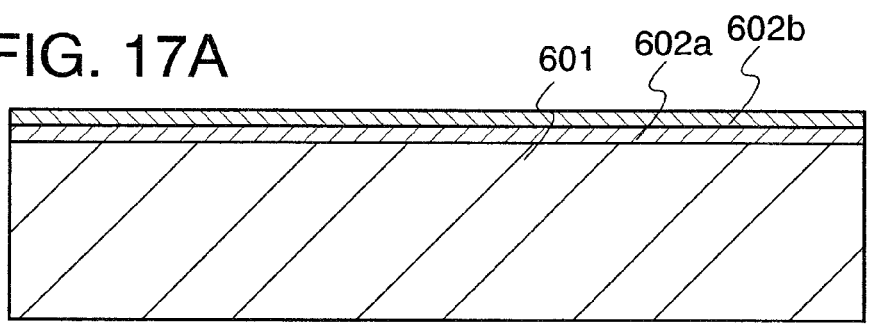
FIGS. 17A to 17D are views illustrating a manufacturing method of an SOI substrate of Embodiment 1.
Figure 17B:
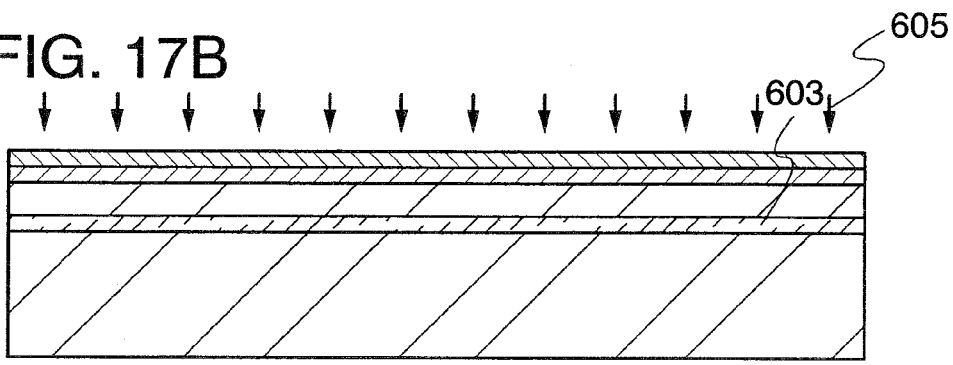

<silicon oxynitride layer 602a>
Thickness: 50 nm
Type of gas (flow rate): $SiH_4$ (4 sccm), $N_2O$ (800 sccm)
Substrate temperature: 400° C.
Pressure: 40 Pa
RF frequency: 27 MHz
RF power: 50 W
Distance between electrodes: 15 mm
Electrode area: 615.75 $cm^2$
<silicon nitride oxide layer 602b>
Thickness: 50 nm
Type of gas (flow rate): $SiH_4$ (10 sccm), $NH_3$ (100 sccm), $N_2O$ (20 sccm), $H_2$ (400 sccm)
Substrate temperature: 300° C.
Pressure: 40 Pa
RF frequency: 27 MHz
RF power: 50 W
Distance between electrodes: 30 mm
Electrode area: 615.75 $cm^2$ Next, as shown in FIG. 17B, with an ion doping apparatus, the c-Si substrate 601 is irradiated with hydrogen ions 605 to form a damaged region 603. As a source gas, 100% hydrogen gas is used, and without mass separation of ionized hydrogen, the ionized hydrogen is accelerated by an electric field to be added to the c-Si substrate 601.

Detailed conditions are described below.
Source gas: $H_2$
RF power: 100 W
Acceleration voltage: 40 kV
Dose: $2.0 \times 10^{16}$ ions/$cm^2$ In the ion doping apparatus, three types of ion species that are $H^+$, $H_2^+$, and $H_3^+$ are generated from the hydrogen gas, and the c-Si substrate 601 is doped with all of the ion species. The proportion of $H_3^+$ in the ion species generated from the hydrogen gas is about 80%.

Figure 17C:
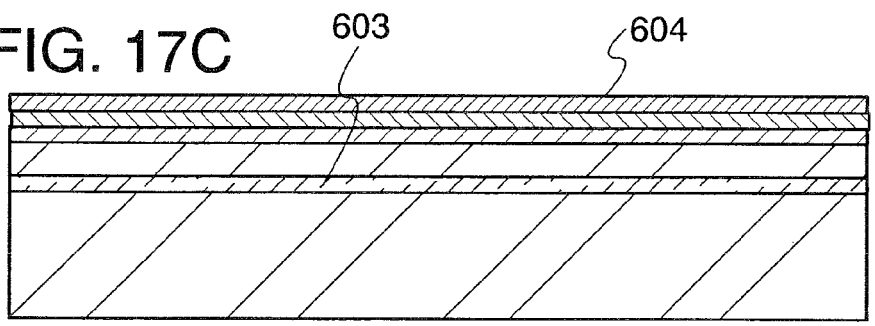
Figure 17D:
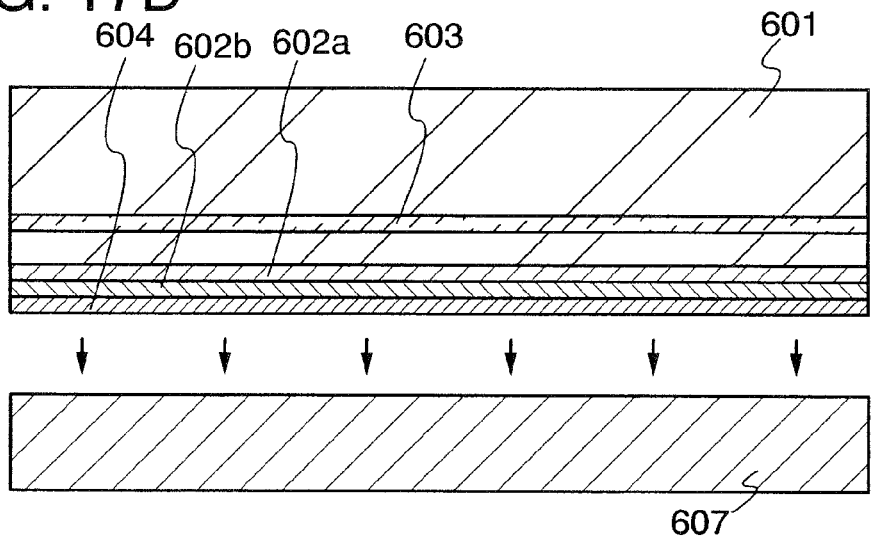

After forming the damaged region 603, the c-Si substrate 601 is washed with pure water, and a silicon oxide film 604 with a thickness of 50 nm is formed over the silicon nitride oxide layer 602b with a plasma CVD apparatus (see FIG. 17C). For a source gas of the silicon oxide film 604, a tetraethoxysilane (TEOS: $Si(OC_2H_5)_4$) gas and an oxygen gas are used. Film-formation conditions of the silicon oxide film 604 are described below.
<silicon oxide film 604>
Thickness: 50 nm
Type of gas (flow rate): TEOS (15 sccm), $O_2$ (750 sccm)
Substrate temperature: 300° C.
Pressure: 100 Pa
RF frequency: 27 MHz
RF power: 300 W
Distance between electrodes: 14 mm
Electrode area: 615.75 $cm^2$ A glass substrate 607 is prepared (see FIG. 17D). As the glass substrate 607, an aluminosilicate glass substrate (product name: AN100) manufactured by Asahi Glass Co., Ltd. is used. The glass substrate 607 and the c-Si substrate 601 over which the silicon oxide film 604 is formed are washed. They are washed in pure water with ultrasonic waves and then with pure water containing ozone.

Figure 18A:
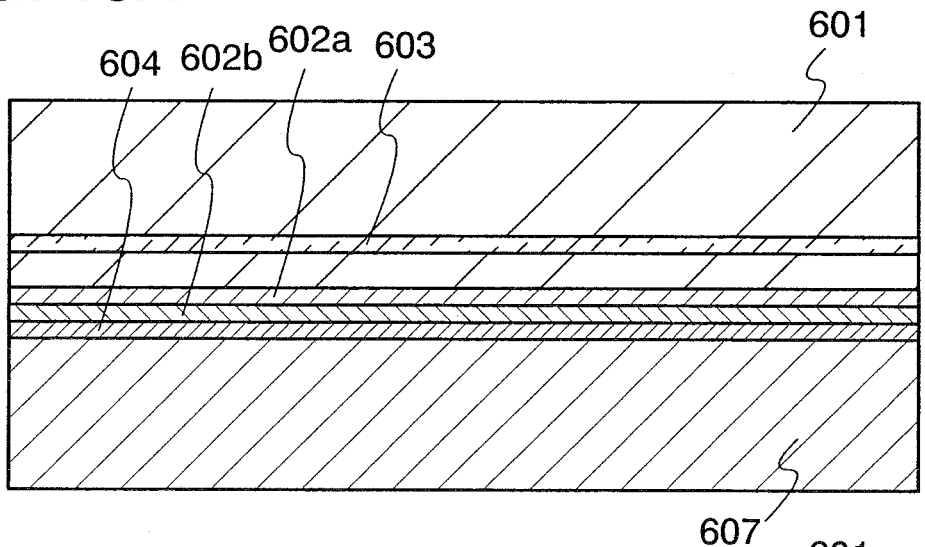
FIGS. 18A to 18C are views illustrating a manufacturing method of an SOI substrate of Embodiment 1.

Next, as shown in FIG. 18A, the glass substrate 607 and the c-Si substrate 601 are made in close contact with each other, so that the glass substrate 607 and the silicon oxide film 604 are bonded. By this step, the glass substrate 607 and the c-Si substrate 601 are bonded to each other. This step is performed at room temperature without heat treatment.

Figure 18B:
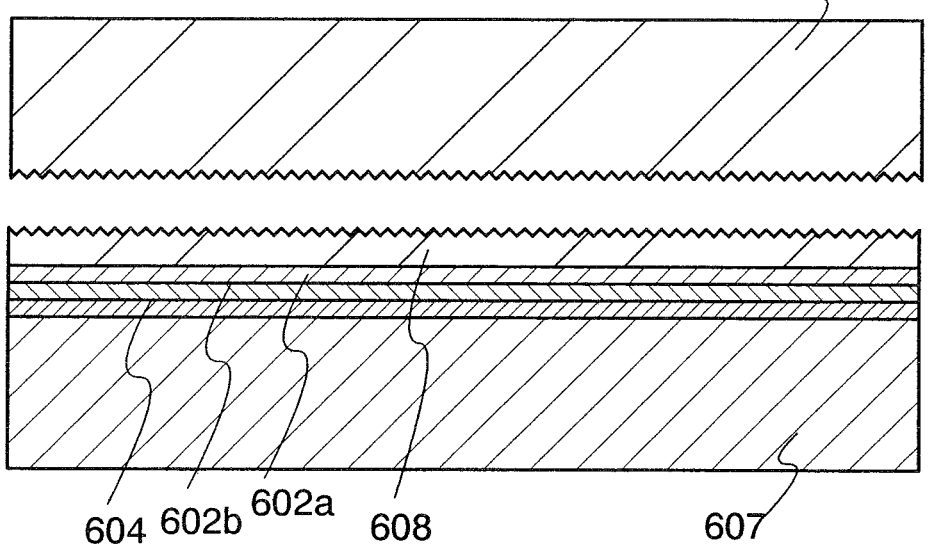

Next, heat treatment is performed in a diffusion furnace, so that separation is performed at the damaged region 603 as shown in FIG. 18B. First, heating at 200° C. is performed for two hours, and the heating temperature is increased to 600° C. to perform heating for another two hours. By this series of heat treatment, a crack is generated at the damaged region 603 in the c-Si substrate 601, so that the c-Si substrate 601 is separated at the damaged region 603. When the c-Si substrate 601 is heated at 600° C. or higher in this step, the crystallinity of the silicon layer attached to the glass substrate can be made closer to the crystallinity of a single crystal semiconductor substrate.

After the heat treatment, the glass substrate 607 and the c-Si substrate 601 are taken out of the diffusion furnace. Since the glass substrate 607 and the c-Si substrate 601 are in the state of being able to be separated from each other by the heat treatment, an SOI substrate in which a silicon layer 608 separated from the c-Si substrate 601 is attached to the glass substrate 607 is formed when the c-Si substrate 601 is removed.

The SOI substrate has a structure in which the silicon oxide film 604, the silicon nitride oxide layer 602b, the silicon oxynitride layer 602a, and the silicon layer 608 are stacked in this order over the glass substrate 607. In this embodiment, the thickness of the silicon layer 608 is about 120 nm.

Figure 18C:
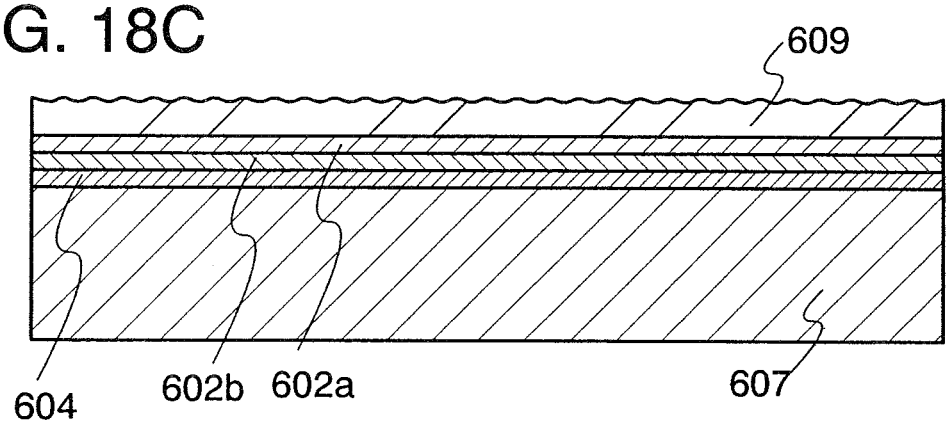

Next, a surface of the silicon layer 608 of the SOI substrate is etched by dry etching (see FIG. 18C). The silicon layer 608 is etched by dry etching, so that the thickness of a silicon layer 609 becomes 95 nm. The etching conditions of the silicon layer 608 are as follows: power to be applied to a coil-shaped electrode of 150 W; power to be applied to a lower electrode of 40 W; reaction pressure of 1.0 Pa; and an etching gas (a flow rate of chlorine) of 100 sccm.

Figure 19A:
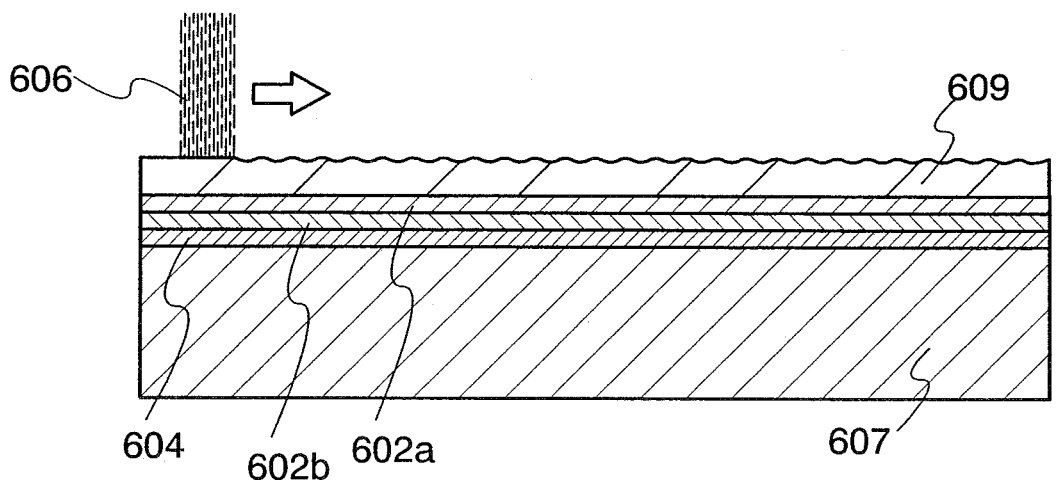
FIGS. 19A to 19C are views illustrating a manufacturing method of an SOI substrate of Embodiment 1.

Next, as shown in FIG. 19A, the silicon layer 609 of the SOI substrate is irradiated with a laser beam 606 to form the SOI substrate having a silicon layer 610. The silicon layer 610 of FIG. 19B corresponds to the silicon layer 609 after irradiation with the laser beam 606.

Then, the silicon layer 610 is etched by dry etching to reduce the thickness thereof to 60 nm. Through the above-described steps, the SOI substrate shown in FIG. 19C is formed. Note that the etching conditions are similar to those of FIG. 18C.

The specification of the laser used for laser beam irradiation of FIG. 19A is described below.
<specification of the laser>
XeCl excimer laser
Wavelength: 308 nm
Pulse width: 25 nsec
Repetition frequency: 30 Hz The laser beam 606 is a linear beam whose beam spot is linear and which is formed by an optical system including a cylindrical lens or the like. The glass substrate 607 is irradiated with the laser beam 606 while being moved relative to the laser beam 606. At this time, the scanning speed of the laser beam 606 is set at 1.0 mm/sec, and the same region is irradiated with 12 shots of the laser beam 606.

Further, the atmosphere of the laser beam 606 is set to be an air atmosphere or a nitrogen atmosphere. In this embodiment, the nitrogen atmosphere is formed in such a manner that while irradiation with the laser beam 606 is performed in an air atmosphere, a nitrogen gas is blown to the surface to be irradiated.

The irradiation with the laser beam 606 was performed with an energy density of about 540 mJ/cm$^2$ to 700 mJ/cm$^2$.

The inventors measured the surface roughness of the silicon layer due to the irradiation with the laser beam 606 after dry etching. Moreover, they measured the surface roughness of the silicon layer due to dry etching or wet etching after the irradiation with the laser beam 606.

The surface roughness of the silicon layer and the crystallinity thereof can be analyzed by observation with an optical microscope, an atomic force microscope (AFM), and a scanning electron microscope (SEM), by observation of an electron back scatter diffraction pattern (EBSP), by Raman spectroscopy, or the like.

In this embodiment, for the measurement of the surface roughness of the silicon layer, the mean surface roughness (Ra) of the silicon layer, the root-mean-square surface roughness (RMS) thereof, and the maximum difference in height between peak and valley (P-V) thereof were measured with an atomic force microscope (AFM).

In this embodiment, the mean surface roughness (Ra) refers to a mean surface roughness obtained by three-dimensional expansion of a centerline mean roughness (Ra) that is defined by JISB0601:2001 (ISO4287:1997) so as to be able to be applied to a measurement surface. The Ra can be represented by a mean value of the absolute values of the deviation from a reference surface to a specified surface, and is calculated by the formula below.

$$R_a = \frac{1}{S_0} \int_{Y_1}^{Y_2} \int_{X_1}^{X_2} |F(X, Y) - Z_0| \, dX \, dY \quad \text{[Formula 1]}$$

Note that the measurement surface refers to a surface shown by all measurement data and is calculated by the formula below.

$$Z = F(X, Y) \quad \text{[Formula 2]}$$

The specified surface refers to a surface which is an object of roughness measurement, and a rectangular region surrounded by four points represented by the coordinates $(X_1, Y_1)$, $(X_1, Y_2)$, $(X_2, Y_1)$, and $(X_2, Y_2)$. The area of the specified surface when the specified surface is ideally flat is represented by $S_0$. Note that $S_0$ is obtained by the formula below.

$$S_0 = (X_2 - X_1) \times (Y_2 - Y_1) \quad \text{[Formula 3]}$$

The reference surface refers to a plane surface represented by $Z = Z_0$ when the mean value of the height of the specified surface is represented by $Z_0$. The reference surface is parallel to the XY plane. Note that $Z_0$ can be obtained by the formula below.

$$Z_0 = \frac{1}{S_0} \int_{Y_1}^{Y_2} \int_{X_1}^{X_2} F(X, Y) \, dX \, dY \quad \text{[Formula 4]}$$

The root-mean-square surface roughness (RMS) refers to a root-mean-square surface roughness obtained by three-dimensional expansion of the RMS of a cross section curve so as to be able to be applied to the measurement surface, similarly to the mean surface roughness (Ra). The RMS can be represented by the square root of the mean value of the square of the deviation from the reference surface to the specified surface, and is obtained by the formula below.

$$R_{ms} = \sqrt{\frac{1}{S_0} \int_{Y_1}^{Y_2} \int_{X_1}^{X_2} \{F(X, Y) - Z_0\}^2 \, dX \, dY} \quad \text{[Formula 5]}$$

The maximum difference in height between peak and valley (P-V) can be represented by a difference between the height of the highest peak $Z_{max}$ and the height of the lowest valley $Z_{min}$ in the specified surface, and is obtained by the formula below.

$$P-V = Z_{max} - Z_{min} \quad \text{[Formula 6]}$$

The peak and the valley in this embodiment refer to a peak and a valley obtained by three-dimensional expansion of the "peak" and the "valley" defined by JISB0601:2001 (ISO4287:1997). The peak is represented by the highest part of the peaks in the specified surface. The valley is represented by the lowest part of the valleys in the specified surface.

The measurement conditions of the mean surface roughness (Ra), the root-mean-square surface roughness (RMS), and the maximum difference in height between peak and valley (P-V) in this embodiment are described below.
Atomic force microscope (AFM): scanning probe microscope SPI3800N/SPA500 (manufactured by Seiko Instruments Inc.)

Measurement mode: dynamic force mode (DFM mode)
Cantilever: SI-DF40 (made of silicon, spring constant of 42 N/m, resonance frequency of 250 kHz to 390 kHz inclusive, edge of probe R≤10 nm)
Scanning speed: 1.0 Hz
Measurement area: 10×10 μm
Measurement point: 256×256 points
Note that DMF mode is a measurement mode in which a surface shape is measured while the distance between a probe and a sample is controlled with a cantilever resonated at a certain frequency (a frequency peculiar to the cantilever) so that the oscillation amplitude of the lever becomes constant. Since the surface of the sample is measured without contact in this DFM mode, the measurement can be carried out while maintaining the original shape without damaging the surface of the sample.

In this embodiment, surface roughness of each of (A) a silicon layer after separation of the c-Si substrate (unprocessed silicon layer), (B) a silicon layer after dry etching, (C) a silicon layer after laser irradiation, (D) a silicon layer irradiated with a laser beam after dry etching, (E) a silicon layer irradiated with a laser beam after dry etching and then etched by dry etching, and (F) a silicon layer irradiated with a laser beam after dry etching and then etched by wet etching was measured under the above-described conditions, so that images of three-dimensional surface shapes were obtained. In consideration of the curvature of a cross section of a substrate of each obtained measured image, all the data of the images were fitted for one-dimensional plane by a least-squares method with attached software to perform the first gradient correction for correcting the gradient in the plane, followed by the second gradient correction for correcting the quadratic curve, which was performed in a similar manner to the first gradient correction. After that, the surface roughness was analyzed with the attached software, so that each of the mean surface roughness (Ra), the root-mean-square surface roughness (RMS), and the maximum difference in height between peak and valley (P−V) was calculated.

Figure 20A:
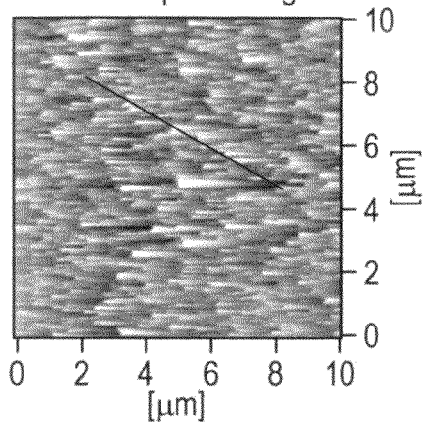
FIGS. 20A to 20F show observation results (10 μm×10 μm) of a surface of a single crystal semiconductor layer by AFM.
Figure 20D:
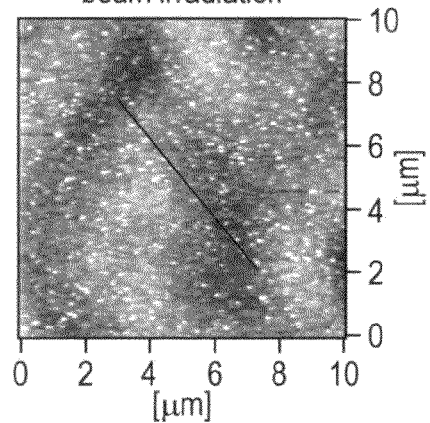
Figure 20B:
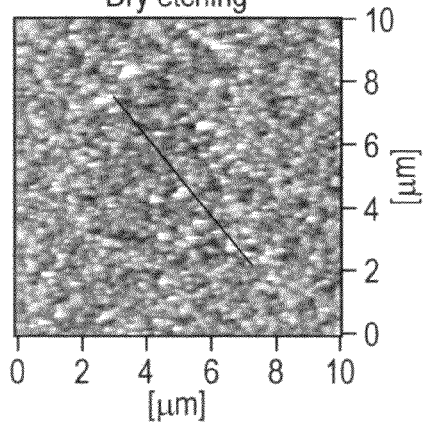
Figure 20E:
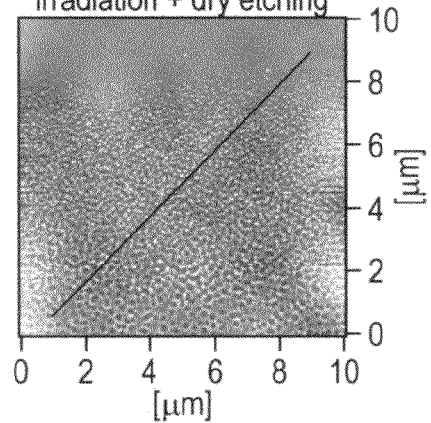
Figure 20C:
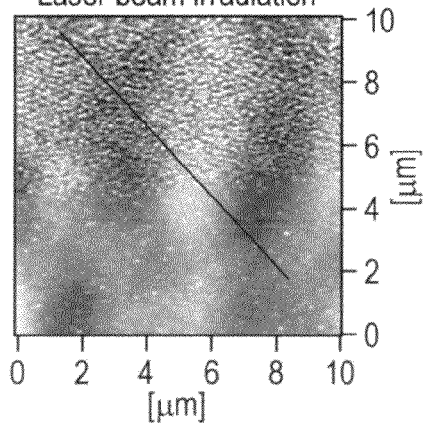
Figure 20F:
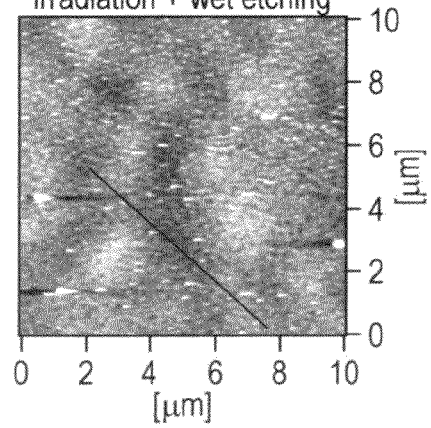
Figure 21A:
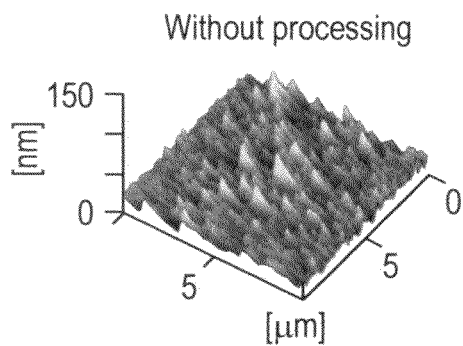
FIGS. 21A to 21F show observation results (10 μm×10 μm) of a surface of a single crystal semiconductor layer by AFM.

FIGS. 20A to 20F show results of measurement with AFM. FIG. 20D shows an observation image of the surface of the silicon layer irradiated with a laser beam after dry etching. In order to confirm an effect of the laser beam irradiation after dry etching, an observation image of the surface of the silicon layer (unprocessed silicon layer) after separating the c-Si substrate is shown in FIG. 20A, an observation image of the surface of the silicon layer after dry etching is shown in FIG. 20B, and an observation image of the surface of the silicon layer after laser beam irradiation is shown in FIG. 20C. FIG. 20E shows an observation image of the surface of the silicon layer irradiated with a laser beam after dry etching, and then further etched by dry etching. FIG. 20F shows an observation image of the surface of the silicon layer irradiated with a laser beam after dry etching, and then further etched by wet etching. Moreover, FIGS. 20A to 20F correspond to bird's-eye views of FIGS. 21A to 21F, respectively. Note that, in the observation image of the surface of the silicon layer which is shown in FIG. 20A and the bird's-eye view thereof which is shown in FIG. 21A, the images flow laterally; however, it does not affect the analysis of the surface roughness due to the definition formulae of the mean surface roughness (Ra), the root-mean-square surface roughness (RMS), and the maximum different in height between peak and valley.

The surface roughness calculated according to the DFM images of FIGS. 20A to 20F is shown in Table 1.

TABLE 1

|   | Mean Surface Roughness (Ra) [nm] | Root-Mean-Square Surface Roughness (RMS) [nm] | Maximum Difference between Peak and Valley (P − V) [nm] |
| --- | --- | --- | --- |
| (A) Without Processing | 5.89 | 7.74 | 85.8 |
| (B) Dry Etching | 5.86 | 7.52 | 61.8 |
| (C) Laser Beam Irradiation | 1.17 | 1.49 | 11.4 |
| (D) Dry Etching + Laser Beam Irradiation | 0.551 | 0.853 | 13.2 |
| (E) Dry Etching + Laser Beam Irradiation + Dry Etching | 0.794 | 1.14 | 26 |
| (F) Dry Etching + Laser Beam Irradiation + Wet Etching | 1.23 | 1.81 | 29.2 |

Figure 21B:
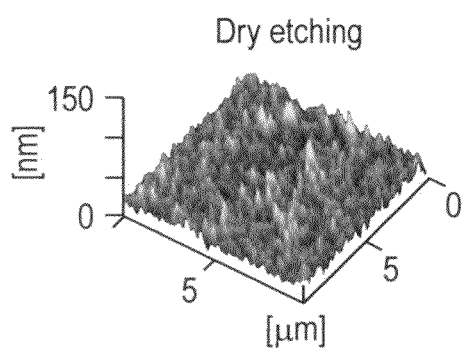
Figure 21C:
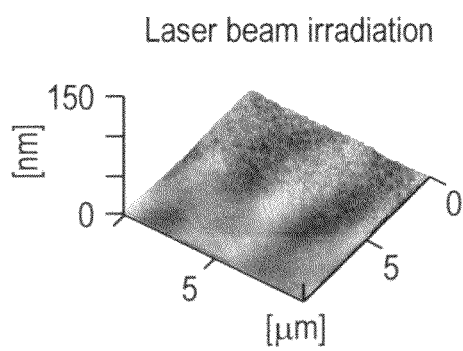
Figure 21D:
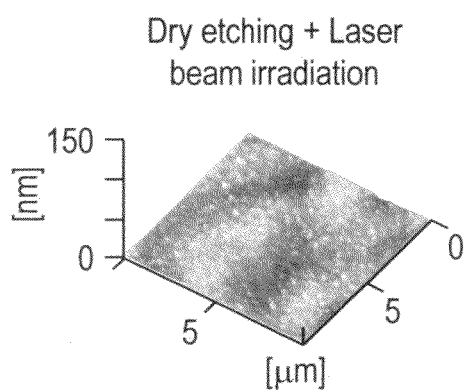
Figure 21E:
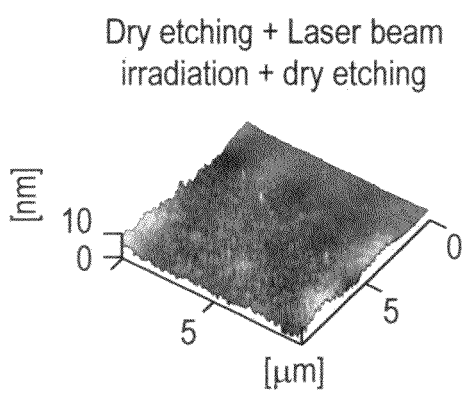
Figure 21F:
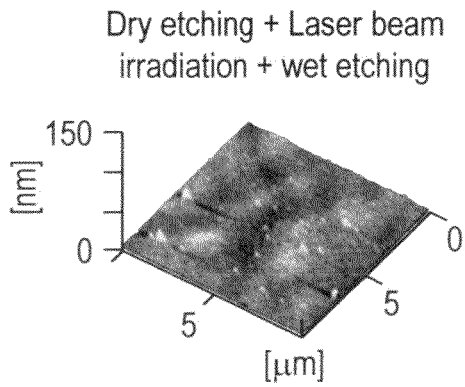

Since the bird's-eye view of the unprocessed silicon layer shown in FIG. 21A keeps crystal defects or a shape at the time of separation, the surface of the silicon layer has steep projections. When the silicon layer is etched by dry etching, the crystal defects or damage at the time of separation of the surface of the silicon layer can be removed as shown in FIG. 21B. However, crystal defects in the silicon layer are not removed, and thus the crystallinity of the silicon layer is not recovered. In addition, the crystallinity in the silicon layer can be recovered by irradiation of the silicon layer with a laser beam; however, crystal defects or damage at the time of separation of the surface of the single crystal semiconductor layer of FIG. 21C is taken into the single crystal semiconductor layer. Thus, the crystal defects remain in the silicon layer. The crystal defects or the damage at the time of separation of the surface of the single crystal semiconductor layer is removed by dry etching, and the silicon layer from which the crystal defects or the damage at the time of separation is removed is irradiated with a laser beam, whereby a silicon layer whose crystallinity is recovered can be obtained.

Therefore, by reduction in the thickness of the single crystal silicon layer whose crystal defects are reduced, a high-performance transistor which makes the most use of advantages of the single crystal silicon layer whose thickness is reduced can be manufactured.

According to Table 1, FIGS. 20A to 20F, and FIGS. 21A to 21F, it was found that improvement in planarity of the silicon layer attached to the supporting substrate can be realized by laser beam irradiation after dry etching.

[Embodiment 2]

In this embodiment, difference in characteristics between a single crystal semiconductor layer recrystallized by laser beam irradiation after dry etching and a single crystal semiconductor layer recrystallized by laser beam irradiation without performing dry etching will be described using experimental data shown in FIGS. 24A and 24B, FIGS. 25A and 25B, and FIGS. 26A and 26B.

In this embodiment, after the single crystal semiconductor layer recrystallized by laser beam irradiation after dry etching was formed and after the single crystal semiconductor layer recrystallized by laser beam irradiation without performing dry etching was formed, a thin film transistor was manufactured using each single crystal semiconductor layer. In other words, the thin film transistors one of which includes dry etching in the process and the other of which does not include dry etching in the process were manufactured, and their characteristics were compared. Specific conditions are described below.

Manufacturing steps from separation of a single crystal semiconductor substrate at a damaged region to bonding of a single crystal semiconductor layer to a supporting substrate are performed in a similar manner to the steps of Embodiment 1 shown in FIGS. 17A to 17D and FIGS. 18A and 18B. The single crystal semiconductor substrate was separated at the damaged region into the supporting substrate to which the single crystal semiconductor layer was bonded and part of the single crystal semiconductor substrate. After that, a single crystal semiconductor layer recrystallized by laser beam irradiation after dry etching and a single crystal semiconductor layer recrystallized by laser beam irradiation without performing dry etching were formed.

Here, the irradiation energy density of the laser beam is described. The laser beam energy densities in the case where recrystallization is performed by laser beam irradiation without performing dry etching and that in the case where recrystallization is performed by laser beam irradiation after performing dry etching differ from each other. This is because that the energy density which is needed for recrystallizing the single crystal semiconductor layer differs depending on the thickness of the single crystal semiconductor layer. In this embodiment, the thickness of the single crystal semiconductor layer after the separation into the supporting substrate to which the single crystal semiconductor layer is attached and part of the single crystal semiconductor substrate is about 120 nm, and the thickness thereof becomes about 95 nm by dry etching. The laser beam energy densities determined by the thicknesses of the single crystal semiconductor layer in the case of laser beam irradiation without performing dry etching were 701 mJ/cm$^2$, 710 mJ/cm$^2$, and 719 mJ/cm$^2$. In the case of laser beam irradiation after performing dry etching, the laser beam energy densities were 648 mJ/cm$^2$, 658 mJ/cm$^2$, and 669 mJ/cm$^2$.

Figure 19B:
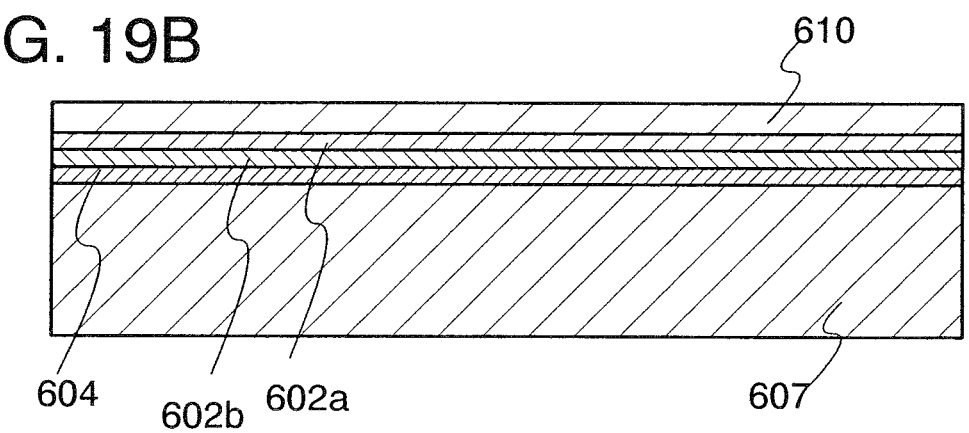
Figure 19C:
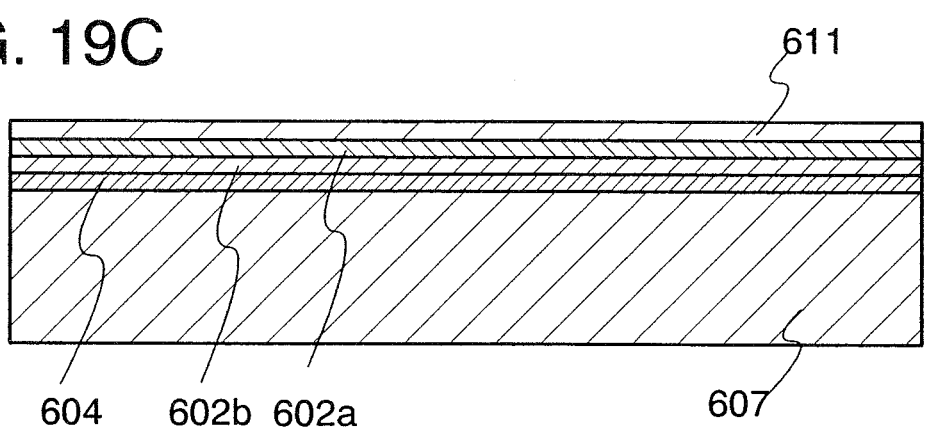

As for the single crystal semiconductor layer recrystallized by laser beam irradiation after performing dry etching, dry etching is performed in a similar manner to FIG. 18C, and then laser beam irradiation is performed in a similar manner to FIG. 19A, and dry etching is performed in a similar manner to FIG. 19B. As for the single crystal semiconductor layer recrystallized by laser beam irradiation without performing dry etching, laser beam irradiation is performed in a similar manner to FIG. 19A without performing the step of FIG. 18C, and then dry etching is performed in a similar manner to FIG. 19B.

Figure 22A:
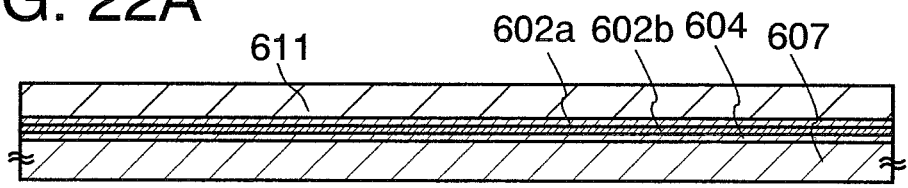
FIGS. 22A to 22E are views illustrating a manufacturing method of an SOI substrate of Embodiment 2.
Figure 22B:
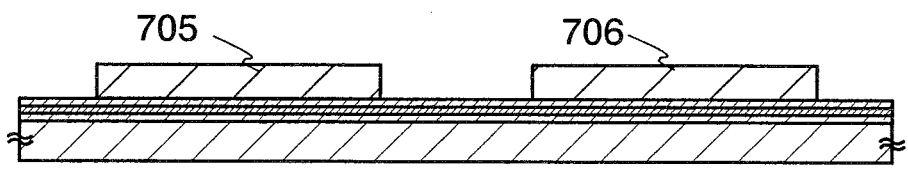

Next, a manufacturing method of a thin film transistor will be described with reference to FIGS. 22A to 22E and FIGS. 23A to 23C. An SOI substrate manufactured according to the above-described method is shown in FIG. 22A. The SOI substrate shown in FIG. 22A has a structure in which a silicon oxide film 604, a silicon nitride oxide layer 602b, a silicon oxynitride layer 602a, and a silicon layer 611 are stacked in this order over a glass substrate 607. Each of the thicknesses of the silicon oxide film 604, the silicon nitride oxide layer 602b, the silicon oxynitride layer 602a is 50 nm. The thickness of the silicon layer 611 is 55 nm.

Next, channel doping for controlling a threshold value was performed. The channel doping was performed using boron as a material gas at an acceleration voltage of 15 kV so that the peak concentration in the silicon layer 611 becomes $2\times10^{17}$ atoms/cm$^3$. Subsequently, a resist mask (not shown) was formed by a photolithography method, and the silicon layer 611 was etched into a desired shape with use of the resist mask, so that a silicon layer 705 and a silicon layer 706 are formed (see FIG. 22B).

Next, as a gate insulating film 707 for covering the etched silicon layers, a silicon oxide layer was formed to a thickness of 10 nm by high-density plasma, and a silicon oxynitride layer was formed to a thickness of 70 nm by a plasma CVD method. Subsequently, as a conductive film, a stacked layer of a tantalum nitride layer with a thickness of 30 nm and a tungsten layer with a thickness of 370 nm was formed over the gate insulating film 707.

Figure 22C:
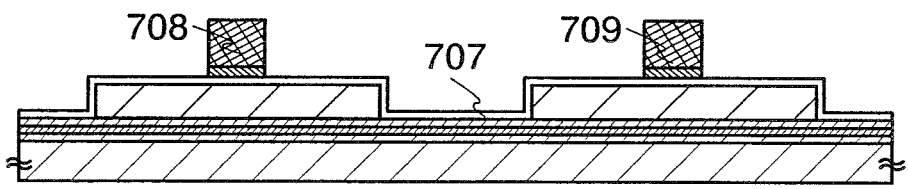
Figure 22D:
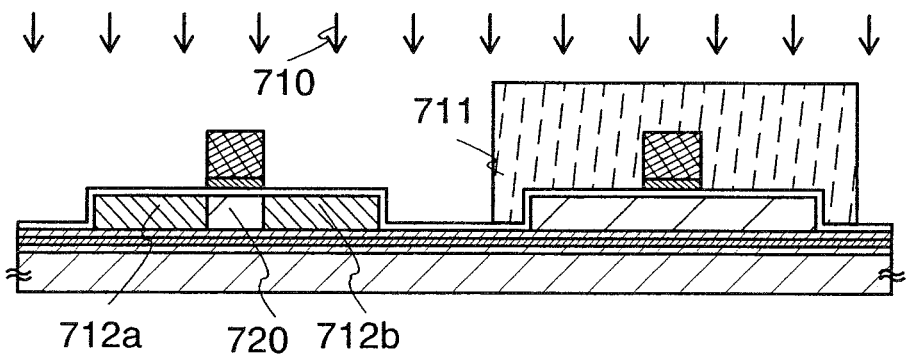
Figure 22E:
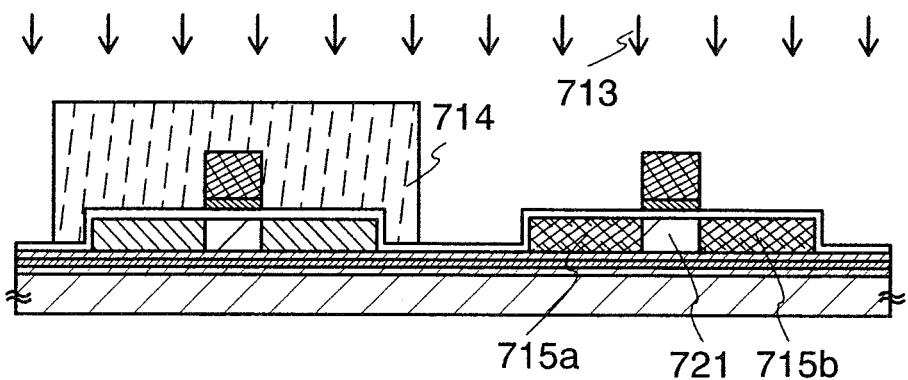

Next, a resist mask (not shown) was formed by a photolithography method, and the tungsten layer and the tantalum nitride layer were etched with use of the resist mask, so that a gate electrode 708 and a gate electrode 709 were formed and then the resist mask was removed (see FIG. 22C). After a resist mask 711 was anew formed to cover the silicon layer 706, doping treatment was performed. The silicon layer 705 to be an active layer of an n-channel TFT was doped with an impurity element 710 imparting n-type conductivity (one conductivity type). In this case, the gate electrode 708 formed by etching of the tungsten layer and the tantalum nitride layer serves as a mask to the impurity element 710 imparting n-type conductivity, and a channel formation region 720 and impurity regions 712a and 712b interposing the channel formation region 720 were formed in a self-alignment manner (see FIG. 22D). In the doping treatment of this embodiment, 5% of PH$_3$/H$_2$ was used as the material gas, the dose thereof was $3\times10^{15}$ ions/cm$^2$, and the acceleration voltage was 60 kV.

Next, the resist mask 711 was removed, and then a resist mask 714 was anew formed so as to cover a silicon layer 705 to be an active layer of an n-channel TFT to perform doping treatment. By the doping treatment, an impurity element 713 imparting opposite type (p-type) conductivity to the above-described conductivity type was added to the silicon layer 706 serving as an active layer of a p-channel TFT, so that an impurity region was formed. In this case, the impurity element 713 imparting p-type conductivity was added using the gate electrode 709 as a mask to the impurity element 713, so that a channel formation region 721 and impurity regions 715a and 715b interposing the channel formation region 721 were formed in a self-alignment manner (see FIG. 22E). In this embodiment, in the doping treatment, 15% of B$_2$H$_6$/H$_2$ was used as a material gas, the dose thereof was $1.6\times10^{16}$ ions/cm$^2$, and the acceleration voltage was 80 kV.

Through the above-described steps, the channel formation region and the impurity regions interposing the channel formation region were formed in each island-shape silicon layer.

Next, the resist mask 714 was removed, and then a silicon oxynitride film 716 (composition ratio: Si=32.8%, O=63.7%, H=3.5%) was formed to a thickness of 50 nm as a first interlayer insulating film by a plasma CVD method. Then, by heat treatment, the crystallinity of each of the island-shaped silicon layers was recovered, and the impurity element added to each of the island-shaped silicon layers was activated. In this embodiment, heat treatment was performed at 480° C. for one hour in a nitrogen atmosphere by a thermal annealing method using an annealing furnace.

Figure 23A:
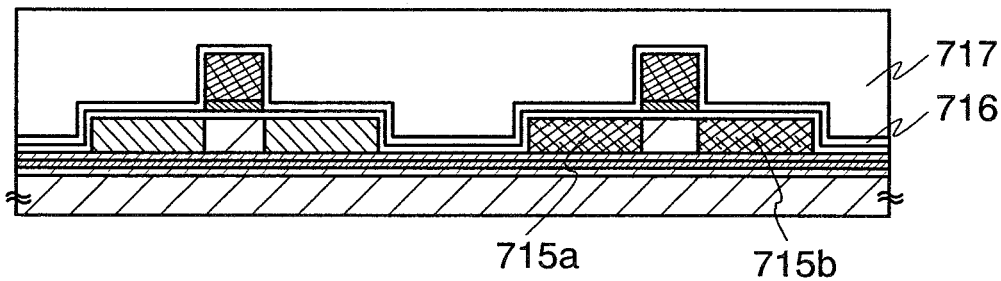
FIGS. 23A to 23C are views illustrating a manufacturing method of an SOI substrate of Embodiment 2.

Next, a second interlayer insulating film 717 formed of an inorganic insulating material or an organic insulating material was formed over the first interlayer insulating film (see FIG. 23A). In this embodiment, a silicon nitride film was formed to a thickness of 100 nm by a CVD method, and then a silicon oxide film was formed to a thickness of 600 nm. Then, heat treatment was performed, so that hydrogenation treatment can be performed. In this embodiment, heat treatment was performed using an annealing furnace at 410° C. for one hour.

Figure 23B:
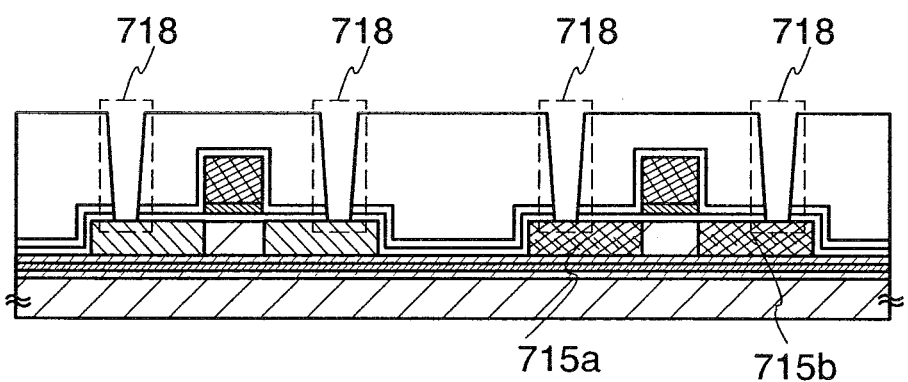

Next, contact holes (openings) 718 reaching the single crystal semiconductor layers were formed in the insulating film with use of a resist mask (see FIG. 23B). One or plural times of etching may be performed depending on the selectivity of a material to be used. The insulating film was removed by etching to form the openings 718 reaching a source region and a drain region.

Figure 23C:
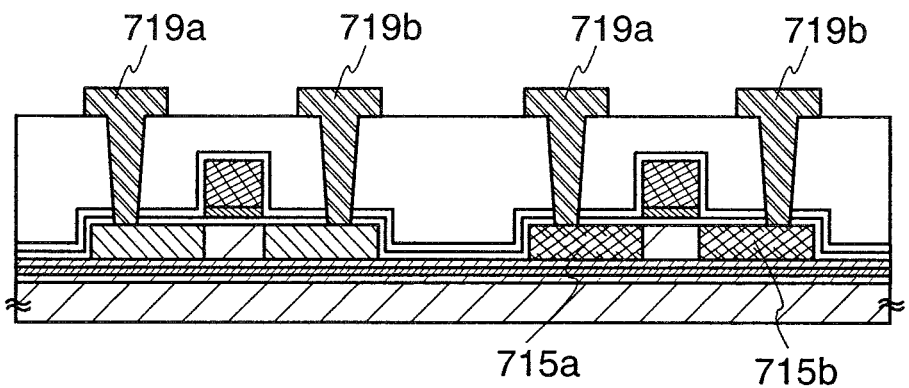

Next, as shown in the drawing, a conductive layer for covering the openings 718 was formed, and the conductive layer was etched to form conductive layers which function as a source electrode and a drain electrode which were electrically connected to part of each source region and drain region (see FIG. 23C). In this embodiment, as the conductive layer, a stacked-layer of a titanium layer with a thickness of 60 nm, a titanium nitride layer with a thickness of 40 nm, an aluminum layer with a thickness of 300 nm, and a titanium layer with a thickness of 100 nm was formed. Furthermore, the conductive layer was etched to form a source electrode and a drain electrode 719a and 719b.

Accordingly, a thin film transistor of this embodiment can be manufactured.

Figure 24A:
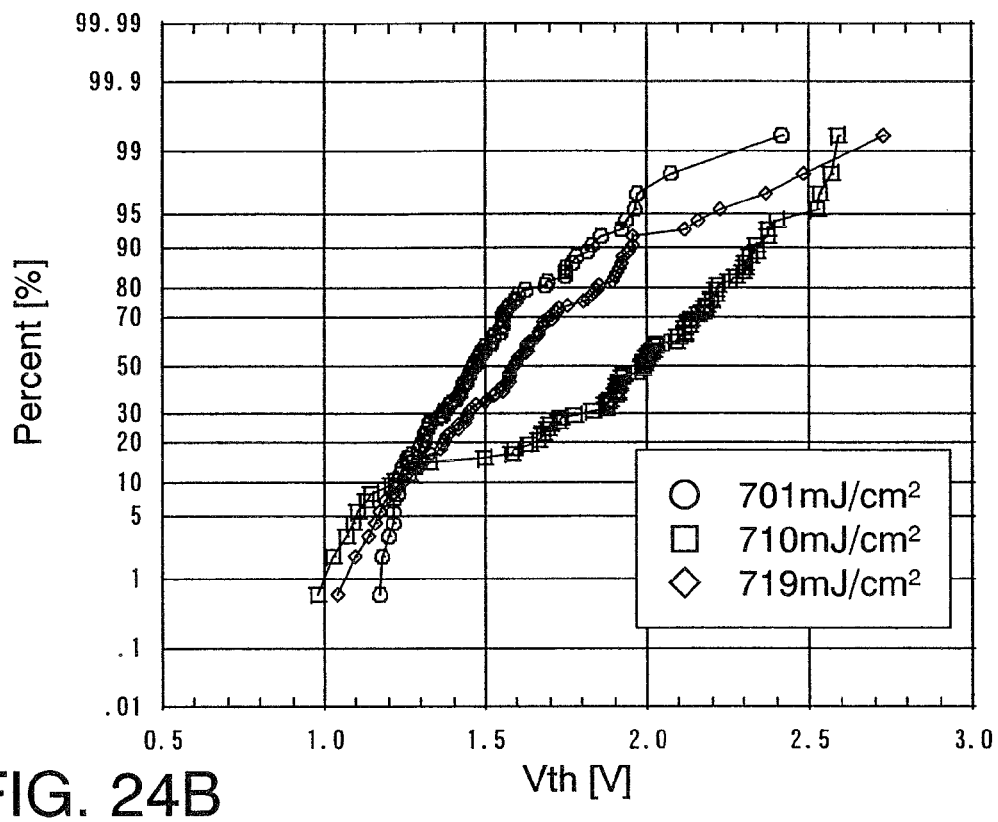
FIGS. 24A and 24B are statistical probability distribution charts of threshold voltage.
Figure 24B:
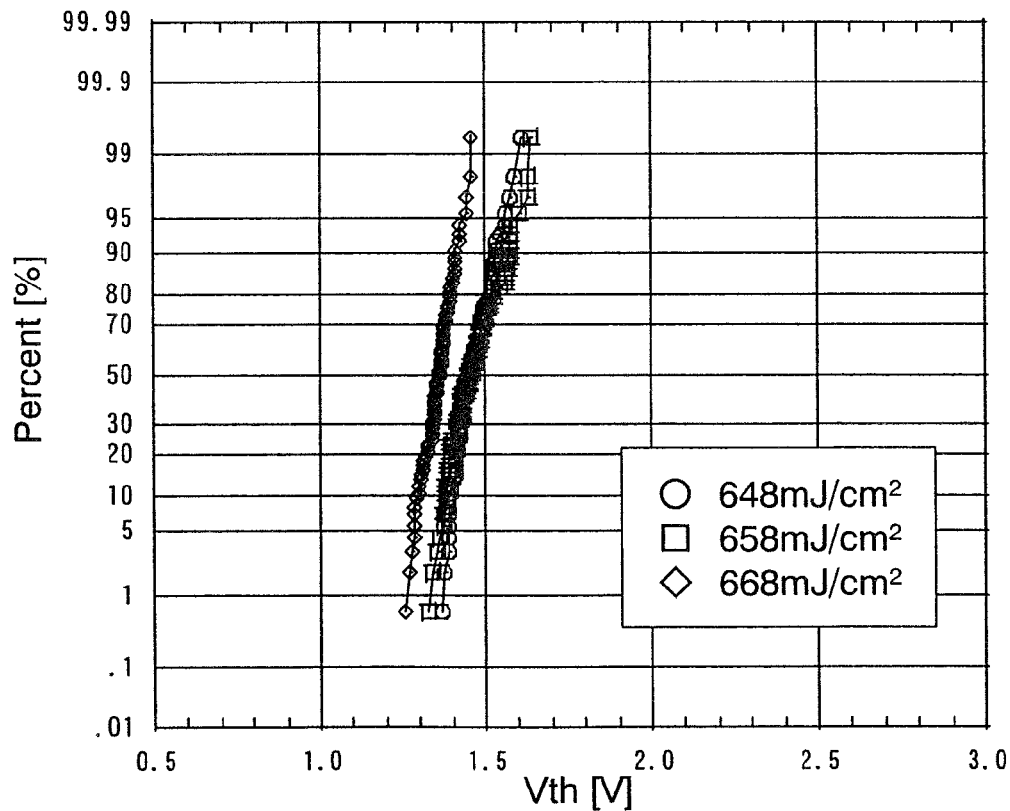

FIGS. 24A and 24B show statistical probability distribution charts of threshold voltage of an n-channel transistor manufactured using the single crystal semiconductor layer recrystallized by laser beam irradiation after performing dry etching (hereinafter, the transistor is referred to as a "transistor with dry etching") and an-n-channel transistor manufactured using the single crystal semiconductor layer recrystallized by laser beam irradiation without performing dry etching (hereinafter, the transistor is referred to as a "transistor without dry etching").

FIG. 24A shows cases of irradiation with laser beams (with energy densities of 701 mJ/cm$^2$ (○-mark), 710 mJ/cm$^2$ (□-mark), and 719 mJ/cm$^2$ (◇-mark)) without performing dry etching. FIG. 24B shows cases of irradiation with laser beams (with energy densities of 648 mJ/cm$^2$ (○-mark), 658 mJ/cm$^2$ (□-mark), and 669 mJ/cm$^2$ (◇-mark)) after performing dry etching. In either case, an n-channel transistor with a length of a channel formation region/a width of the channel formation region of 8 μm/8 μm was used. The data of FIGS. 24A and 24B were obtained by measurement in which drain voltage ($V_d$) was 5V. The horizontal axis of each of FIGS. 24A and 24B represents threshold voltage $V_{th}$ [V] and the vertical axis represents percent [%]. In addition, the more parallel distribution of the graph is to the horizontal axis, the less variation there is. Note that, as described above, the laser beam energy densities in the case where dry etching was performed and in the case where dry etching was not performed differ from each other because the energy density required for recrystallization differs depending on the thickness of the single crystal semiconductor layer. Therefore, the difference in the energy density does not affect variation in characteristics of the transistor. The same can be said for FIGS. 25A and 25B and FIGS. 26A and 26B.

In FIG. 24B, as for the value of threshold voltage of the transistor with dry etching, 99% of the entire value at an energy density of 648 mJ/cm$^2$ is in the range of 1.45±0.17 V; 99% of the entire value at an energy density of 658 mJ/cm$^2$ is in the range of 1.46±0.22 V; and 99% of the entire value at an energy density of 668 mJ/cm$^2$ is in the range of 1.36±0.13 V. In FIG. 24A, on the other hand, as for the value of threshold voltage of the transistor without dry etching, 99% of the entire value at an energy density of 701 mJ/cm$^2$ is in the range of 1.46±0.70 V; 99% of the entire value at an energy density of 710 mJ/cm$^2$ is in the range of 1.99±1.20 V; and 99% of the entire value at an energy density of 719 mJ/cm$^2$ is in the range of 1.59±0.93 V. That is, according to FIGS. 24A and 24B, it was found that variation could be reduced more in the case where laser beam was emitted after performing dry etching than in the case where laser beam was emitted without performing dry etching.

Figure 25A:
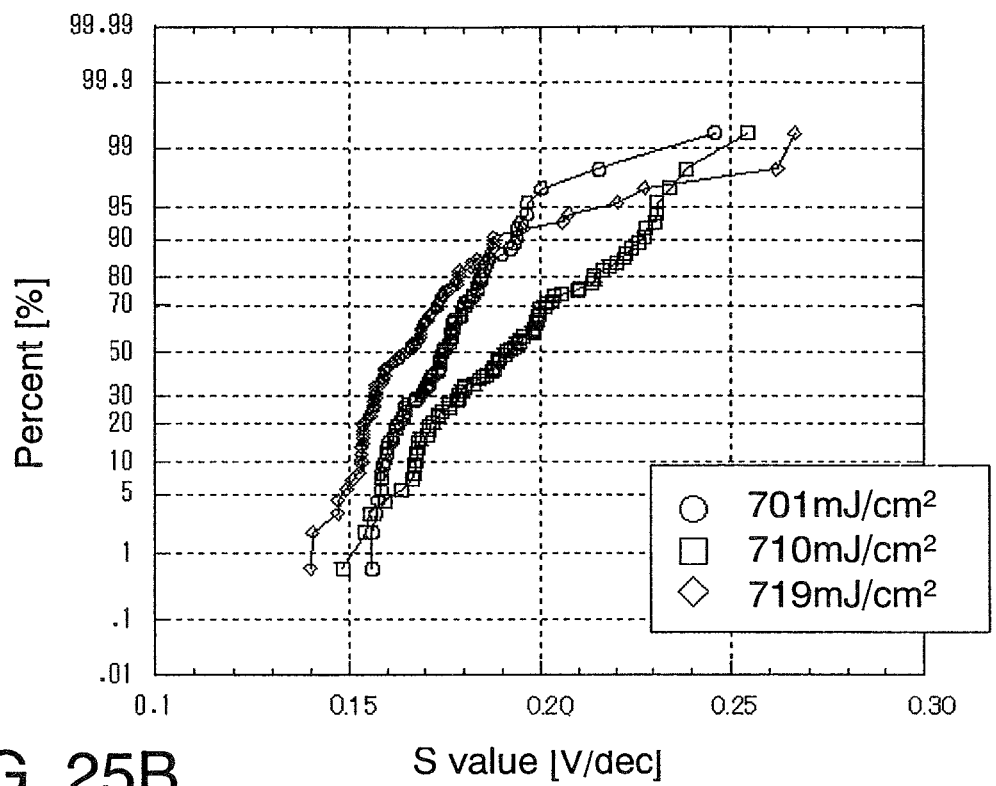
FIGS. 25A and 25B are statistical probability distribution charts of a subthreshold swing.
Figure 25B:
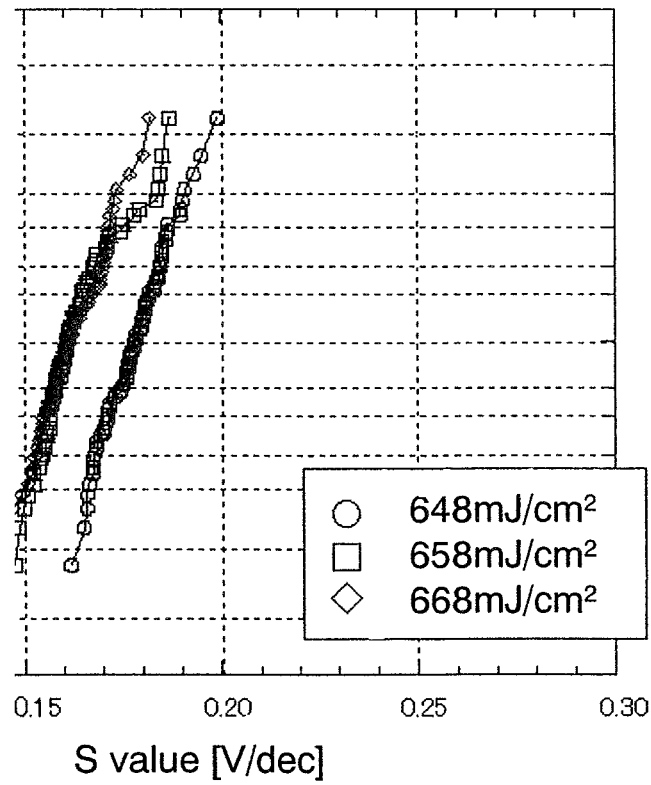

FIGS. 25A and 25B show statistical probability distribution charts of a subthreshold swing (S value). FIG. 25A shows cases of emitting laser beams (with energy densities of 701 mJ/cm$^2$ (○-mark), 710 mJ/cm$^2$ (□-mark), and 719 mJ/cm$^2$ (◇-mark)) without performing dry etching. FIG. 25B shows cases of emitting laser beams (with energy densities of 648 mJ/cm$^2$ (○-mark), 658 mJ/cm$^2$ (□-mark), and 669 mJ/cm$^2$ (◇-mark)) after performing dry etching. In either case, measurement was performed on an n-channel TFT with a length of a channel formation region/a width of the channel formation region of 8 μm/8 μm. The horizontal axis of each of FIGS. 25A and 25B represents subthreshold swing (S value) [V/dec] and the vertical axis represents percent [%].

In FIG. 25B, as for the S value of the transistor with dry etching, 99% of the entire value at an energy density of 648 mJ/cm$^2$ is in the range of 0.18±0.02 V/dec; 99% of the entire value at an energy density of 658 mJ/cm$^2$ is in the range of 0.16±0.03 V/dec; and 99% of the entire value at an energy density of 668 mJ/cm$^2$ is in the range of 0.16±0.02 V/dec. In FIG. 25A, on the other hand, as for the S value of the transistor without dry etching, 99% of the entire value at an energy density of 701 mJ/cm$^2$ is in the range of 0.17±0.04 V/dec; 99% of the entire value at an energy density of 710 mJ/cm$^2$ is in the range of 0.19±0.07 V/dec; and 99% of the entire value at an energy density of 719 mJ/cm$^2$ is in the range of 0.17±0.07 V/dec. That is, according to FIGS. 25A and 25B, it was found that variation could be reduced more in the case where laser beam was emitted after performing dry etching than in the case where laser beam was emitted without performing dry etching.

Figure 26A:
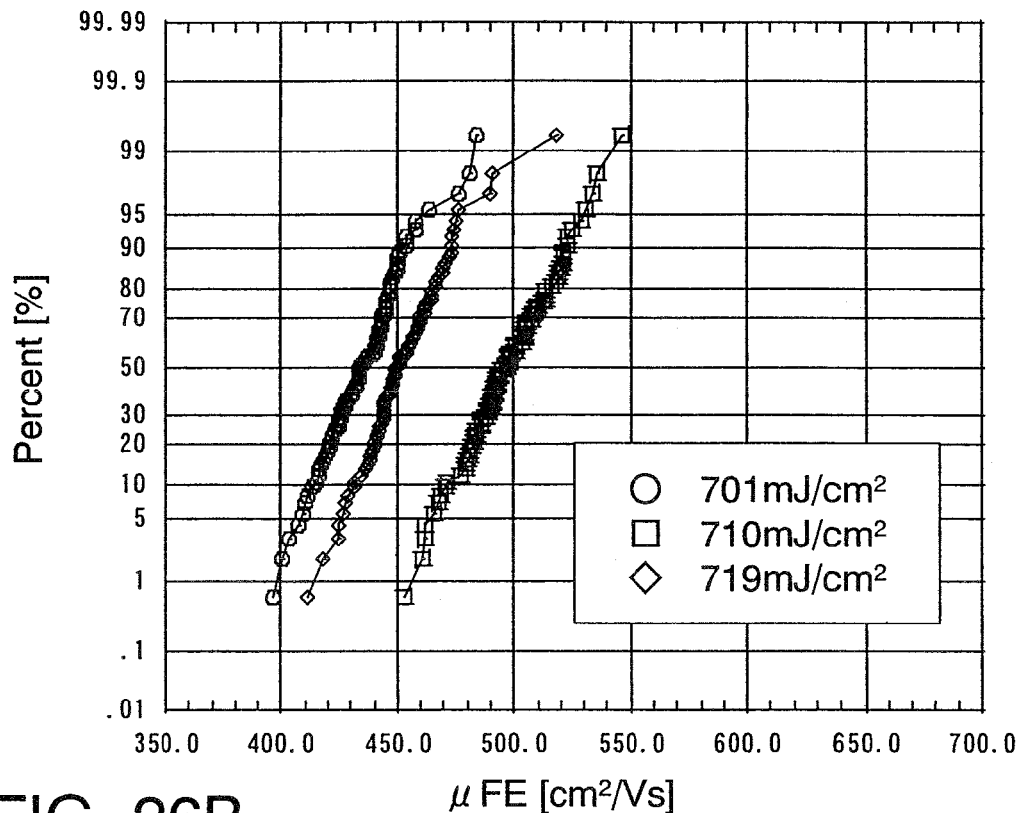
FIGS. 26A and 26B are statistical probability distribution charts of field effect mobility.
Figure 26B:
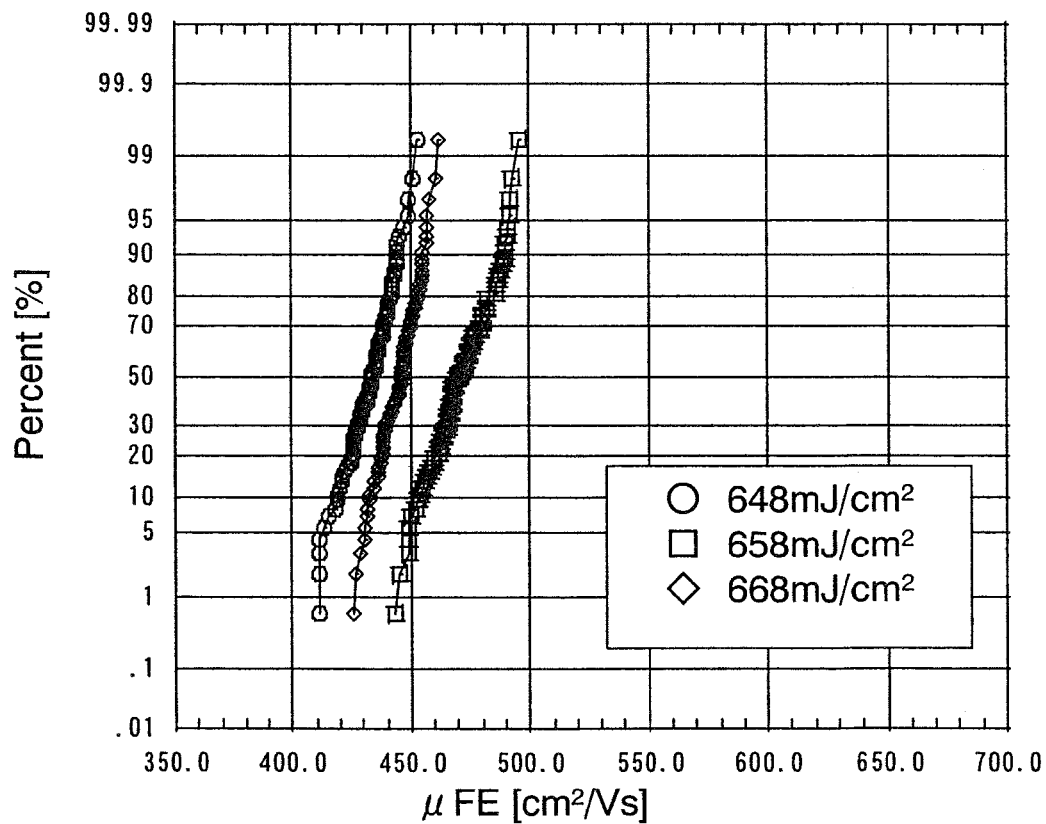

FIGS. 26A and 26B show statistical probability distribution charts of field effect mobility. FIG. 26A shows cases of emitting laser beams (with energy densities of 701 mJ/cm$^2$ (○-mark), 710 mJ/cm$^2$ (□-mark), and 719 mJ/cm$^2$ (◇-mark)) without performing dry etching. FIG. 26B shows cases of emitting laser beams (with energy densities of 648 mJ/cm$^2$ (○-mark), 658 mJ/cm$^2$ (□-mark), and 669 mJ/cm$^2$ (◇-mark)) after performing dry etching. In either case, measurement was performed on an n-channel TFT with a length of a channel formation region/a width of the channel formation region of 8 μm/8 μm. The horizontal axis of each of FIGS. 26A and 26B represents field effect mobility μ [cm$^2$/Vs] and the vertical axis represents percent [%].

In FIG. 26B, as for the field effect mobility of the transistor with dry etching, 99% of the entire value at an energy density of 648 mJ/cm$^2$ is in the range of 434±30 cm$^2$/Vs; 99% of the entire value at an energy density of 658 mJ/cm$^2$ is in the range of 471±38 cm$^2$/Vs; and 99% of the entire value at an energy density of 668 mJ/cm$^2$ is in the range of 446±25 cm$^2$/Vs. In FIG. 26A, on the other hand, as for the field effect mobility of the transistor without dry etching, 99% of the entire value at an energy density of 701 mJ/cm$^2$ is in the range of 434±51 cm$^2$/Vs; 99% of the entire value at an energy density of 710 mJ/cm$^2$ is in the range of 497±57 cm$^2$/Vs; and 99% of the entire value at an energy density of 719 mJ/cm$^2$ is in the range of 450±51 cm$^2$/Vs. That is, according to FIGS. 26A and 26B, it was found that variation could be reduced more in the case where laser beam was emitted after performing dry etching than in the case where laser beam was emitted without performing dry etching.

Accordingly, variation in the threshold voltage, variation in the S value, and variation in the field effect mobility are reduced if a TFT is manufactured using the single crystal semiconductor layer obtained by the present invention, and effectiveness of the present invention is clear. This is because that a laser beam is emitted to a single crystal semiconductor layer bonded to a supporting substrate after the single crystal semiconductor layer is etched by dry etching to remove defects or damage of a surface thereof; thus, the single crystal semiconductor layer can be prevented from including the defects or damage at the time of being melted by the laser beam irradiation. Thus, defects are reduced, and further, the use of a single crystal semiconductor layer with high planarity makes it possible to manufacture a semiconductor device in which variation in the characteristics between a plurality of elements is reduced. Therefore, a high-reliability semiconductor device can be provided.

This application is based on Japanese Patent Application serial No. 2007-265014 filed with Japan Patent Office on Oct. 10, 2007 and Japanese Patent Application serial No. 2007-285567 filed with Japan Patent Office on Nov. 1, 2007, the entire contents of which are hereby incorporated by reference.

What is claimed is:

1. A method for manufacturing an SOI substrate comprising the steps of:
    forming a first insulating layer containing silicon nitride in contact with a single crystal semiconductor substrate;
    forming a damaged region in the single crystal semiconductor substrate by generating plasma and by adding ion species contained in the plasma to the single crystal semiconductor substrate through the first insulating layer;
    forming a second insulating layer in contact with the first insulating layer after forming the damaged region;
    bonding a supporting substrate to the single crystal semiconductor substrate so as to face the single crystal semiconductor substrate with the first insulating layer and the second insulating layer interposed therebetween;
    separating a single crystal semiconductor layer from the single crystal semiconductor substrate at the damaged region and attaching the single crystal semiconductor layer to the supporting substrate by heating the single crystal semiconductor substrate;
    performing a dry etching on the single crystal semiconductor layer; and
    irradiating the single crystal semiconductor layer with a laser beam after performing the dry etching.

2. The method for manufacturing an SOI substrate according to claim 1, wherein a dry etching step is further performed after the irradiating step.

3. The method for manufacturing the SOI substrate according to claim 1, wherein the supporting substrate is a glass substrate.

4. The method for manufacturing the SOI substrate according to claim 1, wherein a surface of the single crystal semiconductor layer is melted and solidified by the irradiating step.

5. The method for manufacturing the SOI substrate according to claim 1, wherein a surface of the single crystal semiconductor layer is planarized by the irradiating step.

6. The method for manufacturing the SOI substrate according to claim 1, wherein the laser beam is irradiated in an inert gas atmosphere.

7. The method for manufacturing the SOI substrate according to claim 1, wherein the ion species contained in the plasma includes fluorine or chlorine.

8. The method for manufacturing the SOI substrate according to claim 1, wherein the second insulating layer is silicon oxide containing hydrogen or silicon nitride containing hydrogen.

9. A method for manufacturing an SOI substrate comprising the steps of:
    forming a first insulating layer containing silicon nitride in contact with a single crystal semiconductor substrate;
    forming a damaged region in the single crystal semiconductor substrate by generating plasma and by adding ion species contained in the plasma to the single crystal semiconductor substrate through the first insulating layer;
    forming a second insulating layer in contact with the first insulating layer after forming the damaged region;
    bonding a supporting substrate to the single crystal semiconductor substrate so as to face the single crystal semiconductor substrate with the first insulating layer and the second insulating layer interposed therebetween;
    separating a single crystal semiconductor layer from the single crystal semiconductor substrate at the damaged region and attaching the single crystal semiconductor layer to the supporting substrate by heating the single crystal semiconductor substrate;
    performing a dry etching on the single crystal semiconductor layer; and
    irradiating the single crystal semiconductor layer with a laser beam in a vacuum state after performing the dry etching.

10. The method for manufacturing an SOI substrate according to claim 9, wherein a dry etching step is further performed after the irradiating step.

11. The method for manufacturing the SOI substrate according to claim 9, wherein the supporting substrate is a glass substrate.

12. The method for manufacturing the SOI substrate according to claim 9, wherein a surface of the single crystal semiconductor layer is melted and solidified by the irradiating step.

13. The method for manufacturing the SOI substrate according to claim 9, wherein a surface of the single crystal semiconductor layer is planarized by the irradiating step.

14. The method for manufacturing the SOI substrate according to claim 9, wherein the ion species contained in the plasma includes fluorine or chlorine.

15. The method for manufacturing the SOI substrate according to claim 9, wherein the second insulating layer is silicon oxide containing hydrogen or silicon nitride containing hydrogen.

* * * * *